United States Patent
Yamazaki et al.

(10) Patent No.: US 10,101,628 B2
(45) Date of Patent: Oct. 16, 2018

(54) DISPLAY DEVICE

(71) Applicant: Semiconductor Energy Laboratory Co., Ltd., Kanagawa-ken (JP)

(72) Inventors: Shunpei Yamazaki, Tokyo (JP); Daisuke Kubota, Kanagawa (JP); Kei Takahashi, Kanagawa (JP); Yuji Iwaki, Kanagawa (JP); Hisao Ikeda, Kanagawa (JP); Kohei Yokoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/479,835

(22) Filed: Apr. 5, 2017

(65) Prior Publication Data

US 2017/0293171 A1  Oct. 12, 2017

(30) Foreign Application Priority Data

Apr. 7, 2016  (JP) ................................. 2016-077616
Apr. 12, 2016  (JP) ................................. 2016-079807

(51) Int. Cl.
*G02F 1/1333*  (2006.01)
*G02F 1/1368*  (2006.01)
(Continued)

(52) U.S. Cl.
CPC ...... *G02F 1/1368* (2013.01); *G02F 1/133345* (2013.01); *G02F 1/133603* (2013.01);
(Continued)

(58) Field of Classification Search
CPC ............. G02F 1/1368; G02F 1/133345; G02F 1/133603; G02F 2001/133612;
(Continued)

(56) References Cited

U.S. PATENT DOCUMENTS 6,714,268 B2  3/2004  Wang et al.
7,038,641 B2  5/2006  Hirota et al.
(Continued)

FOREIGN PATENT DOCUMENTS

JP  2001-066593 A  3/2001
JP  2002-196702 A  7/2002
(Continued)

OTHER PUBLICATIONS

Shieh, H-P., "Transflective Display by Hybrid OLED and LCD," LEOS 2005 (IEEE Lasers and Electro-Optics Society Annual Meeting), Oct. 22, 2005, pp. 650-651, IEEE.
(Continued)

*Primary Examiner* — Nathanael R Briggs
(74) *Attorney, Agent, or Firm* — Husch Blackwell LLP

(57) ABSTRACT

Power consumption of a display device is reduced. The display quality of the display device is improved. A high-quality image is displayed regardless of a usage environment. A light-weight and non-breakable display device is provided. In the display device, a first display panel and a second display panel are bonded to each other with an adhesive layer. The first display panel includes first pixels that include reflective liquid crystal elements. The second display panel includes second pixels that include light-emitting elements. The first display panel includes a first resin layer positioned closest to the adhesive layer. The second display panel includes a second resin layer positioned closest to the adhesive layer. The thickness of each of the first resin layer and the second resin layer is 0.1 μm or more and 3 μm or less.

24 Claims, 36 Drawing Sheets

(51) Int. Cl.
*H01L 27/32* (2006.01)
*G02F 1/1335* (2006.01)
*H01L 51/00* (2006.01)
*H01L 27/12* (2006.01)
*H01L 29/786* (2006.01)
*H01L 27/15* (2006.01)

(52) U.S. Cl.
CPC ........ *H01L 27/3232* (2013.01); *H01L 51/003* (2013.01); *H01L 51/0097* (2013.01); *G02F 2001/133612* (2013.01); *G02F 2201/44* (2013.01); *G02F 2202/10* (2013.01); *G02F 2202/28* (2013.01); *G02F 2203/02* (2013.01); *H01L 27/1225* (2013.01); *H01L 27/15* (2013.01); *H01L 27/3262* (2013.01); *H01L 29/7869* (2013.01); *H01L 2251/5338* (2013.01); *H01L 2251/558* (2013.01)

(58) Field of Classification Search
CPC ............. G02F 2201/44; G02F 2202/10; G02F 2202/28; G02F 2203/02; H01L 27/3232; H01L 51/003; H01L 51/0097; H01L 27/1225; H01L 27/15; H01L 27/3261; H01L 29/7869; H01L 2251/5338; H01L 2251/558
See application file for complete search history.

(56) References Cited

U.S. PATENT DOCUMENTS

| | | |
|---|---|---|
| 7,084,936 B2 | 8/2006 | Kato |
| 7,102,704 B2 | 9/2006 | Mitsui et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,385,654 B2 | 6/2008 | Mitsui et al. |
| 2001/0015256 A1 | 8/2001 | Yamazaki et al. |
| 2003/0025118 A1 | 2/2003 | Yamazaki et al. |
| 2003/0034497 A1 | 2/2003 | Yamazaki et al. |
| 2003/0047732 A1 | 3/2003 | Yamazaki et al. |
| 2003/0162312 A1 | 8/2003 | Takayama et al. |
| 2003/0201960 A1 | 10/2003 | Fujieda |
| 2004/0099926 A1 | 5/2004 | Yamazaki et al. |
| 2004/0232413 A1 | 11/2004 | Yamazaki et al. |
| 2004/0232459 A1 | 11/2004 | Takayama et al. |
| 2004/0256618 A1 | 12/2004 | Imai et al. |
| 2006/0072047 A1 | 4/2006 | Sekiguchi |
| 2007/0295973 A1 | 12/2007 | Jinbo et al. |
| 2008/0003727 A1 | 1/2008 | Jinbo |
| 2008/0099664 A1 | 5/2008 | Yamazaki et al. |
| 2008/0180618 A1 | 7/2008 | Fujieda |
| 2008/0238828 A1* | 10/2008 | Nakayama ................. G09F 9/35 345/76 |
| 2010/0171905 A1 | 7/2010 | Huang et al. |
| 2013/0242212 A1* | 9/2013 | Huang ................. H01L 51/5271 349/15 |
| 2014/0008668 A1 | 1/2014 | Hirakata |
| 2014/0014960 A1 | 1/2014 | Yamazaki et al. |
| 2014/0063364 A1 | 3/2014 | Hirakata |
| 2014/0159026 A1* | 6/2014 | Okumoto .............. H01L 29/786 257/40 |
| 2014/0339517 A1 | 11/2014 | Park et al. |
| 2014/0346473 A1 | 11/2014 | Park et al. |
| 2015/0044792 A1 | 2/2015 | Aoyama et al. |
| 2015/0155505 A1 | 6/2015 | Yamazaki et al. |
| 2015/0236280 A1 | 8/2015 | Sakuishi et al. |
| 2016/0012783 A1 | 1/2016 | Kimura et al. |
| 2016/0042696 A1 | 2/2016 | Hirakata et al. |
| 2016/0042702 A1 | 2/2016 | Hirakata et al. |
| 2016/0204169 A1* | 7/2016 | Oh ........................ H01L 27/326 257/40 |
| 2016/0210910 A1 | 7/2016 | Yamazaki et al. |
| 2016/0274421 A1 | 9/2016 | Hirakata |
| 2016/0283028 A1 | 9/2016 | Yamazaki et al. |
| 2016/0299387 A1 | 10/2016 | Yamazaki et al. |
| 2016/0313769 A1 | 10/2016 | Yoshitani et al. |
| 2017/0103697 A1 | 4/2017 | Kawashima et al. |
| 2017/0301860 A1 | 10/2017 | Yamazaki et al. |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-096055 A | 4/2007 |
| JP | 2007-123861 A | 5/2007 |
| JP | 2007-232882 A | 9/2007 |
| JP | 4161574 B2 | 10/2008 |
| JP | 2013-221965 A | 10/2013 |
| WO | WO 2004-053819 A1 | 6/2004 |

OTHER PUBLICATIONS

Lee, J-H. et al., "High Ambient-Contrast-Ratio Display Using Tandem Reflective Liquid Crystal Display and Organic Light-Emitting Device," Optics Express, Nov. 14, 2005, vol. 13, No. 23, pp. 9431-9438.

* cited by examiner

FIG. 22B2 before peeling after peeling

DISPLAY DEVICE

BACKGROUND OF THE INVENTION

1. Field of the Invention

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a method for driving any of them, and a method for manufacturing any of them.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

An example of a display device is a liquid crystal display device provided with a liquid crystal element. For example, an active matrix liquid crystal display device, in which pixel electrodes are arranged in a matrix and transistors are used as switching elements connected to respective pixel electrodes, has attracted attention.

As switching elements connected to respective pixel electrodes, active matrix liquid crystal display devices including transistors where metal oxide is used for channel formation regions are already known (Patent Documents 1 and 2).

It is known that an active matrix liquid crystal display device is classified into two major types: transmissive type and reflective type.

In a transmissive liquid crystal display device, a backlight such as a cold cathode fluorescent lamp or a light-emitting diode (LED) is used, and optical modulation action of liquid crystal is utilized to select one of the two states: a state where light from the backlight passes through liquid crystal to be output to the outside of the liquid crystal display device and a state where light is not output to the outside of the liquid crystal display device, whereby a bright or dark image is displayed. Furthermore, those images are combined to display an image.

In a reflective liquid crystal display device, a state in which external light, that is, incident light is reflected at a pixel electrode and output to the outside of the device or a state in which incident light is not output to the outside of the device is selected using optical modulation action of liquid crystal, whereby bright and dark images are displayed. Furthermore, those displays are combined to display an image. Compared to the transmissive liquid crystal display device, the reflective liquid crystal display device has the advantage of low power consumption since the backlight is not used.

REFERENCES

Patent Documents

[Patent Document 1] Japanese Published Patent Application No. 2007-123861
[Patent Document 2] Japanese Published Patent Application No. 2007-096055

SUMMARY OF THE INVENTION

Electronic devices that include a display device need to reduce the power consumption. In particular, a display device in electronic devices that use a battery as power supply, such as mobile phones, smartphones, tablet terminals, smart watches, or laptop personal computers, accounts for a large percentage of power consumption; thus, the display device is required to reduce the power consumption.

Portable electronic devices are required to have high visibility both in an environment where external light illuminance is high and in an environment where external light illuminance is low.

When a portable electronic device is dropped or put in a trouser pocket or the like, its display device might be cracked in some cases. For this reason, there is a demand for light-weight, non-breakable display devices for use in electronic devices.

An object of one embodiment of the present invention is to reduce power consumption of a display device. Another object of one embodiment of the present invention is to improve the display quality of the display device. Another object of one embodiment of the present invention is to display a high-quality video regardless of a usage environment. Another object of one embodiment of the present invention is to provide a light-weight and non-breakable display device. Another object of one embodiment of the present invention is to provide a flexible display device.

Another object of one embodiment of the present invention is to provide a method for manufacturing a display device with high productivity.

One embodiment of the present invention is a display device including a first display panel, a second display panel, and a first adhesive layer. The first display panel includes a first resin layer, a second resin layer, and a reflective liquid crystal element and a first transistor which are positioned between the first resin layer and the second resin layer. The second display panel includes a third resin layer, a fourth resin layer, and a light-emitting element and a second transistor which are positioned between the third resin layer and the fourth resin layer. The liquid crystal element has a function of reflecting light toward the second resin layer side. The light-emitting element has a function of emitting light toward the third resin layer side. The first resin layer and the third resin layer are bonded to each other using the first adhesive layer. In each of the first transistor and the second transistor, a channel is formed in an oxide semiconductor. The thickness of each of the first resin layer and the third resin layer is 0.1 µm or more and 3 µm or less. The light-emitting element can be a top-emission light-emitting element, for example.

In the above structure, the first resin layer preferably has a first opening overlapping with the light-emitting element. The second resin layer preferably has a second opening overlapping with the light-emitting element. The third resin layer preferably has a third opening overlapping with the light-emitting element. Here, the light-emitting element preferably has a function of emitting light through the first opening, the second opening, and the third opening.

In the above structure, the second opening of the second resin layer has a portion overlapping with the liquid crystal element. The liquid crystal element preferably has a function of reflecting light through the second opening.

In the above structure, the thickness of each of the second resin layer and the fourth resin layer is preferably 0.1 μm or more and 3 μm or less.

In the above structure, the display device preferably includes a first substrate, a second substrate, a second adhesive layer, and a third adhesive layer. Here, the first substrate is preferably bonded to the fourth resin layer with the second adhesive layer. The second substrate is preferably bonded to the second resin layer with the third adhesive layer.

In the above structure, the first substrate and the second substrate preferably include a resin.

In the above structure, the first transistor preferably includes a first source electrode, a first drain electrode, and a first semiconductor layer. The second transistor preferably includes a second source electrode, a second drain electrode, and a second semiconductor layer.

Here, the first source electrode and the first drain electrode are preferably provided in contact with a top surface and a side end portion of the first semiconductor layer. The second source electrode and the second drain electrode are preferably provided in contact with a top surface and a side end portion of the second semiconductor layer.

Alternatively, the display device preferably includes a first insulating layer overlapping with part of the top surface and the side end portion of the first semiconductor layer, and a second insulating layer overlapping with part of the top surface and the side end portion of the second semiconductor layer. It is preferable that the first source electrode and the first drain electrode be provided over the first insulating layer and be electrically connected to the first semiconductor layer through an opening provided in the first insulating layer. It is preferable that the second source electrode and the second drain electrode be provided over the second insulating layer and be electrically connected to the second semiconductor layer through an opening provided in the second insulating layer.

The first source electrode and the first drain electrode are preferably provided in contact with the top surface and the side end portion of the first semiconductor layer. The display device preferably includes the second insulating layer overlapping with the part of the top surface and the side end portion of the second semiconductor layer. It is preferable that the second source electrode and the second drain electrode be provided over the second insulating layer and be electrically connected to the second semiconductor layer through the opening provided in the second insulating layer.

Alternatively, the display device preferably includes the first insulating layer overlapping with part of the top surface and the side end portion of the first semiconductor layer. It is preferable that the first source electrode and the first drain electrode be provided over the first insulating layer and be electrically connected to the first semiconductor layer through an opening provided in the first insulating layer. The second source electrode and the second drain electrode are preferably provided in contact with the top surface and the side end portion of the second semiconductor layer.

Alternatively, the first transistor preferably includes a first gate electrode and a second gate electrode. The first gate electrode and the second gate electrode preferably face each other with the first semiconductor layer provided therebetween. The second transistor preferably includes a third gate electrode and a fourth gate electrode. The third gate electrode and the fourth gate electrode preferably face each other with the second semiconductor layer provided therebetween.

One embodiment of the present invention can reduce the power consumption of a display device. Furthermore, the display quality of the display device can be improved. Furthermore, a display device that displays high-quality video regardless of a usage environment can be provided. Furthermore, a light-weight and non-breakable display device can be provided. Furthermore, a flexible display device can be provided. Furthermore, a method for manufacturing a display device with high productivity can be provided.

BRIEF DESCRIPTION OF THE DRAWINGS

FIGS. 15A, 15B1, and 15B2 illustrate a method for manufacturing a display device of one embodiment.

FIGS. 22A, 22B1, and 22B2 illustrate a structure example of a display device of one embodiment.

DETAILED DESCRIPTION OF THE INVENTION

Figure 1:
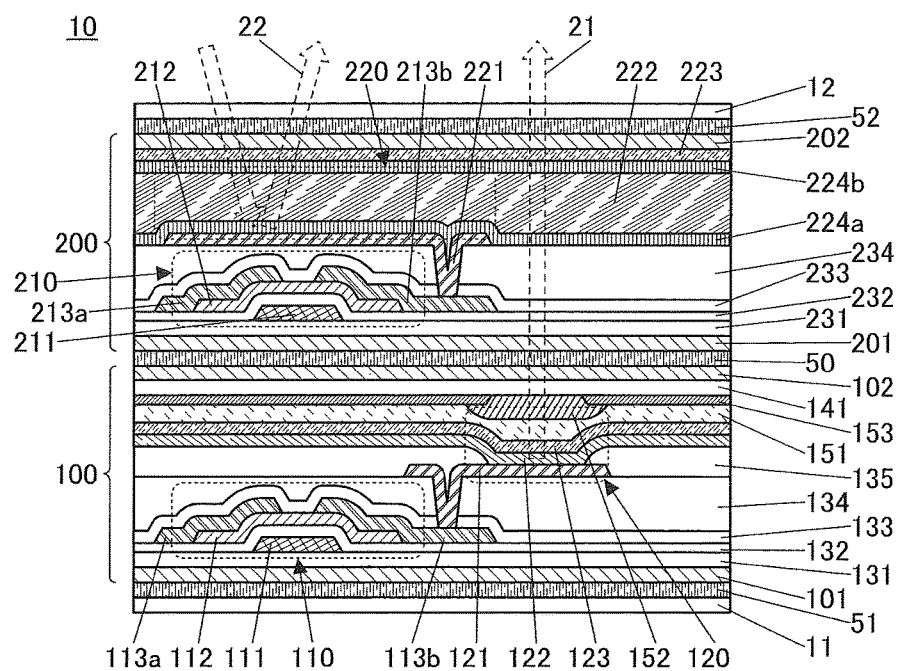
FIG. 1 illustrates a structural example of a display device of one embodiment.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that ordinal numbers such as "first" and "second" in this specification and the like are used in order to avoid confusion among components, and the terms do not limit the components numerically.

A transistor is a kind of semiconductor elements and can achieve amplification of current or voltage, switching operation for controlling conduction or non-conduction, or the like. A transistor in this specification includes, in its category, an insulated-gate field-effect transistor (IGFET) and a thin film transistor (TFT).

Embodiment 1

In this embodiment, a display device of one embodiment of the present invention and a manufacturing method thereof will be described.

A display device of one embodiment of the present invention has a structure where a first display panel and a second display panel are bonded to each other with an adhesive layer therebetween. In the first display panel, first pixels that include reflective liquid crystal elements are provided. In the second display panel, second pixels that include light-emitting elements are provided. The reflective liquid crystal elements can produce gray levels by controlling the amount of reflected light. The light-emitting elements can produce gray levels by controlling the amount of light emission.

The display device can perform display by using only reflected light, display by using only light emitted from the light-emitting elements, and display by using both reflected light and light emitted from the light-emitting elements, for example.

The first display panel is provided on the viewing side. The second display panel is provided on the side opposite to the viewing side. The first display panel includes a first resin layer close to the adhesive layer. The second display panel includes a second resin layer close to the adhesive layer.

It is preferable that a third resin layer be provided on the display surface side of the first display panel and a fourth resin layer be provided on the rear surface side (the side opposite to the display surface side) of the second display panel. Thus, the display device can be extremely lightweight and less likely to be broken.

The first resin layer and the second resin layer (hereinafter also collectively referred to as a resin layer) have a feature of being extremely thin. Specifically, it is preferable that each of the resin layers have a thickness of 0.1 μm or more and 3 μm or less. Thus, even a structure where the two display panels are stacked can have a small thickness. Furthermore, light absorption due to the resin layer positioned in the path of light emitted from the light-emitting element in the second pixel can be reduced, so that light can be extracted with higher efficiency and the power consumption can be reduced.

The resin layer can be formed in the following manner, for example. A thermosetting resin material with a low viscosity is applied to a support substrate and cured by heat treatment to form the resin layer. Then, a structure is formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given. For example, it is preferable to perform the irradiation by scanning using linear laser light. By the method, the process time of the case of using a large support substrate can be shortened. As the laser light, excimer laser light with a wavelength of 308 nm can be suitably used.

A thermosetting polyimide is a typical example of a material that can be used for the resin layer. It is particularly preferable to use a photosensitive polyimide. A photosensitive polyimide is a material that is suitably used for formation of a planarization film or the like of the display panel, and therefore, the formation apparatus and the material can be shared. Thus, there is no need to prepare another apparatus and another material to obtain the structure of one embodiment of the present invention.

Furthermore, the resin layer that is four ed using a photosensitive resin material can be processed by light exposure and development treatment. For example, an opening can be formed and an unnecessary portion can be removed. Moreover, by optimizing a light exposure method or light exposure conditions, an uneven shape can be formed in a surface of the resin layer. For example, a multiple exposure technique or an exposure technique using a half-tone mask or a gray-tone mask may be used.

Note that a non-photosensitive resin material may be used for the resin layer. In that case, it is also possible to use a method in which an opening or an uneven shape are formed by etching using a resist mask or a hard mask formed over the resin layer.

In this case, part of the resin layer that is positioned in the path of light emitted from the light-emitting element is preferably removed. That is, an opening overlapping with the light-emitting element is provided in the first resin layer and the second resin layer. Thus, a reduction in color reproducibility and light extraction efficiency that is caused by absorption of part of light emitted from the light-emitting element by the resin layer can be inhibited.

Alternatively, the resin layer may be provided with a concave portion so that a portion of the resin layer that is positioned in the path of light emitted from the light-emitting element is thinner than the other portion. That is, the resin layer may have a structure where two portions with different thicknesses are included and the portion with a smaller thickness overlaps with the light-emitting element. The resin layer that has the structure can also reduce absorption of light emitted from the light-emitting element.

In the case where the first display panel includes the third resin layer, an opening overlapping with the light-emitting element is preferably provided also in the third resin layer in a manner similar to that described above. Thus, color reproducibility and light extraction efficiency can be further increased.

In the case where the first display panel includes the third resin layer, part of the third resin layer that is positioned in the path of light of the reflective liquid crystal element is preferably removed. That is, an opening overlapping with the reflective liquid crystal element is provided in the third resin layer. This can increase the reflectivity of the reflective liquid crystal element.

As an example, an opening is formed in the following manner: a light absorption layer is formed over the support substrate, the resin layer having the opening is formed over the light absorption layer, and a light-transmitting layer covering the opening is formed. The light absorption layer is a layer that emits a gas such as hydrogen or oxygen by absorbing light and being heated. By performing light irradiation from the support substrate side to make the light absorption layer emit a gas, adhesion at the interface between the light absorption layer and the support substrate or between the light absorption layer and the light-transmitting layer can be reduced to cause separation, or the light absorption layer itself can be broken to cause separation.

As another example, the following method can be used. That is, a thin part is formed in a portion where the opening of the resin layer is to be formed, and the support substrate and the resin layer are separated from each other by the above-described method. Then, plasma treatment or the like is performed on a separated surface of the resin layer to reduce the thickness of the resin layer, whereby the opening can be formed in the thin part of the resin layer.

Each of the first pixel and the second pixel preferably includes a transistor. Furthermore, an oxide semiconductor is preferably used as a semiconductor where a channel of the transistor is formed. An oxide semiconductor can achieve high on-state current and high reliability even when the highest temperature in the manufacturing process of the transistor is reduced (e.g., 400° C. or lower, preferably 350° C. or lower). Furthermore, in the case of using an oxide semiconductor, high heat resistance is not required for a material of the resin layer positioned on the surface side on which the transistor is formed; thus, the material of the resin layer can be selected from a wider range of alternatives. For example, the material can be the same as a resin material of the planarization film.

In the case of using low-temperature polysilicon (LTPS), for example, processes such as a laser crystallization process, a baking process before crystallization, and a baking process for activating impurities are required, and the highest temperature in the manufacturing process of the transistor is higher than that in the case of using an oxide semiconductor (e.g., higher than or equal to 500° C., higher than or equal to 550° C., or higher than or equal to 600° C.), though high field-effect mobility can be obtained. Therefore, high heat resistance is required for the resin layer positioned on the surface side on which the transistor is formed. In addition, the thickness of the resin layer needs to be comparatively large (e.g., larger than or equal to 10 µm, or larger than or equal to 20 µm) because the resin layer is also irradiated with laser light in the laser crystallization process.

In contrast, in the case of using an oxide semiconductor, a special material having high heat resistance is not required for the resin layer, and the resin layer can be formed thin. Thus, the proportion of the cost of the resin layer in the cost of the whole display panel can be reduced.

An oxide semiconductor has a wide band gap (e.g., 2.5 eV or more, or 3.0 eV or more) and transmits light. Thus, even when an oxide semiconductor is irradiated with laser light in a step of separating the support substrate and the resin layer, the laser light is hardly absorbed, so that the electrical characteristics can be less affected. Therefore, the resin layer can be thin as described above.

In one embodiment of the present invention, a display device excellent in productivity can be obtained by using both a resin layer that is formed thin using a photosensitive resin layer with a low viscosity typified by a photosensitive polyimide and an oxide semiconductor with which a transistor having excellent electrical characteristics can be obtained even at a low temperature.

Next, a pixel structure is described. The first pixels and the second pixels are arranged in a matrix to form the display portion. In addition, the display device preferably includes a first driver portion for driving the first pixels and a second driver portion for driving the second pixels. It is preferable that the first driver portion be provided in the first display panel and the second driver portion be provided in the second display panel.

The first pixels and the second pixels are preferably arranged in a display region with the same pitch. Furthermore, the first pixels and the second pixels are preferably mixed in the display region of the display device. Accordingly, as described later, an image displayed by a plurality of first pixels, an image displayed by a plurality of second pixels, and an image displayed by both the plurality of first pixels and the plurality of second pixels can be displayed in the same display region.

The first pixel is preferably formed of one pixel that emits white (W) light, for example. The second pixel preferably includes subpixels that emit light of three colors of red (R), green (G), and blue (B), for example. In addition, a subpixel that emits white (W) light or yellow (Y) light may be included. By arranging such first pixels and second pixels with the same pitch, the area of the first pixels can be increased and the aperture ratio of the first pixels can be increased.

Note that the first pixel may include subpixels that emit light of three colors of red (R), green (G), and blue (B), and may further include a subpixel that emits white (W) light or yellow (Y) light.

In one embodiment of the present invention, a first mode in which an image is displayed by the first pixels, a second mode in which an image is displayed by the second pixels, and a third mode in which an image is displayed by the first pixels and the second pixels can be switched.

Since display can be performed using only reflected light in the first mode, a light source is unnecessary. Therefore, the first mode is a driving mode with extremely low power consumption and is effective in the case where, for example, external light has a sufficiently high illuminance and emits white light or light near white light. The first mode is a display mode appropriate for displaying text data, such as that of a book or that of a document.

Since display can be performed using light of the light source in the second mode, an extremely clear image can be displayed regardless of the illuminance and chromaticity of external light. For example, the second mode is effective in the case where the illuminance of external light is extremely low, such as during the night or in a dark room. When a bright image is displayed under weak external light, a user may feel that the image is too bright. To prevent this, an image with reduced luminance is preferably displayed in the second mode. Thus, not only a reduction in the luminance but also low power consumption can be achieved. The second mode is a mode suitable for obtaining a clear image and a smooth moving image.

In the third mode, display can be performed using both light of the light source and reflected light. Specifically, the display device is driven so that light emitted from the first pixel and light emitted from the second pixel adjacent to the first pixel are mixed to express one color. Accordingly, a clearer image than that in the first mode can be displayed and power consumption can be made lower than that in the second mode. For example, the third mode is effective when the illuminance of external light is relatively low such as under indoor illumination or in the morning or evening, or when the external light does not represent a white chromaticity.

Next, transistors that can be used in the first display panel and the second display panel are described. A transistor provided in the first pixel of the first display panel and a transistor provided in the second pixel of the second display panel may have either the same structure or different structures.

As a structure of the transistor, a bottom-gate structure is given, for example. A transistor having a bottom-gate structure includes a gate electrode below a semiconductor layer (on the formation surface side). A source electrode and a drain electrode are provided in contact with a top surface and a side end portion of the semiconductor layer, for example.

As another structure of the transistor, a top-gate structure is given, for example. A transistor having a top-gate structure includes a gate electrode above a semiconductor layer (on the side opposite to the formation surface side). A first source electrode and a first drain electrode can be provided over an insulating layer covering part of a top surface and a side end portion of the semiconductor layer and are electrically connected to the semiconductor layer through openings provided in the insulating layer, for example.

The transistor preferably includes a first gate electrode and a second gate electrode that face each other with the semiconductor layer provided therebetween.

A more specific example of the display device of one embodiment of the present invention is described below with reference to drawings.

[Structure Example 1]

FIG. 1 is a schematic cross-sectional view of the display device 10. In the display device 10, a display panel 100 and a display panel 200 are bonded to each other using an adhesive layer 50. The display device 10 includes the substrate 11 on the rear side (the side opposite to the viewing side) and the substrate 12 on the front side (the viewing side).

The display panel 100 includes a transistor 110 and a light-emitting element 120 between a resin layer 101 and a resin layer 102. The display panel 200 includes a transistor 210 and a liquid crystal element 220 between a resin layer 201 and a resin layer 202. The resin layer 101 is bonded to the substrate 11 with an adhesive layer 51 positioned therebetween. The resin layer 202 is bonded to the substrate 12 with an adhesive layer 52 positioned therebetween.

[Display Panel 100]

The resin layer 101 is provided with the transistor 110, the light-emitting element 120, an insulating layer 131, an insulating layer 132, an insulating layer 133, the insulating layer 134, the insulating layer 135, and the like. The resin layer 102 is provided with a light-blocking layer 153, a coloring layer 152, and the like. The resin layer 101 and the resin layer 102 are bonded to each other using the adhesive layer 151.

The transistor 110 is provided over the insulating layer 131 and includes a conductive layer 111 serving as a gate electrode, part of the insulating layer 132 serving as a gate insulating layer, a semiconductor layer 112, a conductive layer 113a serving as one of a source electrode and a drain electrode, and a conductive layer 113b serving as the other of the source electrode and the drain electrode.

The semiconductor layer 112 preferably includes an oxide semiconductor.

The insulating layer 133 and the insulating layer 134 cover the transistor 110. The insulating layer 134 serves as a planarization layer.

The light-emitting element 120 includes the conductive layer 121, the EL layer 122, and the conductive layer 123 that are stacked. The conductive layer 121 has a function of reflecting visible light, and the conductive layer 123 has a function of transmitting visible light. Therefore, the light-emitting element 120 is a light-emitting element having a top-emission structure which emits light to the side opposite to the formation surface side. Here, the conductive layer 121 functions as a pixel electrode of the light-emitting element 120. In contrast, the conductive layer 123 functions as a common electrode of the light-emitting element 120.

The conductive layer 121 is electrically connected to the conductive layer 113b through an opening provided in the insulating layer 134 and the insulating layer 133. The insulating layer 135 covers an end portion of the conductive layer 121 and is provided with an opening to expose a top surface of the conductive layer 121. The EL layer 122 and the conductive layer 123 are provided in this order to cover the insulating layer 135 and the exposed portion of the conductive layer 121.

An insulating layer 141 is provided on the resin layer 101 side of the resin layer 102. The light-blocking layer 153 and the coloring layer 152 are provided on the resin layer 101 side of the insulating layer 141. The coloring layer 152 is provided in a region overlapping with the light-emitting element 120. The light-blocking layer 153 includes an opening in a portion overlapping with the light-emitting element 120.

[Display Panel 200]

The resin layer 201 is provided with the transistor 210, the conductive layer 221, an alignment film 224a, an insulating layer 231, an insulating layer 232, an insulating layer 233, an insulating layer 234, and the like. The resin layer 202 is provided with a conductive layer 223, an alignment film 224b, and the like. Liquid crystal 222 is sandwiched between the alignment film 224a and the alignment film 224b. The resin layer 201 and the resin layer 202 are bonded to each other using an adhesive layer in a region not shown.

The transistor 210 is provided over the insulating layer 231 and includes a conductive layer 211 serving as a gate electrode, part of the insulating layer 232 serving as a gate insulating layer, a semiconductor layer 212, a conductive layer 213a serving as one of a source electrode and a drain electrode, and a conductive layer 213b serving as the other of the source electrode and the drain electrode.

The semiconductor layer 212 preferably includes an oxide semiconductor.

The insulating layer 233 and the insulating layer 234 cover the transistor 210. The insulating layer 234 serves as a planarization layer.

The liquid crystal element 220 includes the conductive layer 221, the conductive layer 223, and the liquid crystal 222 positioned therebetween. The conductive layer 221 has a function of reflecting visible light, and the conductive layer 223 has a function of transmitting visible light. Therefore, the liquid crystal element 220 is a reflective liquid crystal element. Here, the conductive layer 221 functions as a pixel electrode of the liquid crystal element 220. In contrast, the conductive layer 223 functions as a common electrode of the liquid crystal element 220.

The conductive layer 221 is electrically connected to the conductive layer 213b through an opening provided in the insulating layer 234 and the insulating layer 233. The alignment film 224a covers surfaces of the conductive layer 221 and the insulating layer 234.

The conductive layer 223 and the alignment film 224b are stacked on the resin layer 201 side of the resin layer 202. Note that the insulating layer may be provided between the resin layer 202 and the conductive layer 223. In addition, a coloring layer for coloring light reflected by the liquid crystal element 220 may be provided.

[Display Device 10]

The display device 10 includes a portion where the light-emitting element 120 does not overlap with the reflective liquid crystal element 220 when seen from above. Thus, the light 21 that is colored by the coloring layer 152 is emitted from the light-emitting element 120 to the viewing side as shown in FIG. 1. Furthermore, the reflected light 22 that is external light reflected by the conductive layer 221 is emitted through the liquid crystal 222 of the liquid crystal element 220.

Note that the substrate 12 serves as a polarizing plate or a circular polarizing plate. A polarizing plate or a circular polarizing plate may be located outward from the substrate 12.

In the above-described structure of the display panel 200, a coloring layer is not included and color display is not performed, but a coloring layer may be provided on the resin layer 202 side to perform color display.

The above is the description of the structure example.

[Manufacturing Method Example 1]

An example of a method of manufacturing the display device 10 illustrated in FIG. 1 is described below with reference to drawings.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a photolithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of the photolithography method include the following two methods: a method in which a photosensitive resist material is applied to a thin film to be processed; the material is exposed to light through a photomask and then developed to form a resist mask; the thin film is processed by etching or the like; and the resist mask is removed; and a method in which a photosensitive thin film is formed and then exposed to light and developed to be processed into a desired shape.

As light used for exposure in a photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Light exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Formation of Resin Layer]

First, a support substrate 61 is prepared. For the support substrate 61, a material having stiffness high enough to facilitate the transfer and having resistance to heat applied in the manufacturing process can be used. For example, a material such as glass, quartz, ceramics, sapphire, an organic resin, a semiconductor, a metal, or an alloy can be used. As the glass, for example, alkali-free glass, barium borosilicate glass, or aluminoborosilicate glass can be used.

Figure 2A:
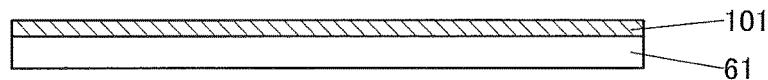
FIGS. 2A to 2E illustrate a method for manufacturing a display device of one embodiment.

Next, the resin layer 101 is formed over the support substrate 61 (FIG. 2A).

First, a material to be the resin layer 101 is applied on the support substrate 61. For the application, a spin coating method is preferred because the resin layer 101 can be thinly and uniformly formed over a large substrate.

Alternatively, the resin layer 101 can be formed by dipping, spray coating, ink-jetting, dispensing, screen printing, or offset printing, or with a doctor knife, a slit coater, a roll coater, a curtain coater, or a knife coater, for example.

The material contains a polymerizable monomer exhibiting a thermosetting property (also referred to as a thermopolymerization property) in which case polymerization proceeds by heat. Furthermore, the material is preferably photosensitive. In addition, the material contains a solvent for adjusting the viscosity.

The material preferably contains a polymerizable monomer that becomes a polyimide resin, an acrylic resin, an epoxy resin, a polyamide resin, a polyimide amide resin, a siloxane resin, a benzocyclobutene-based resin, or a phenol resin after polymerization. In particular, it is preferable that the material include a polymerizable monomer containing an imide bond and then a resin typified by a polyimide resin be used for the resin layer 101 because heat resistance and weather resistance can be improved.

The viscosity of the material used for the application is greater than or equal to 5 cP and less than 500 cP, preferably greater than or equal to 5 cP and less than 100 cP, more preferably greater than or equal to 10 cP and less than or equal to 50 cP. The lower the viscosity of the material is, the easier the application becomes. Furthermore, the lower the viscosity of the material is, the more the entry of bubbles can be suppressed, leading to a film with good quality. Lower viscosity of the material allows application for a thin and uniform film, whereby the resin layer 101 can be thinner.

Then, the support substrate 61 is heated to polymerize the applied material, whereby the resin layer 101 is formed. At this time, the solvent in the material is removed by the heating. The temperature at this heating is preferably higher than the highest temperature in the process for forming the transistor 110 to be performed later. The temperature is, for example, higher than or equal to 300° C. and lower than or equal to 600° C., preferably higher than or equal to 350° C. and lower than or equal to 550° C., more preferably higher than or equal to 400° C. and lower than or equal to 500° C., and is typically 450° C. For the formation of the resin layer 101, heating at such a temperature is performed in a state where the surface of the resin layer 101 is exposed, so that a gas that can be released from the resin layer 101 can be removed. Thus, release of the gas in the process for forming the transistor 110 can be suppressed.

The thickness of the resin layer 101 is preferably greater than or equal to 0.01 μm and less than 10 μm, more preferably greater than or equal to 0.1 μm and less than or equal to 3 μm, and more preferably greater than or equal to 0.5 μm and less than or equal to 1 μm. The use of a low viscosity solvent facilitates the formation of the thin and uniform resin layer 101.

The thermal expansion coefficient of the resin layer 101 is preferably greater than or equal to 0.1 ppm/° C. and less than or equal to 20 ppm/° C., and more preferably greater than or equal to 0.1 ppm/° C. and less than or equal to 10 ppm/° C. The lower the thermal expansion coefficient of the resin layer 101 is, the more the breakage of the transistor or the like by stress caused by expansion or contraction due to heating can be suppressed.

In the case where an oxide semiconductor film is used as the semiconductor layer 112 in the transistor 110, the semiconductor layer 112 can be formed at a low temperature, so that the resin layer 101 does not need high heat resistance. The heat resistance of the resin layer 101 or the like can be evaluated by, for example, weight loss percentage due to heating, specifically 5% weight loss temperature. The 5% weight loss temperature of the resin layer 101 or the like is lower than or equal to 450° C., preferably lower than or equal to 400° C., further preferably lower than 400° C., more preferably lower than 350° C. In addition, the highest temperature in the process for forming the transistor 110 or the like is preferably lower than or equal to 350° C.

In the case where a photosensitive material is used for the resin layer 101, part of the resin layer 101 can be removed by a photolithography method. Specifically, after the material is applied, heat treatment (also referred to as pre-baking) for removing the solvent is performed, and then light exposure is performed. Next, development is performed, whereby an unnecessary portion can be removed. After that, heat treatment (also referred to as post-baking) is preferably performed. Here, the second heat treatment may be performed at the above-described temperature.

An opening is formed in the resin layer 101 in the above manner, so that a structure described below can be achieved. For example, by disposing a conductive layer to cover the opening, an electrode part of which is exposed on the rear surface side (also referred to as a rear electrode or a through electrode) can be formed after a separation process to be described later. The electrode can be used as an external connection terminal. Furthermore, for example, a structure in which the resin layer 101 is not provided in a portion where an alignment marker for bonding of two display panels is provided can improve the alignment accuracy.

[Formation of Insulating Layer 131]

Figure 2B:
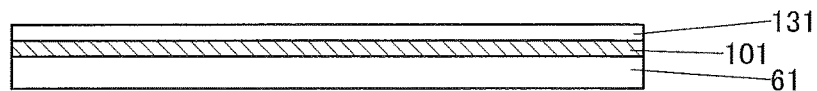

The insulating layer 131 is formed over the resin layer 101 (FIG. 2B).

The insulating layer 131 can be used as a barrier layer that prevents impurities contained in the resin layer 101 from diffusing into a transistor or a light-emitting element to be formed later. Therefore, a material having a high barrier property is preferably used for the insulating layer 131.

For the insulating layer 131, an inorganic insulating material such as a silicon nitride film, a silicon oxynitride film, a silicon oxide film, a silicon nitride oxide film, an aluminum oxide film, or an aluminum nitride film can be used. Two or more of these insulating films may be stacked. In particular, a structure in which a silicon nitride film and a silicon oxide film are stacked on the resin layer 101 side is preferably employed.

In the case where the resin layer 101 has an uneven surface, the insulating layer 131 preferably covers the unevenness. The insulating layer 131 may function as a planarization layer that fills the unevenness. It is preferable to use a stack including an organic insulating material and an inorganic insulating material for the insulating layer 131, for example. The organic insulating material can be an organic resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin.

The insulating layer 131 is preferably formed at a temperature higher than or equal to room temperature and lower than or equal to 400° C., more preferably higher than or equal to 100° C. and lower than or equal to 350° C., more preferably higher than or equal to 150° C. and lower than or equal to 300° C.

[Formation of Transistor]

Figure 2C:
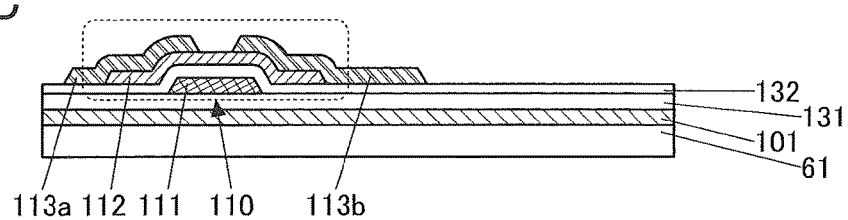

Next, as illustrated in FIG. 2C, the transistor 110 is formed over the insulating layer 131. Here, an example where a bottom-gate transistor is formed as an example of the transistor 110 will be described.

First, the conductive layer 111 is formed over the insulating layer 131. The conductive layer 111 can be formed in the following manner: a conductive film is formed, a resist mask is formed, the conductive film is etched, and the resist mask is removed.

Next, the insulating layer 132 is formed. For the insulating layer 132, the description of the inorganic insulating film that can be used as the insulating layer 131 can be referred to.

Then, the semiconductor layer 112 is formed. The semiconductor layer 112 can be formed in the following manner: a semiconductor film is formed, a resist mask is formed, the semiconductor film is etched, and the resist mask is removed.

The semiconductor film is formed at a substrate temperature higher than or equal to room temperature and lower than or equal to 300° C., preferably higher than or equal to room temperature and lower than or equal to 220° C., more preferably higher than or equal to room temperature and lower than or equal to 200° C., more preferably higher than or equal to room temperature and lower than or equal to 170° C. Here, "the substrate temperature for the film formation is room temperature" means that the substrate is not heated intentionally, and includes the case where the substrate temperature is higher than the room temperature because the substrate receives energy in the film formation. The room temperature has a range of, for example, higher than or equal to 10° C. and lower than or equal to 30° C., and is typically 25° C.

It is preferable to use an oxide semiconductor for the semiconductor film. In particular, an oxide semiconductor having a wider band gap than silicon is preferably used. A semiconductor material having a wider band gap and a lower carrier density than silicon is preferably used because off-state current of the transistor can be reduced.

It is preferable to use a material having a band gap of greater than or equal to 2.5 eV, preferably greater than or equal to 2.8 eV, further preferably greater than or equal to 3.0 eV as the oxide semiconductor. With use of such an oxide semiconductor, in light (e.g., laser light) irradiation in the separation process to be described later, the light easily transmits the semiconductor film and thus electrical characteristics of the transistor are less likely to be adversely affected.

In particular, the semiconductor film used for one embodiment of the present invention is preferably formed under an atmosphere that contains one or both of an inert gas (e.g., Ar) and an oxygen gas by a sputtering method in a state where the substrate is heated.

The substrate temperature for the film formation is preferably higher than or equal to room temperature and lower than or equal to 200° C., more preferably higher than or equal to room temperature and lower than or equal to 170° C. A high substrate temperature results in a larger number of crystal parts with orientation, which electrically stabilize the semiconductor film. A transistor including such a semiconductor film can have high electrical stability. In contrast, a film is formed at a low substrate temperature or intentionally formed without being heated, so that a semiconductor film can have a low proportion of crystal parts with orientation and high carrier mobility. A transistor including such a semiconductor film can have high field-effect mobility.

The oxygen flow rate ratio (partial pressure of oxygen) during the film formation is preferably higher than or equal to 0% and lower than 100%, more preferably higher than or equal to 0% and lower than or equal to 50%, more preferably higher than or equal to 0% and lower than or equal to 33%, and more preferably higher than or equal to 0% and lower than or equal to 15%. A low oxygen flow rate can result in a semiconductor film with high carrier mobility, leading to a transistor with high field-effect mobility.

Setting the substrate temperature and the oxygen flow rate during the film formation within the above ranges can result in a semiconductor film containing both crystal parts with orientation and crystal parts with no orientation. Furthermore, the proportions of crystal parts with orientation and crystal parts with no orientation can be adjusted by optimization of the substrate temperature and the oxygen flow rate within the above ranges.

An oxide target that can be used for forming the semiconductor film is not limited to an In—Ga—Zn-based oxide; for example, an In-M-Zn-based oxide (M is Al, Y, or Sn) can be used.

When a semiconductor film containing crystal parts is formed using a sputtering target containing a polycrystalline oxide having a plurality of crystal grains, a semiconductor film with crystallinity can be obtained easier than the case of using a sputtering target not containing a polycrystalline oxide.

In particular, a transistor including a semiconductor film that contains both crystal parts with orientation in a thickness direction (also referred to as a film surface direction, or a direction perpendicular to a formation surface or surface of a film) and randomly aligned crystal parts with no such orientation can have more stable electrical characteristics and a smaller channel length, for example. On the other hand, a transistor including a semiconductor film that contains only crystal parts with no orientation can have high field-effect mobility. Note that as described below, a reduction in oxygen vacancies in an oxide semiconductor can achieve a transistor with high field-effect mobility and high stability of electrical characteristics.

In the case of using the oxide semiconductor film as described above, high-temperature heat treatment and a laser crystallization process which are needed for LTPS are unnecessary; thus, the semiconductor layer 112 can be formed at a significantly low temperature. Therefore, the resin layer 101 can be formed thin.

Then, the conductive layer 113a and the conductive layer 113b are formed. The conductive layers 113a and 113b can be formed in the following manner: a conductive film is formed, a resist mask is formed, the conductive film is etched, and the resist mask is removed.

Note that during the processing of the conductive layers 113a and 113b, the semiconductor layer 112 might be partly etched to be thin in a region not covered with the resist mask. An oxide semiconductor film containing crystal parts with orientation is preferable for the semiconductor layer 112 because the unintended etching can be prevented.

In the above manner, the transistor 110 can be fabricated. The transistor 110 contains an oxide semiconductor in the semiconductor layer 112 where a channel is formed. In the transistor 110, part of the conductive layer 111 functions as a gate, part of the insulating layer 132 functions as a gate insulating layer, and the conductive layer 113a and the conductive layer 113b function as a source and a drain.

[Formation of Insulating Layer 133]

Next, the insulating layer 133 that covers the transistor 110 is formed. The insulating layer 133 can be Ruined in a manner similar to that of the insulating layer 132.

The insulating layer 133 is preferably formed at a temperature higher than or equal to room temperature and lower than or equal to 400° C., more preferably higher than or equal to 100° C. and lower than or equal to 350° C., more preferably higher than or equal to 150° C. and lower than or equal to 300° C. Higher temperatures can provide the insulating film with higher density and a higher barrier property.

It is preferable to use an oxide insulating film, such as a silicon oxide film or a silicon oxynitride film, formed at a low temperature in the above range under an atmosphere containing oxygen for the insulating layer 133. An insulating film with low oxygen diffusibility and low oxygen permeability, such as a silicon nitride film, is preferably stacked over the silicon oxide film or the silicon oxynitride film. The oxide insulating film formed at low temperatures under an atmosphere containing oxygen can easily release a large amount of oxygen by heating. When a stack including such an oxide insulating film that releases oxygen and an insulating film with low oxygen diffusibility and low oxygen permeability is heated, oxygen can be supplied to the semiconductor layer 112. As a result, oxygen vacancies in the semiconductor layer 112 can be filled and defects at the interface between the semiconductor layer 112 and the insulating layer 133 can be repaired, leading to a reduction in defect levels. Accordingly, an extremely highly reliable semiconductor device can be fabricated.

Through the above steps, the transistor 110 and the insulating layer 133 covering the transistor 110 can be formed over the flexible resin layer 101. If the resin layer 101 and the support substrate 61 are separated from each other at this stage by a method described later, a flexible device including no display element can be fabricated. Farming the transistor 110 or forming a capacitor, a resistor, a wiring, and the like in addition to the transistor 110 can provide a flexible device including a semiconductor circuit, for example.

[Formation of Insulating Layer 134]

Then, the insulating layer 134 is formed over the insulating layer 133. The display element is formed on the insulating layer 134 in a later step; thus, the insulating layer 134 preferably functions as a planarization layer. For the insulating layer 134, the description of the organic insulating film or the inorganic insulating film that can be used for the insulating layer 131 can be referred to.

For the insulating layer 134, as well as for the resin layer 101, a photosensitive and thermosetting resin material is preferably used. In particular, the same material is preferably used for the insulating layer 134 and the resin layer 101. Thus, the insulating layer 134 can be formed using the same material and apparatus as the resin layer 101.

The thickness of the insulating layer 134, as well as the thickness of the resin layer 101, is preferably greater than or equal to 0.01 µm and less than 10 µm, more preferably greater than or equal to 0.1 µm and less than or equal to 3 µm, and more preferably greater than or equal to 0.5 µm and less than or equal to 1 µm. The use of a low viscosity solvent facilitates the formation of the thin and uniform insulating layer 134.

[Formation of Light-Emitting Element 120]

Next, openings that reach the conductive layer 113b and the like are formed in the insulating layer 134 and the insulating layer 133.

After that, a conductive layer 121 is formed. Part of the conductive layer 121 functions as a pixel electrode. The conductive layer 121 can be formed in the following manner: a conductive film is formed, a resist mask is formed, the conductive film is etched, and the resist mask is removed.

Figure 2D:
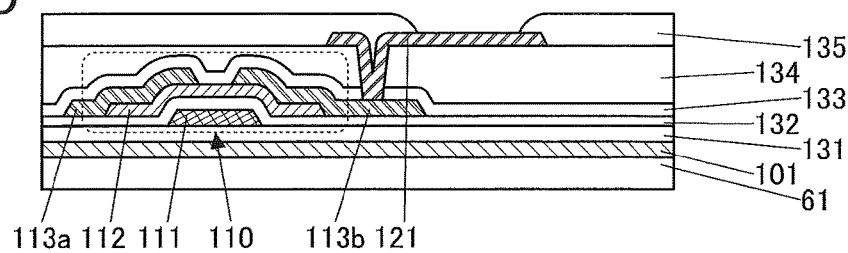

Subsequently, the insulating layer 135 that covers an end portion of the conductive layer 121 is formed as illustrated in FIG. 2D. For the insulating layer 135, the description of the organic insulating film or the inorganic insulating film that can be used for the insulating layer 131 can be referred to.

For the insulating layer 135, as well as for the resin layer 101, a photosensitive and thermosetting resin material is preferably used. In particular, the same material is preferably used for the insulating layer 135 and the resin layer 101. Thus, the insulating layer 135 can be formed using the same material and apparatus as the resin layer 101.

The thickness of the insulating layer 135, as well as the thickness of the resin layer 101, is preferably greater than or equal to 0.01 µm and less than 10 µm, more preferably greater than or equal to 0.1 µm and less than or equal to 3 µm, and more preferably greater than or equal to 0.5 µm and less than or equal to 1 µm. The use of a low viscosity solvent facilitates the formation of the thin and uniform insulating layer 135.

Figure 2E:
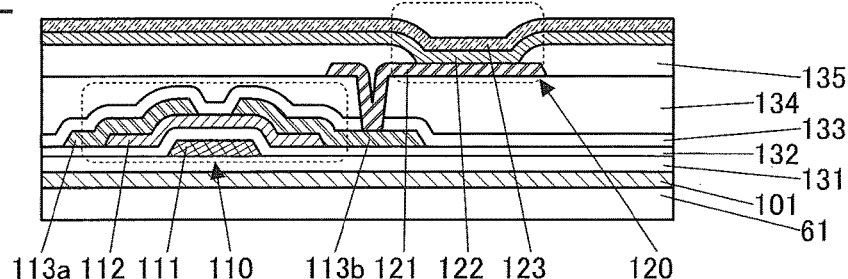

Next, the EL layer 122 and the conductive layer 123 are formed as illustrated in FIG. 2E.

The EL layer 122 can be formed by an evaporation method, a coating method, a printing method, a discharge method, or the like. In the case where the EL layer 122 is formed for each individual pixel, an evaporation method using a shadow mask such as a metal mask, an ink-jet method, or the like can be used. In the case of sharing the EL layer 122 by some pixels, an evaporation method not using a metal mask can be used. Here, an example where the EL layer 122 is formed by an evaporation method without using a metal mask is described.

The conductive layer 123 can be formed by an evaporation method, a sputtering method, or the like.

In the above manner, the light-emitting element 120 can be completed. In the light-emitting element 120, the conductive layer 121 part of which functions as a pixel electrode, the EL layer 122, and the conductive layer 123 part of which functions as a common electrode are stacked.

[Formation of Resin Layer 102]

A support substrate 62 is prepared. For the support substrate 62, the description of the support substrate 61 can be referred to.

Figure 3A:
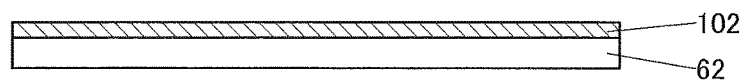
FIGS. 3A to 3D illustrate a method for manufacturing a display device of one embodiment.

Next, the resin layer 102 is formed over the support substrate 62 (FIG. 3A). The description of the method and the material for forming the resin layer 102 can be referred to for those for forming the resin layer 101.

[Formation of Insulating Layer 141]

Figure 3B:
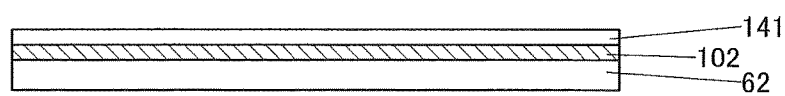

The insulating layer 141 is formed over the resin layer 102 (FIG. 3B). The insulating layer 141 can be used as a barrier layer that prevents impurities contained in the resin layer 102 from diffusing into a transistor or a light-emitting element to be formed later. Thus, it is preferable to use a material with a high barrier property.

The description of the method and the material for forming the insulating layer 131 can be referred to for those for forming the insulating layer 141.

[Formation of Light-Blocking Layer and Coloring Layer]

Figure 3C:
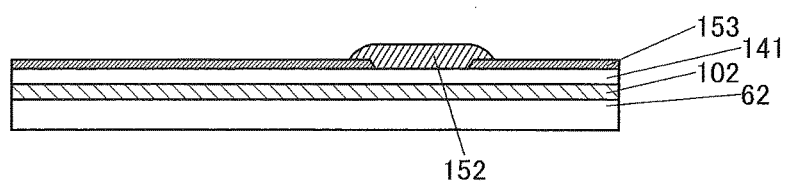

Next, the light-blocking layer 153 and the coloring layer 152 are formed over the insulating layer 141 (see FIG. 3C).

For the light-blocking layer 153, a metal material or a resin material can be used. In the case where a metal material is employed, the light-blocking layer 153 can be formed in such a manner that a conductive film is formed and an unnecessary portion is removed by a photolithography method or the like. In the case where a metal material or a photosensitive resin material containing pigment or dye is used, the light-blocking layer 153 can be formed by a photolithography method or the like.

For the coloring layer 152, a photosensitive material can be used. The coloring layer 152 formed with a photosensitive material can be processed into an island-like shape by a photolithography method or the like.

Through the above steps, the insulating layer 141, the light-blocking layer 153, and the coloring layer 152 can be formed over the resin layer 102. Note that a manufacturing process for the resin layer 101 side and a manufacturing process for the resin layer 102 side can be independently performed, and the order is not particularly limited. Alternatively, these two processes may be performed in parallel.

[Bonding]

Figure 3D:
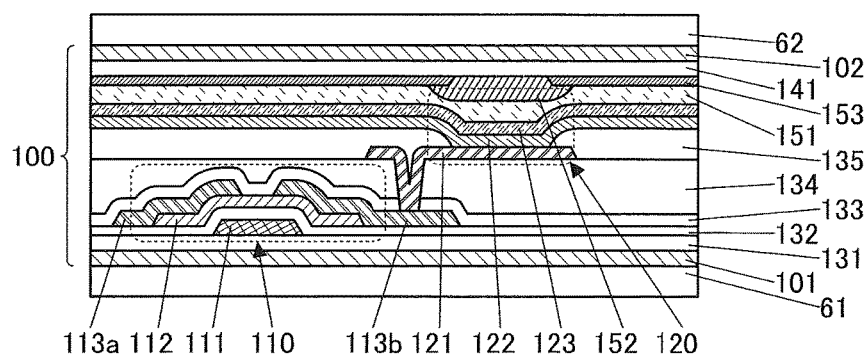

Next, as illustrated in FIG. 3D, the support substrate 61 and the support substrate 62 are bonded to each other with use of the adhesive layer 151. Then, the adhesive layer 151 is cured. Thus, the light-emitting element 120 can be sealed by the adhesive layer 151.

A curable material is preferably used for the adhesive layer 151. For example, a photocurable resin, a reactive curable resin, or a thermosetting resin can be used. In particular, a resin material without a solvent is preferably used.

Through the above steps, the display panel 100 can be fabricated. At the point of FIG. 3D, the display panel 100 is sandwiched by the support substrate 61 and the support substrate 62.

[Formation of Resin Layer 201]

A support substrate 63 is prepared and a resin layer 201 is formed over the support substrate 63.

The description of the support substrate 61 can be referred to for the support substrate 63.

The description of the method and the material for forming the resin layer 101 can be referred to for those for forming the resin layer 201.

[Formation of Insulating Layer 231]

The insulating layer 231 is formed over the resin layer 201. The description of the method and the material for forming the insulating layer 131 can be referred to for those for forming the insulating layer 231.

[Formation of Transistor 210]

Figure 4A:
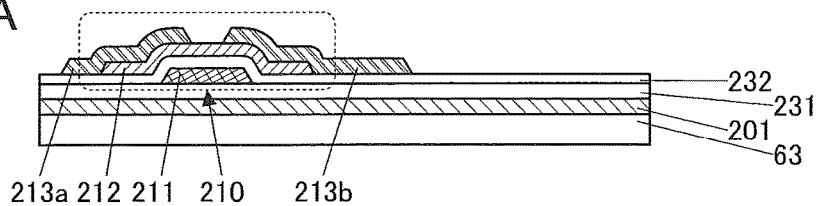
FIGS. 4A to 4E illustrate a method for manufacturing a display device of one embodiment.

Next, as illustrated in FIG. 4A, the transistor 210 is formed over the insulating layer 231.

The transistor 210 is formed by forming the conductive layer 211, the insulating layer 232, the semiconductor layer 212, and the conductive layers 213a and 213b in this order. The formation method of the transistor 110 can be referred to for the formation method of each layer.

The transistor 210 contains an oxide semiconductor in the semiconductor layer 212 where a channel is formed. In the transistor 210, part of the conductive layer 211 functions as a gate, part of the insulating layer 232 functions as a gate insulating layer, and the conductive layers 213a and 213b function as a source and a drain.

[Formation of Conductive Layer 221 and Alignment Film 224a]

Next, an opening that reaches the conductive layer 213b is formed in the insulating layer 234 and the insulating layer 233.

After that, the conductive layer 221 is formed. Part of the conductive layer 221 functions as a pixel electrode. The conductive layer 221 can be formed in the following manner: a conductive film is formed, a resist mask is formed, the conductive film is etched, and the resist mask is removed.

Figure 4B:
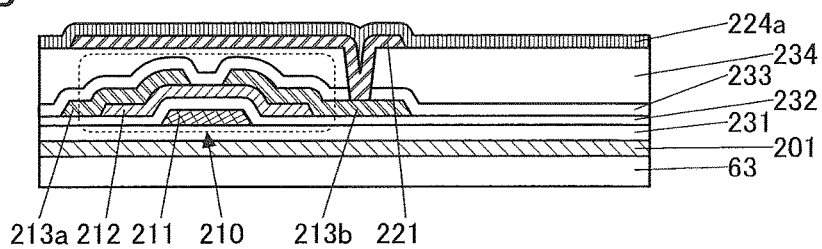

Next, as illustrated in FIG. 4B, the alignment film 224a is formed over the conductive layer 221 and the insulating layer 234. The alignment film 224a can be formed by performing rubbing treatment after a thin film of a resin or the like is formed.

Through the above steps, the transistor 210, the conductive layer 221, the alignment film 224a, and the like can be formed over the resin layer 201.

[Formation of Resin Layer 202]

A support substrate 64 is prepared. The description of the support substrate 61 can be referred to for the support substrate 64.

Figure 4C:
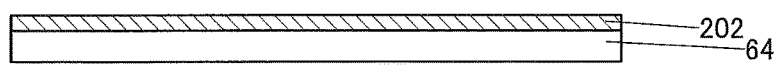

Next, the resin layer 202 is formed over the support substrate 64 (FIG. 4C). The description of the method and the material for forming the resin layer 101 can be referred to for those for forming the resin layer 202.

[Formation of Conductive Layer 223 and Alignment Film 224b]

Next, the conductive layer 223 is formed over the resin layer 202. The conductive layer 223 can be formed by forming a conductive film. Note that the conductive layer 223 may be formed by, for example, a sputtering method using a shadow mask such as a metal mask such that the conductive layer 223 is not provided in the peripheral portion of the resin layer 202. Alternatively, after the conductive film is formed, an unnecessary portion of the conductive film may be removed by etching using a photolithography method or the like.

Figure 4D:
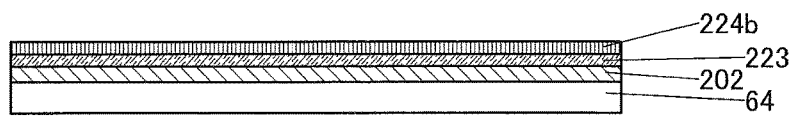

Next, the alignment film 224b is formed over the conductive layer 223 (see FIG. 4D). The alignment film 224b can be formed by a method similar to that of the alignment film 224a.

Through the above steps, the conductive layer 223 and the alignment film 224b can be formed over the resin layer 202. Note that a manufacturing process for the resin layer 201 side and a manufacturing process for the resin layer 202 side can be independently performed, and the order is not particularly limited. Alternatively, these two processes may be performed in parallel.

[Bonding]

Figure 4E:
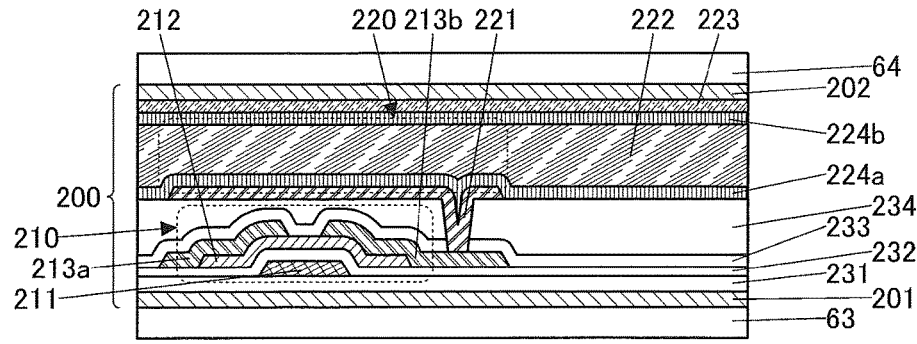

Next, as illustrated in FIG. 4E, the support substrate 63 and the support substrate 64 are bonded to each other with the liquid crystal 222 interposed therebetween. Here, the resin layer 201 and the resin layer 202 are bonded with an adhesive layer (not illustrated) in the peripheral portion.

Next, an adhesive layer (not illustrated) for bonding the resin layer 201 and the resin layer 202 is formed on one or both of the resin layer 201 and the resin layer 202. The adhesive layer is formed to surround a region where a pixel is provided. The adhesive layer can be formed by a screen printing method, a dispensing method, or the like. For the adhesive layer, a thermosetting resin, an ultraviolet curable resin, or the like can be used. Alternatively, a resin which is cured when heated after pre-cured by ultraviolet light or the like may be used. Alternatively, a thermosetting and ultraviolet curable resin or the like may be used as the adhesive layer.

Next, the liquid crystal 222 is dropped in a region surrounded by the adhesive layer by a dispensing method or the like. Then, the support substrate 63 and the support substrate 64 are bonded to each other such that the liquid crystal 222 is interposed therebetween, and the adhesive layer is cured. The bonding is preferably performed in a reduced-pressure atmosphere because air bubbles and the like can be prevented from entering between the support substrate 63 and the support substrate 64.

Note that after the liquid crystal 222 is dropped, a particulate gap spacer may be positioned in a region where the pixel is provided or outside the region, or the liquid crystal 222 containing the gap spacer may be dropped. The liquid crystal 222 may be injected in a reduced-pressure atmosphere through a space provided in the adhesive layer after the support substrate 63 and the support substrate 64 are bonded to each other.

Through the above steps, the display panel 200 can be fabricated. At the point of FIG. 4E, the display panel 100 is interposed by the support substrate 61 and the support substrate 62.

[Separation of Support Substrate 62]

Figure 5A:
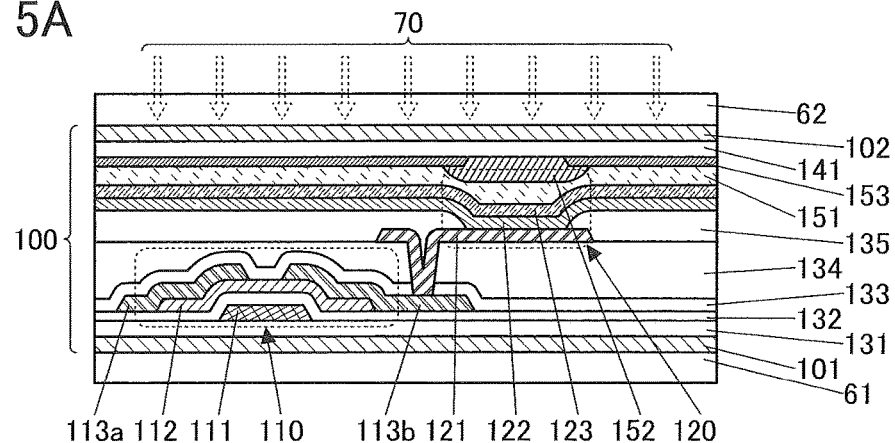
FIGS. 5A and 5B illustrate a method for manufacturing a display device of one embodiment.

Next, as illustrated in FIG. 5A, the resin layer 102 is irradiated with the light 70 through the support substrate 62 from the support substrate 62 side of the display panel 100.

Laser light is suitable for the light 70. In particular, linear laser is preferable.

Note that a flash lamp or the like may be used as long as the resin layer 102 can be irradiated with light whose energy is as high as that of laser light.

As the light 70, light having a wavelength by which at least part of the light 70 is transmitted through the support substrate 62 and absorbed by the resin layer 102 is selected. In particular, it is preferable to use light with a wavelength range from visible light to ultraviolet light as the light 70. For example, light having a wavelength of greater than or equal to 200 nm and less than or equal to 400 nm, preferably greater than or equal to 250 nm and less than or equal to 350 nm, is used. In particular, an excimer laser having a wavelength of 308 nm is preferably used because the productivity is increased. The excimer laser is preferable because the excimer laser can be used also for laser crystallization of LTPS, so that the existing LIPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. A pulsed laser such as a picosecond laser may be used.

In the case where a linear laser light is used as the light 70, the light 70 is scanned and a region to be peeled is entirely irradiated with the light 70 by relatively moving the support substrate 61 and a light source. At this step, when irradiation is performed on the entire region where the resin layer 102 is provided, the resin layer 102 can be peeled entirely and it is not necessary to cut the periphery portion of the support substrate 62 by scribing or the like in a subsequent separation step. Alternatively, it is preferable that the peripheral portion of the region where the resin layer 102 is provided have a region not irradiated with the light 70 because separation of the resin layer 102 and the support substrate 62 can be suppressed at the irradiation.

By the irradiation with the light 70, the vicinity of the surface of the resin layer 102 on the support substrate 61 side or part of the inside of the resin layer 102 is improved and the adhesion between the support substrate 61 and the resin layer 102 is reduced. In contrast, the region not irradiated with the light 70 still has high adhesion.

Figure 5B:
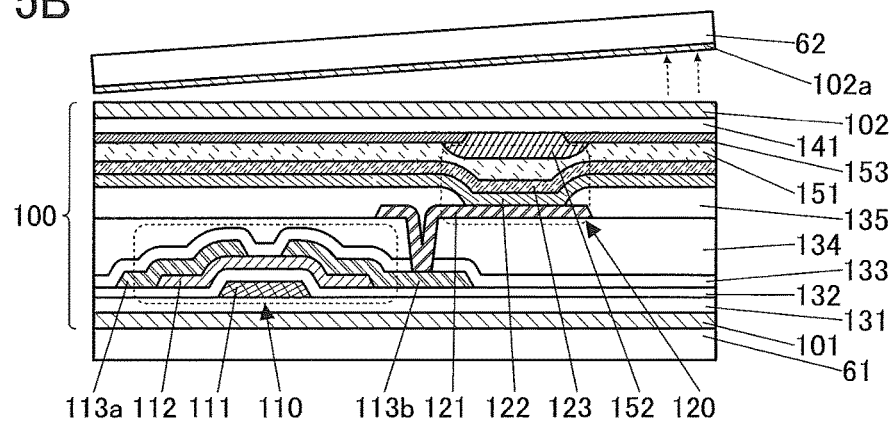

Next, the support substrate 62 and the resin layer 102 are separated (FIG. 5B).

Separation can be performed by applying pulling force in the perpendicular direction to the support substrate 62 while the support substrate 61 is fixed to a stage. For example, the support substrate 62 can be separated by adsorbing part of the top surface of the support substrate 62 and pulling it upward. The stage may have any structure as long as the support substrate 61 can be fixed. For example, the stage may have an adsorption mechanism capable of vacuum adsorption, electrostatic adsorption, or the like or a mechanism physically fastening the support substrate 61.

Alternatively, separation may be performed by pressing a drum-shaped member with an adhesive surface against the top surface of the support substrate 62 and rotating the member. At this time, the stage may be moved in the peeling direction.

In the case where the region not irradiated with the light 70 is provided in the peripheral portion of the resin layer 102, a notch may be formed in part of the resin layer 102 irradiated with the light 70 to serve as a trigger for peeling. The notch can be formed with a sharp edged tool or a needle-like member or can be formed by cutting the support substrate 61 and the resin layer 102 at the same time by scribing or the like.

FIG. 5B illustrates an example in which a resin layer 102a which is part of the resin layer 102 remains on the support substrate 62 side. Depending on the condition of the irradiation with the light 70, separation (fracture) occurs inside the resin layer 102 and the resin layer 102a remains in this manner in some cases. Also in the case where part of the surface of the resin layer 102 is melted, part of the resin layer 102a sometimes remains on the support substrate 62 side in a similar manner. In the case where separation is performed at the interface between the support substrate 62 and the resin layer 102, the resin layer 102a sometimes does not remain on the support substrate 62 side.

The thickness of the resin layer 102a remaining on the support substrate 62 side can be less than or equal to 100 nm, specifically approximately greater than or equal to 40 nm and less than or equal to 70 nm. The support substrate 62 can be reused by removing the remaining resin layer 102a. For example, in the case where glass is used for the support substrate 62 and a polyimide resin is used for the resin layer 102, the resin layer 102a can be removed with fuming nitric acid.

[Separation of Support Substrate 63]

Figure 6A:
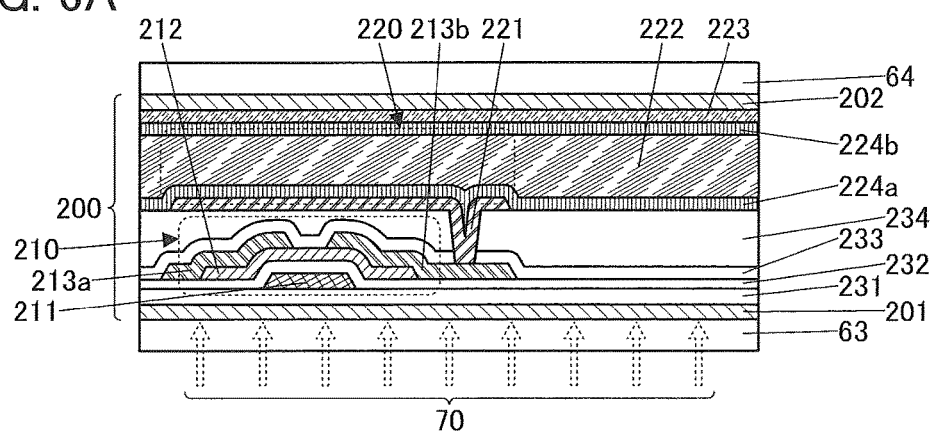
FIGS. 6A and 6B illustrate a method for manufacturing a display device of one embodiment.

Next, as illustrated in FIG. 6A, the resin layer 201 is irradiated with the light 70 through the support substrate 63 from the support substrate 63 side of the display panel 200.

The above description can be referred to for the irradiation method of the light 70.

Figure 6B:
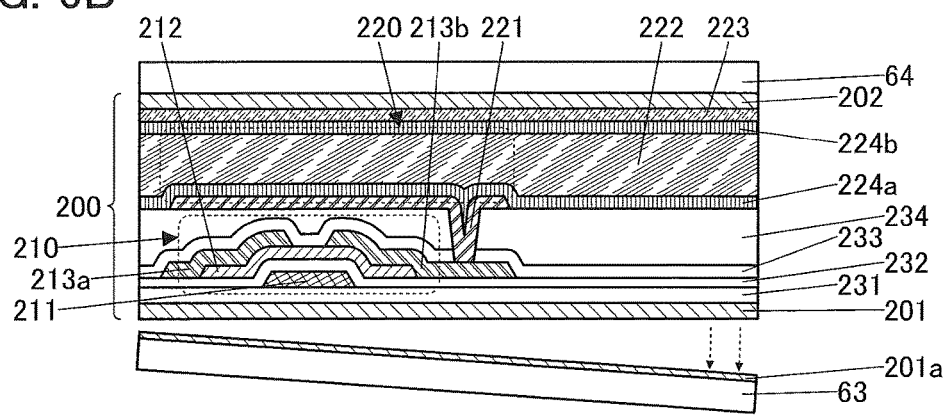

Next, the support substrate 63 and the resin layer 201 are separated (FIG. 6B). The above description can be referred to for the separation. FIG. 6B illustrates an example in which a resin layer 201a remains on the support substrate 63 side.

[Bonding of Display Panel 100 and Display Panel 200]

Figure 7A:
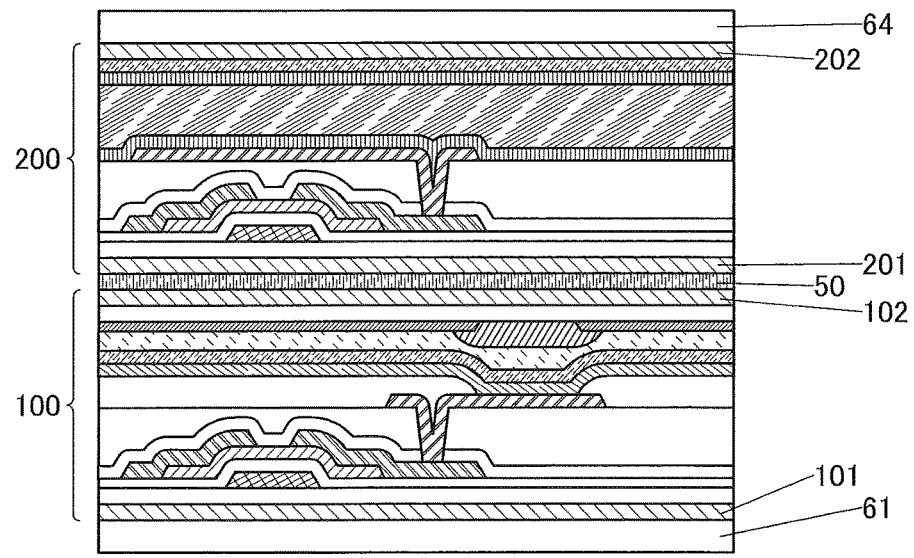
FIGS. 7A and 7B illustrate a method for manufacturing a display device of one embodiment.

Next, as illustrated in FIG. 7A, the resin layer 102 of the display panel 100 and the resin layer 201 of the display panel 200 are bonded to each other with the adhesive layer 50. The description of the adhesive layer 151 can be referred to for the adhesive layer 50.

At this time, when displacement of the display panel 100 and the display panel 200 occurs, light from the light-emitting element 120 is blocked by a light-blocking member of the display panel 200 in some cases. Therefore, it is preferable to provide an alignment marker for each of the display panel 100 and the display panel 200. According to this manufacturing method example, since the display device includes the support substrate 61 and the support substrate 64 in the bonding step, the alignment accuracy can be improved as compared with the case where flexible display panels are bonded to each other; thus, the display device can have high resolution. For example, a display device having resolution exceeding 500 ppi can be achieved.

[Separation of Support Substrate 61]

Figure 7B:
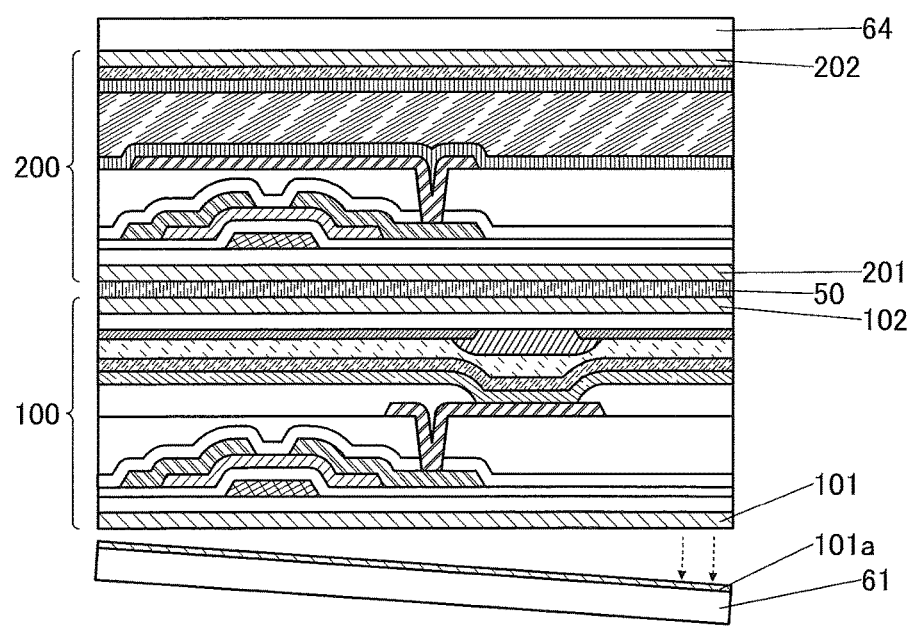

Next, the resin layer 101 is irradiated with the light 70 (not illustrated) through the support substrate 61 from the support substrate 61 side. After that, as illustrated in FIG. 7B, the support substrate 61 and the resin layer 101 are separated.

The above description can be referred to for the irradiation method of the light 70 (not illustrated).

The separation can be performed in a state where the support substrate 64 is fixed to a stage or the like. The above description can be referred to for the separation method.

[Bonding of Substrate 11]

Figure 8A:
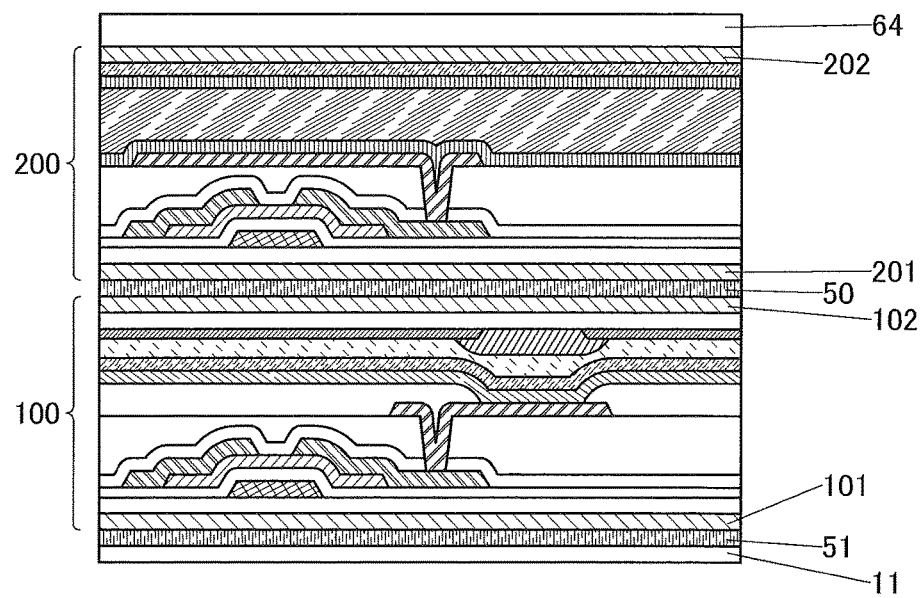
FIGS. 8A and 8B illustrate a method for manufacturing a display device of one embodiment.

Next, as illustrated in FIG. 8A, the resin layer 101 and the substrate 11 are bonded to each other with the adhesive layer 51.

The description of the adhesive layer 151 can be referred to for the adhesive layer 51.

The use of a resin material for the substrate 11 and the later-described substrate 12 can reduce the weight of the display device as compared with the case even when the thickness of the resin material is the same as that of the glass or the like. A material which is thin enough to have flexibility is preferably used because the display device can be further reduced in weight. Furthermore, when a resin material is used, the display device can have higher impact resistance; thus, a non-breakable display device can be achieved.

Since the substrate 11 is located on the side opposite to the viewing side, the substrate 11 does not necessarily transmit visible light. Therefore, a metal material can also be used. A metal material, which has high thermal conductivity, can suppress a local temperature rise in the display device because it can easily conduct heat to the whole substrate.

[Separation of Support Substrate 64]

Figure 8B:
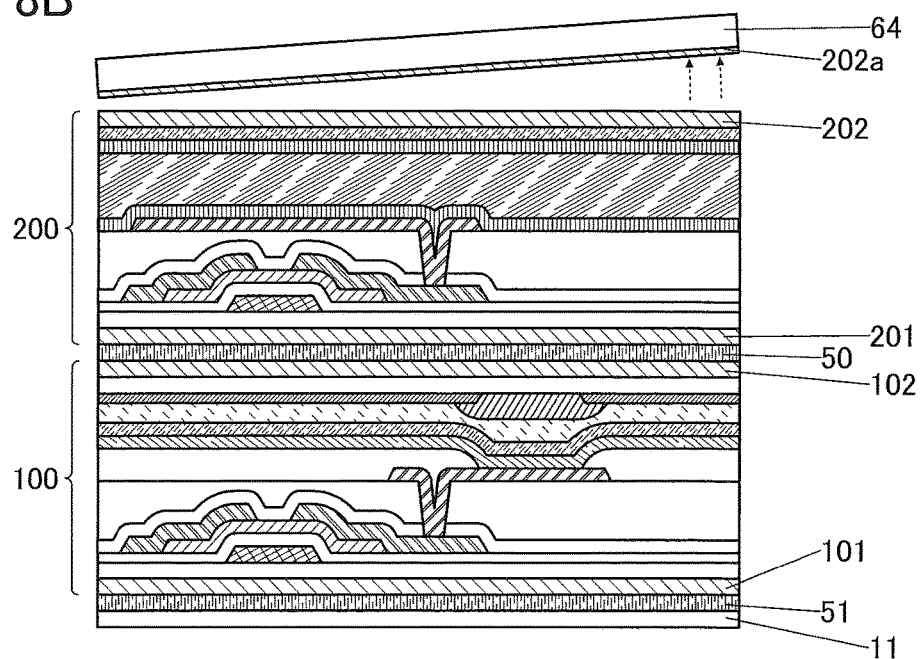

Next, the resin layer 202 is irradiated with the light 70 (not illustrated) through the support substrate 64 from the support substrate 64 side. After that, as illustrated in FIG. 8B, the support substrate 64 and the resin layer 202 are separated.

The above description can be referred to for the irradiation method of the light 70 (not illustrated).

The separation can be performed in a state where the substrate 11 is fixed to a stage or the like. The above description can be referred to for the separation method.

[Bonding of Substrate 12]

Next, the resin layer 202 and the substrate 12 are bonded to each other with the adhesive layer 52.

The description of the adhesive layer 151 can be referred to for the adhesive layer 52.

Since the substrate 12 is located on the viewing side, a material transmitting visible light can be used.

Through the above steps, the display device 10 illustrated in FIG. 1 can be manufactured.

[Transistor]

The display device 10 exemplified in FIG. 1 shows an example of using bottom-gate transistors as the transistor 110 and the transistor 210.

In the transistor 110, the conductive layer 111 functioning as a gate electrode is located closer to the formation surface (the resin layer 101 side) than the semiconductor layer 112. The insulating layer 132 covers the conductive layer 111. The semiconductor layer 112 covers the conductive layer 111. A region of the semiconductor layer 112 that overlaps with the conductive layer 111 corresponds to a channel formation region. The conductive layers 113*a* and 113*b* are provided in contact with the top surface and side end portions of the semiconductor layer 112.

Note that in the transistor 110 shown as an example, the width of the semiconductor layer 112 is wider than that of the conductive layer 111. In such a structure, the semiconductor layer 112 is located between the conductive layer 111 and each of the conductive layers 113*a* and 113*b*. Thus, the parasitic capacitance between the conductive layer 111 and each of the conductive layers 113*a* and 113*b* can be reduced.

The transistor 110 is a channel-etched transistor and can be suitably used for a high-resolution display device because the occupation area of the transistor can be reduced comparatively easily.

The transistor 210 and the transistor 110 have common characteristics.

A structure example of a transistor that can be used for the transistor 110 and the transistor 210 will be described.

Figure 9A:
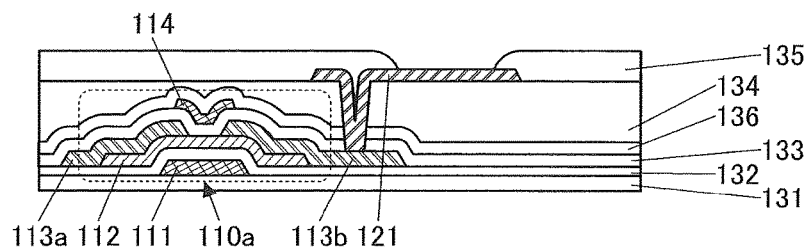
FIGS. 9A to 9C illustrate structure examples of a display device of one embodiment.

A transistor 110*a* illustrated in FIG. 9A is different from the transistor 110 in that the transistor 110*a* includes a conductive layer 114 and an insulating layer 136. The conductive layer 114 is provided over the insulating layer 133 and includes a region overlapping with the semiconductor layer 112. The insulating layer 136 covers the conductive layer 114 and the insulating layer 133.

The conductive layer 114 is located to face the conductive layer 111 with the semiconductor layer 112 interposed therebetween. In the case where the conductive layer 111 is used as a first gate electrode, the conductive layer 114 can function as a second gate electrode. By supplying the same potential to the conductive layer 111 and the conductive layer 114, the on-state current of the transistor 110*a* can be increased. By supplying a potential for controlling the threshold voltage to one of the conductive layer 111 and the conductive layer 114 and a potential for driving to the other, the threshold voltage of the transistor 110*a* can be controlled.

A conductive material including an oxide is preferably used as the conductive layer 114. In that case, a conductive film to be the conductive layer 114 is formed in an atmosphere containing oxygen, whereby oxygen can be supplied to the insulating layer 133. The proportion of an oxygen gas in a film formation gas is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

It is particularly preferable to use, as the conductive layer 114, an oxide semiconductor whose resistance is reduced. In this case, the insulating layer 136 is preferably formed using an insulating film that releases hydrogen, for example, a silicon nitride film. Hydrogen is supplied to the conductive layer 114 during the formation of the insulating layer 136 or by heat treatment to be preformed after that, whereby the electrical resistance of the conductive layer 114 can be reduced effectively.

Figure 9B:
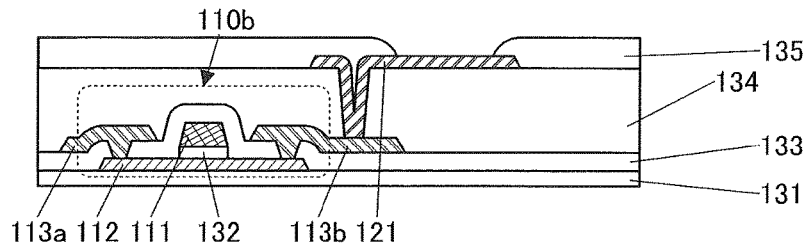

A transistor 110*b* illustrated in FIG. 9B is a top-gate transistor.

In the transistor 110*b*, the conductive layer 111 functioning as a gate electrode is provided over the semiconductor layer 112 (provided on the side opposite to the formation surface side). The semiconductor layer 112 is formed over the insulating layer 131. The insulating layer 132 and the conductive layer 111 are stacked over the semiconductor layer 112. The insulating layer 133 covers the top surface and the side end portions of the semiconductor layer 112, side surfaces of the insulating layer 132, and the conductive layer 111. The conductive layers 113*a* and 113*b* are provided over the insulating layer 133. The conductive layers 113*a* and 113*b* are electrically connected to the top surface of the semiconductor layer 112 through openings provided in the insulating layer 133.

Note that although the insulating layer 132 is not present in a portion that does not overlap with the conductive layer 111 in the example, the insulating layer 132 may be provided in a portion covering the top surface and the side end portion of the semiconductor layer 112.

In the transistor 110b, the physical distance between the conductive layer 111 and the conductive layer 113a or 113b can be easily increased, so that the parasitic capacitance therebetween can be reduced.

Figure 9C:
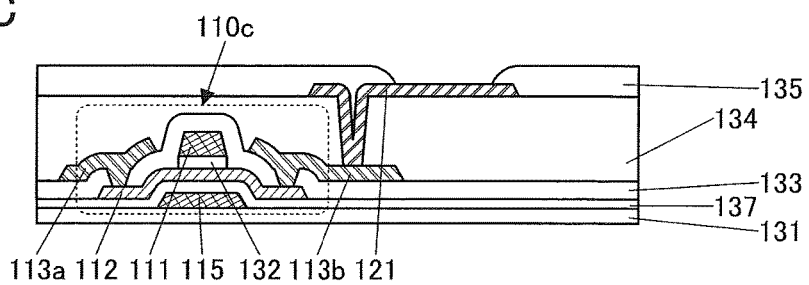

A transistor 110c illustrated in FIG. 9C is different from the transistor 110b in that the transistor 110c includes a conductive layer 115 and an insulating layer 137. The conductive layer 115 is provided over the insulating layer 131 and includes a region overlapping with the semiconductor layer 112. The insulating layer 137 covers the conductive layer 115 and the insulating layer 131.

The conductive layer 115 functions as a second gate electrode like the conductive layer 114. Thus, the on-state current can be increased and the threshold voltage can be controlled, for example.

In the display device 10, the transistor included in the display panel 100 and the transistor included in the display panel 200 may be different from each other. For example, the transistor 110a or the transistor 110c can be used as the transistor that is electrically connected to the light-emitting element 120 because a comparatively large amount of current needs to be fed to the transistor, and the transistor 110 can be used as the other transistor to reduce the occupation area of the transistor.

Figure 10:
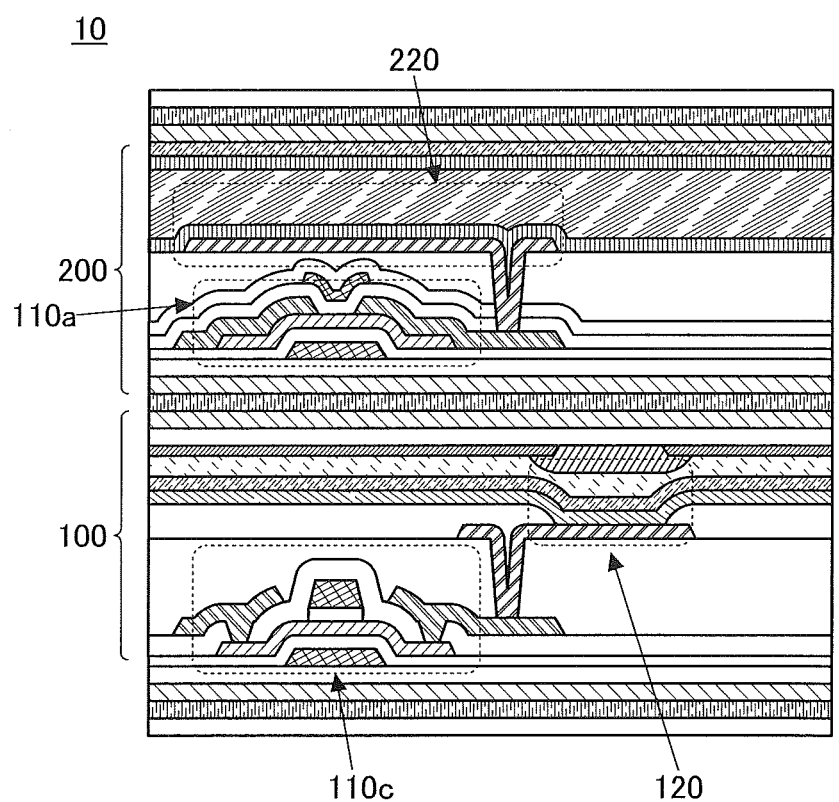
FIG. 10 illustrates a structure example of a display device of one embodiment.

FIG. 10 illustrates an example of the case where the transistor 110a is used instead of the transistor 210 in FIG. 1 and the transistor 110c is used instead of the transistor 110 in FIG. 1.

The above is the description of the transistor.

[Structure Example 2]

A structure example of a display device partly different from the above structural example will be described below. Note that descriptions of the portions already described are omitted and different portions are described below.

Figure 11:
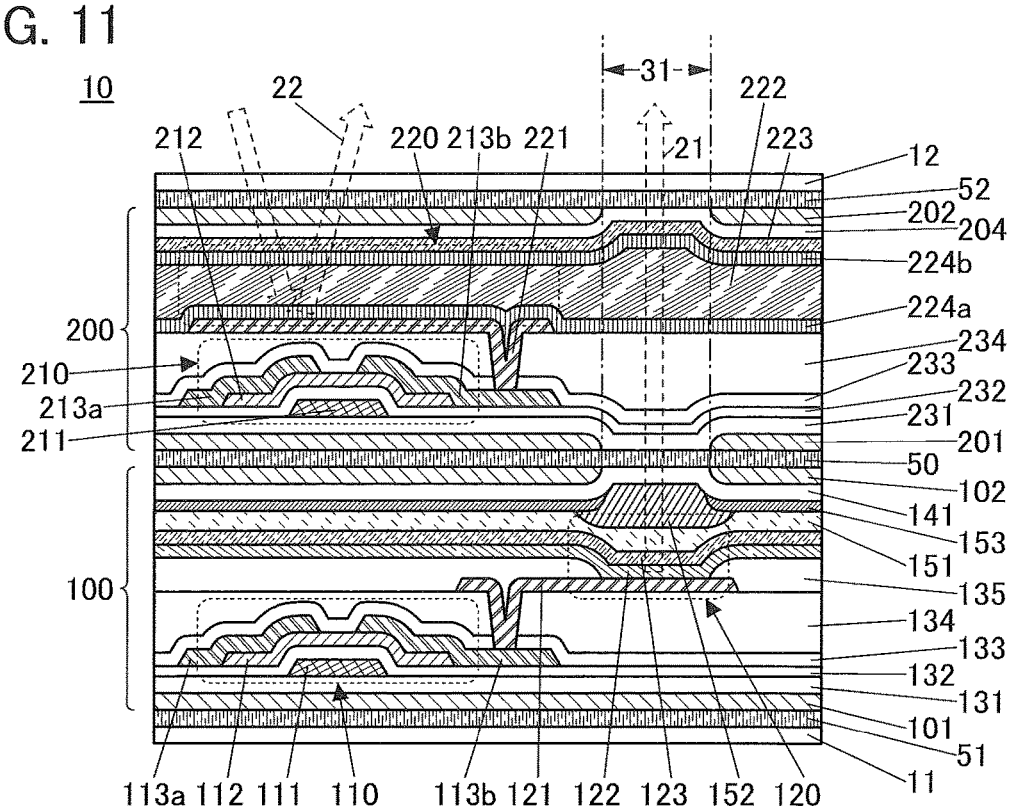
FIG. 11 illustrates a structure example of a display device of one embodiment.
Figure 12A:
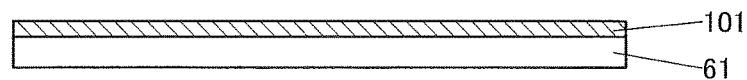
FIGS. 12A to 12E illustrate a method for manufacturing a display device of one embodiment.
Figure 12B:
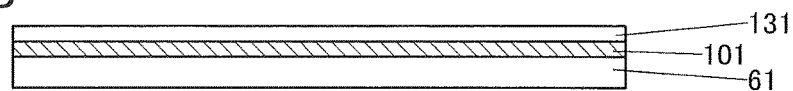
Figure 12C:
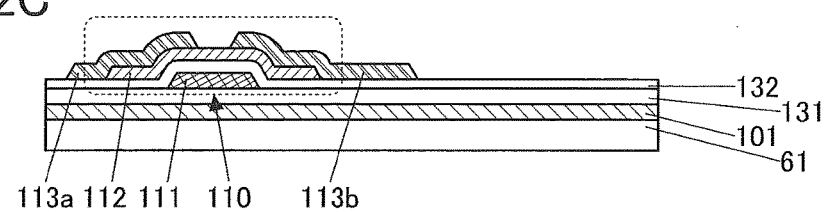
Figure 12D:
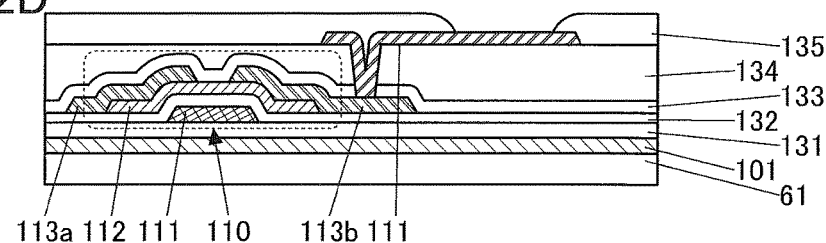
Figure 12E:
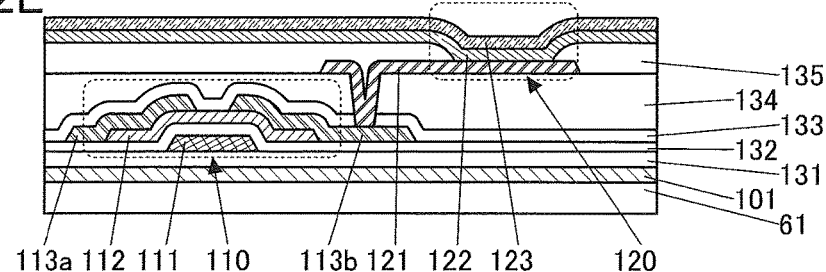

FIG. 11 is a schematic cross-sectional view of the display device 10 described below.

In FIG. 11, the resin layer 102, the resin layer 201, and the resin layer 202 are each provided with an opening. A region 31 shown in FIG. 11 is a region overlapping with the light-emitting element 120 and overlapping with the opening of the resin layer 102, the opening of the resin layer 201, and the opening of the resin layer 202.

The insulating layer 141 covers the opening of the resin layer 102. A portion of the insulating layer 141 that overlaps with the opening of the resin layer 102 is in contact with the adhesive layer 50.

The insulating layer 204, the conductive layer 223, and the alignment film 224b are stacked on the resin layer 201 side of the resin layer 202. In addition, a coloring layer for coloring light reflected by the liquid crystal element 220 may be provided.

The insulating layer 231 covers the opening of the resin layer 201. A portion of the insulating layer 231 that overlaps with the opening of the resin layer 202 is in contact with the adhesive layer 50. The insulating layer 204 covers the opening of the resin layer 202. A portion of the insulating layer 204 that overlaps with the opening of the resin layer 202 is in contact with the adhesive layer 52.

The light 21 emitted from the light-emitting element 120 is emitted to the viewing side through the opening of the resin layer 102, the opening of the resin layer 201, and the opening of the resin layer 202. Since the resin layer 102, the resin layer 201, and the resin layer 202 are not provided in the path of the light 21, even in the case where the resin layer 102, the resin layer 201, and the resin layer 202 absorb part of visible light, high light extraction efficiency and high color reproducibility can be obtained.

The above is the description of Structure example 2.

[Manufacturing Method Example 2]

A manufacturing method example of the display device shown in Structure example 2 is described below. Note that descriptions of the portions already described in Manufacturing method example 1 are omitted and different portions are described below.

First, as in the manufacturing method 1, the resin layer 101 is formed over the support substrate 61, and the transistor 110 and the light-emitting element 120 are formed over the resin layer 101 (FIGS. 12A to 12E).

[Formation of Light Absorption Layer 103a]

A support substrate 62 is prepared. For the support substrate 62, the description of the support substrate 61 can be referred to.

Figure 13A:
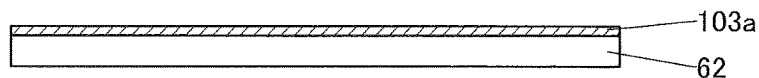
FIGS. 13A to 13E illustrate a method for manufacturing a display device of one embodiment.

A light absorption layer 103a is formed over the support substrate 62 (FIG. 13A). The light absorption layer 103a releases hydrogen, oxygen, or the like by absorbing light 70 and generating heat in a light 70 irradiation step to be preformed later.

As the light absorption layer 103a, for example, a hydrogenated amorphous silicon (a-Si:H) film from which hydrogen is released by heating can be used. The hydrogenated amorphous silicon film can be formed by, for example, a plasma CVD method using a deposition gas containing $SiH_4$. Furthermore, after the deposition, heat treatment may be performed under an atmosphere containing hydrogen in order that the light absorption layer 103a contains a larger amount of hydrogen.

Alternatively, as the light absorption layer 103a, an oxide film from which oxygen is released by heating can be used. In particular, an oxide semiconductor film or an oxide semiconductor film having an impurity state (also referred to as an oxide conductor film) is preferred because they have a narrower band gap and are more likely to absorb light than an insulating film such as a silicon oxide film. In the case where an oxide semiconductor is used for the light absorption layer 103a, the above-described method for forming the semiconductor layer 112 and a material to be described later which can be used for the semiconductor layer can be employed. The oxide film can be formed by a plasma CVD method, a sputtering method, or the like under an atmosphere containing oxygen, for example. In particular, in the case where an oxide semiconductor film is used, a sputtering method under an atmosphere containing oxygen is preferred. Furthermore, after the deposition, heat treatment may be performed under an atmosphere containing oxygen in order that the light absorption layer 103a contains a larger amount of oxygen.

Alternatively, the oxide film that can be used as the light absorption layer 103a may be an oxide insulating film. For example, a silicon oxide film, a silicon oxynitride film, or an aluminum oxide film can be used. For example, such an oxide insulating film is formed under an atmosphere containing oxygen at a low temperature (e.g., lower than or equal to 250° C., preferably lower than or equal to 220° C.), whereby an oxide insulating film containing excess oxygen can be formed. This oxide insulating film can be formed by, for example, a sputtering method or a plasma CVD method.

[Formation of Resin Layer 102]

Figure 13B:
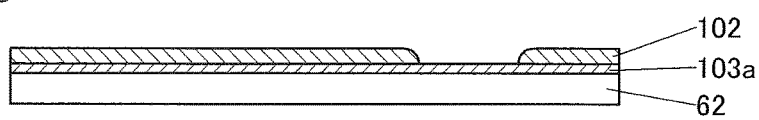

Next, the resin layer 102 having an opening is formed over the light absorption layer 103a (FIG. 13B). The description of the method and the material for forming the resin layer 101 can be referred to for those for forming the resin layer 102 except for the opening of the resin layer 102.

In order to form the resin layer 102, first, a photosensitive material is applied on the light absorption layer 103a to form a thin film, and pre-baking is performed. Next, the material is exposed to light with use of a photomask, and then developed, whereby the resin layer 102 having an opening can be formed. After that, post-baking is performed to sufficiently polymerize the material and remove a gas in the film.

[Formation of Insulating Layer 141]

Figure 13C:
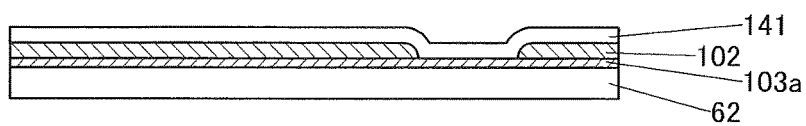

Next, the insulating layer 141 is formed to cover the resin layer 102 and the opening of the resin layer 102 (FIG. 13C). Part of the insulating layer 141 is in contact with the light absorption layer 103a.

[Formation of Light-Blocking Layer and Coloring Layer]

Figure 13D:
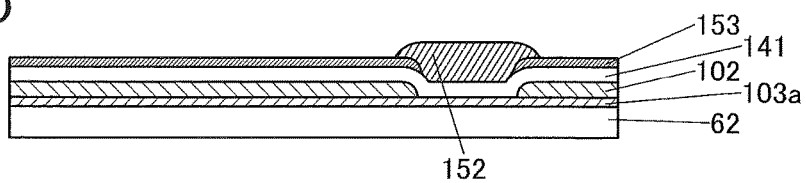

Next, the light-blocking layer 153 and the coloring layer 152 are formed over the insulating layer 141 (FIG. 13D).

[Bonding]

Figure 13E:
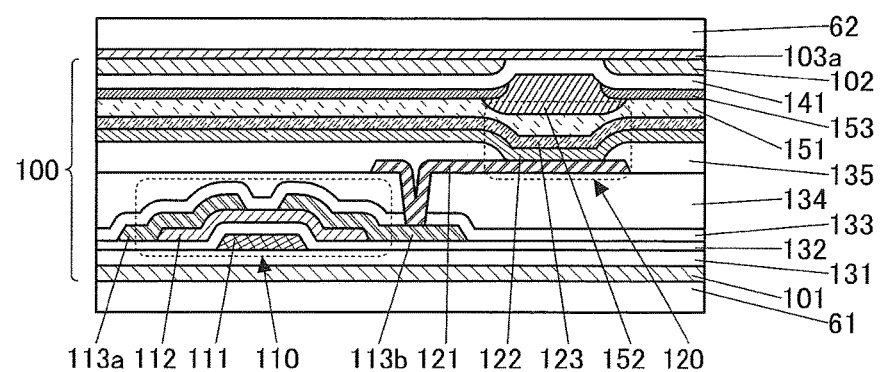

Next, as illustrated in FIG. 13E, the support substrate 61 and the support substrate 62 are bonded to each other with use of the adhesive layer 151. The bonding is performed in such that the opening of the resin layer 102 overlaps with the light-emitting element 120. Then, the adhesive layer 151 is cured. Thus, the light-emitting element 120 can be sealed by the adhesive layer 151.

Through the above steps, the display panel 100 can be fabricated. At the point of FIG. 13E, the display panel 100 is sandwiched by the support substrate 61 and the support substrate 62.

[Formation of Light-Absorbing Layer 103b]

A support substrate 63 is prepared and a light-absorbing layer 103b is formed over the support substrate 63. The description of the support substrate 61 can be referred to for the support substrate 63.

The light-absorbing layer 103b can be formed using a material and a method similar to those of the light-absorbing layer 103a.

[Formation of Resin Layer 201]

Next, the resin layer 201 having an opening is formed over the light-absorbing layer 103b. The description of the method and the material for forming the resin layer 102 can be referred to for those for forming the resin layer 201.

[Formation of Insulating Layer 231]

Figure 14A:
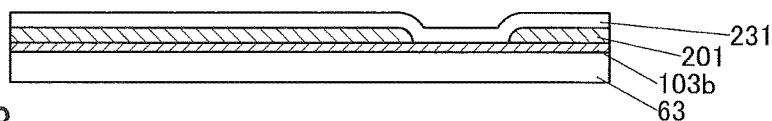
FIGS. 14A to 14F illustrate a method for manufacturing a display device of one embodiment.

Next, the insulating layer 231 is formed to cover the resin layer 201 and the opening of the resin layer 201 (FIG. 14A). The description of the method and the material for forming the insulating layer 131 can be referred to for those for forming the insulating layer 231.

[Formation of Transistor 210]

Figure 14B:
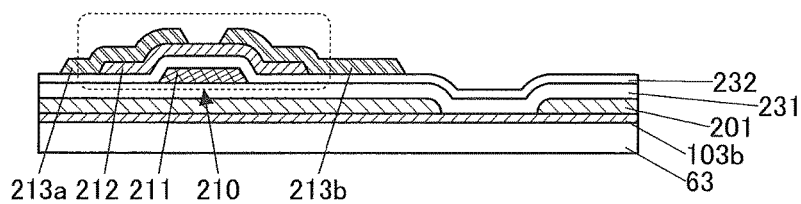
Figure 14C:
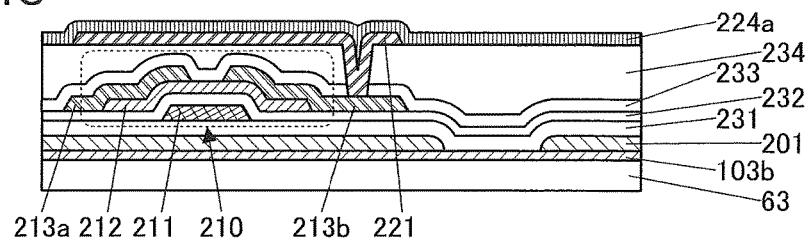

Next, as illustrated in FIG. 14B, the transistor 210 is formed over the insulating layer 231. Then, as illustrated in FIG. 14C, the alignment film 224a is formed over the conductive layer 221 and the insulating layer 234. Through the above steps, the transistor 210, the conductive layer 221, the alignment film 224a, and the like can be formed over the resin layer 201.

[Formation of Light-Absorbing Layer 103c]

A support substrate 64 is prepared and a light-absorbing layer 103c is formed over the support substrate 64.

[Formation of Resin Layer 202]

Next, the resin layer 202 having an opening is formed over the light-absorbing layer 103c.

[Formation of Insulating Layer 204]

Figure 14D:
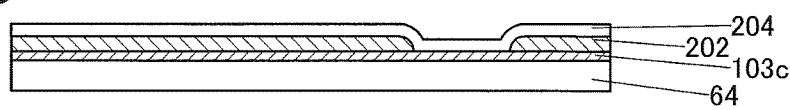

Next, the insulating layer 204 is formed to cover the resin layer 202 and the opening of the resin layer 202 (FIG. 14D).

[Formation of Conductive Layer 223 and Alignment Film 224b]

Figure 14E:
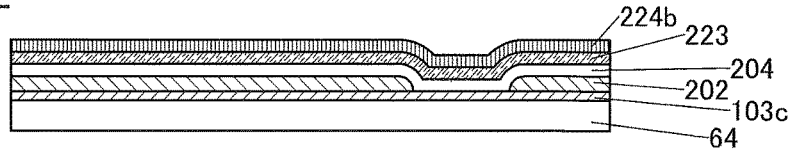

Next, the conductive layer 223 is formed over the insulating layer 204, and the alignment film 224b is formed over the conductive layer 223 (FIG. 14E).

[Bonding]

Figure 14F:
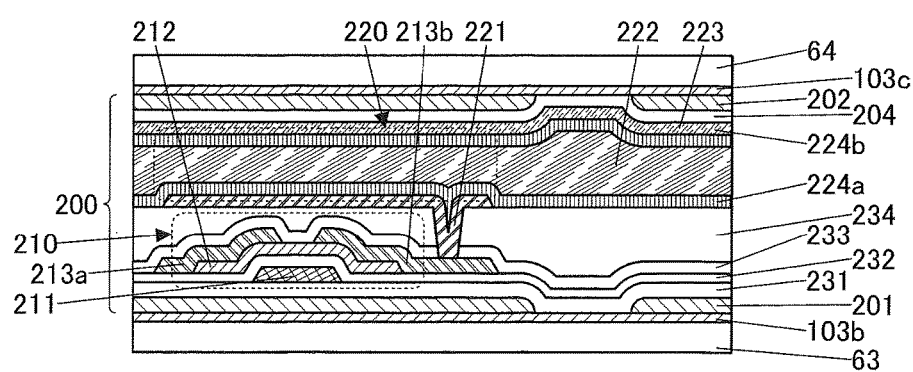

Next, as illustrated in FIG. 14F, the support substrate 63 and the support substrate 64 are bonded to each other with the liquid crystal 222 interposed therebetween. At this time, the support substrates are bonded to each other such that the opening of the resin layer 201 and the opening of the resin layer 202 overlap with each other.

[Separation of Support Substrate 62]

Figure 15A:
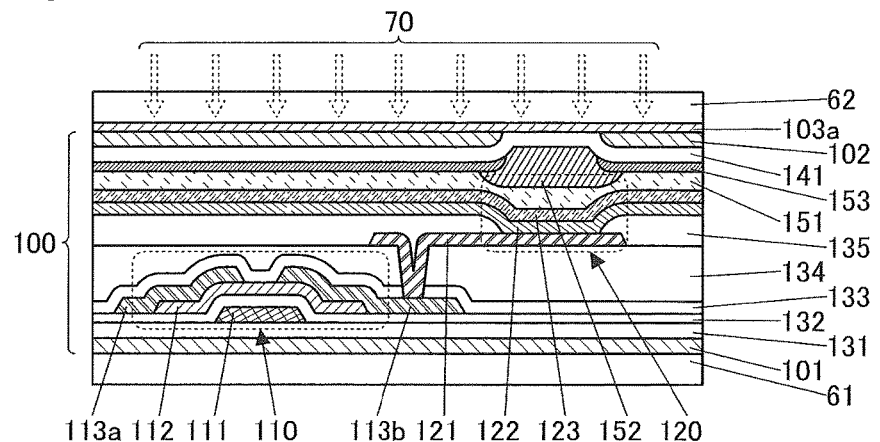
Figure 15A:
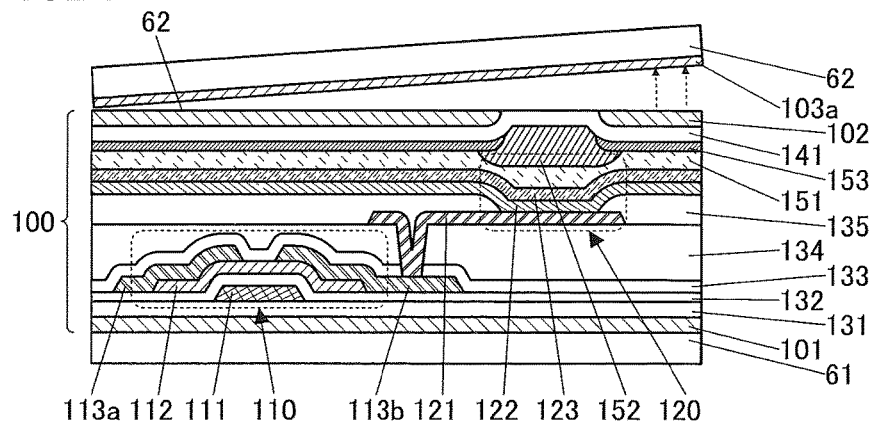
Figure 15A:
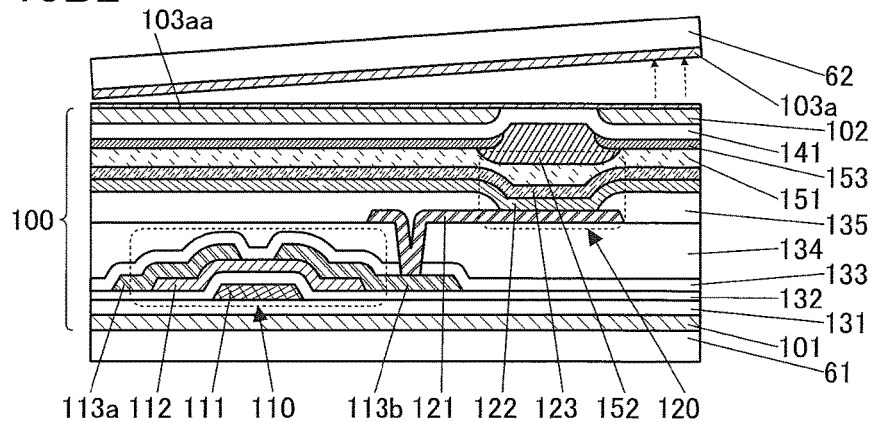

Next, as illustrated in FIG. 15A, the light-absorbing layer 103a is irradiated with the light 70 through the support substrate 62 from the support substrate 62 side of the display panel 100.

As the light 70, light having a wavelength by which at least part of the light 70 is transmitted through the support substrate 62 and absorbed by the light-absorbing layer 103a is selected. Light having a wavelength which is absorbed by the resin layer 102 is preferably used as the light 70. The above description can be referred to for the preferable kinds and wavelengths of the light 70.

By the irradiation with the light 70, the light-absorbing layer 103a is heated and hydrogen, oxygen, or the like is released from the light-absorbing layer 103a. At this time, hydrogen, oxygen, or the like is released in a gaseous state. The released gas remains near the interface between the light-absorbing layer 103a and the resin layer 102 or near the interface between the light-absorbing layer 103a and the support substrate 62; thus, the force of peeling them occurs. Consequently, adhesion between the light-absorbing layer 103a and the resin layer 102 or adhesion between the light-absorbing layer 103a and the support substrate 62 is reduced and a state where peeling is easily performed can be formed.

Part of the gas released from the light-absorbing layer 103a remains in the light-absorbing layer 103a in some cases. Therefore, in some cases, the light-absorbing layer 103a is embrittled and separation is likely to occur inside the light-absorbing layer 103a.

Moreover, in the case where a film releasing oxygen is used as the light-absorbing layer 103a, part of the resin layer 102 is oxidized and embrittled in some cases by oxygen released from the light-absorbing layer 103a. Accordingly, a state where peeling is easily performed can be formed at the interface between the resin layer 102 and the light-absorbing layer 103a.

Also in a region overlapping with the opening of the resin layer 102, adhesion at the interface between the light-absorbing layer 103a and the insulating layer 141 or adhesion at the interface between the light-absorbing layer 103b and the support substrate 62 is reduced and a state where peeling is easily performed is formed for the same reason as above. In some cases, the light-absorbing layer 103b is embrittled and a state where separation is likely to occur.

In contrast, the region not irradiated with the light 70 still has high adhesion.

Here, in the case where an oxide semiconductor film is used for each of the light-absorbing layer 103a and the semiconductor layer 112, light having a wavelength which can be absorbed by the oxide semiconductor film is used as the light 70. However, the light-absorbing layer 103a and the resin layer 102 are stacked above the transistor 110. Furthermore, the resin layer 102 on which heat treatment is performed sufficiently tends to absorb more light than the oxide semiconductor film and can absorb light sufficiently even with a small thickness. Therefore, even when part of the light 70 is not absorbed by the light-absorbing layer 103a and transmitted, the part of the light 70 is absorbed by the resin layer 102 and reaching of the light to the semiconductor layer 112 is suppressed. Consequently, the electrical characteristics of the transistor 110 are hardly changed.

Next, the support substrate 62 and the resin layer 102 are separated (FIG. 15B1).

FIG. 15B1 illustrates an example in which separation occurs at the interface between the light-absorbing layer 103a and the resin layer 102 and the interface between the light-absorbing layer 103a and the insulating layer 141.

FIG. 15B2 illustrates an example in which a light-absorbing layer 103aa which is part of the light-absorbing layer 103a remains on the surfaces of the resin layer 102 and the insulating layer 141. For example, this example corresponds to the case where separation (fracture) occurs inside the light-absorbing layer 103a. In the case where separation occurs at the interface between the light-absorbing layer 103a and the support substrate 62, the light-absorbing layer 103a entirely remains on the surfaces of the resin layer 102 and the insulating layer 141 in some cases.

The light-absorbing layer 103aa (or the light-absorbing layer 103a) is preferably removed when remains in this manner. Although the light-absorbing layer 103aa can be removed by a dry etching method, a wet etching method, a sandblast method, or the like, it is particularly preferable to employ a dry etching method. Note that in removing the light-absorbing layer 103aa, part of the resin layer 102 and part of the insulating layer 141 are thinned by etching in some cases.

In the case where a light-transmitting insulating material is used for the light-absorbing layer 103a, the remaining light-absorbing layer 103aa may be left.

[Separation of Support Substrate 63]

Figure 16A:
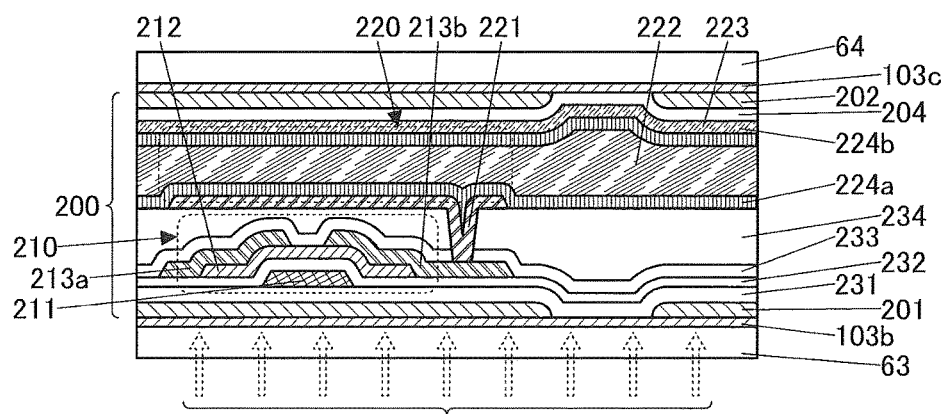
FIGS. 16A and 16B illustrate a method for manufacturing a display device of one embodiment.
Figure 16B:
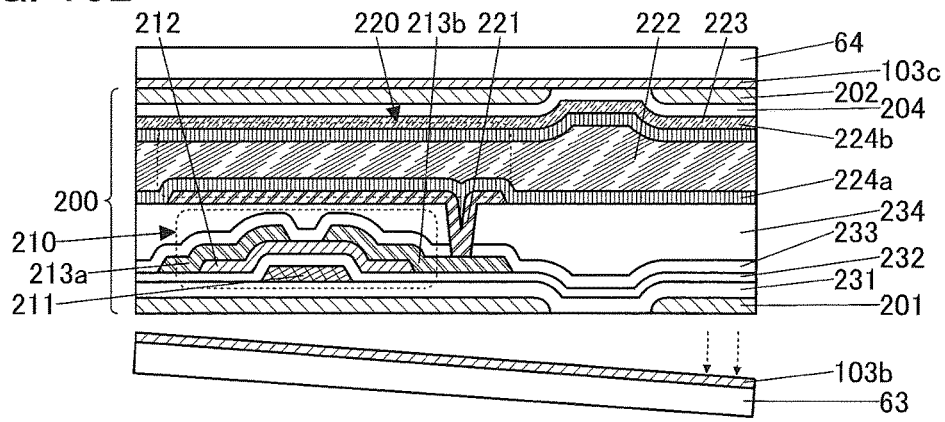

Next, as illustrated in FIG. 16A, the light-absorbing layer 103b is irradiated with the light 70 through the support substrate 63 from the support substrate 63 side of the display panel 200. Next, the support substrate 63 and the resin layer 201 are separated (FIG. 16B). FIG. 16B illustrates an example in which separation occurs at the interface between the light-absorbing layer 103b and the resin layer 201 and the interface between the light-absorbing layer 103b and the insulating layer 231.

[Bonding of Display Panel 100 and Display Panel 200]

Figure 17A:
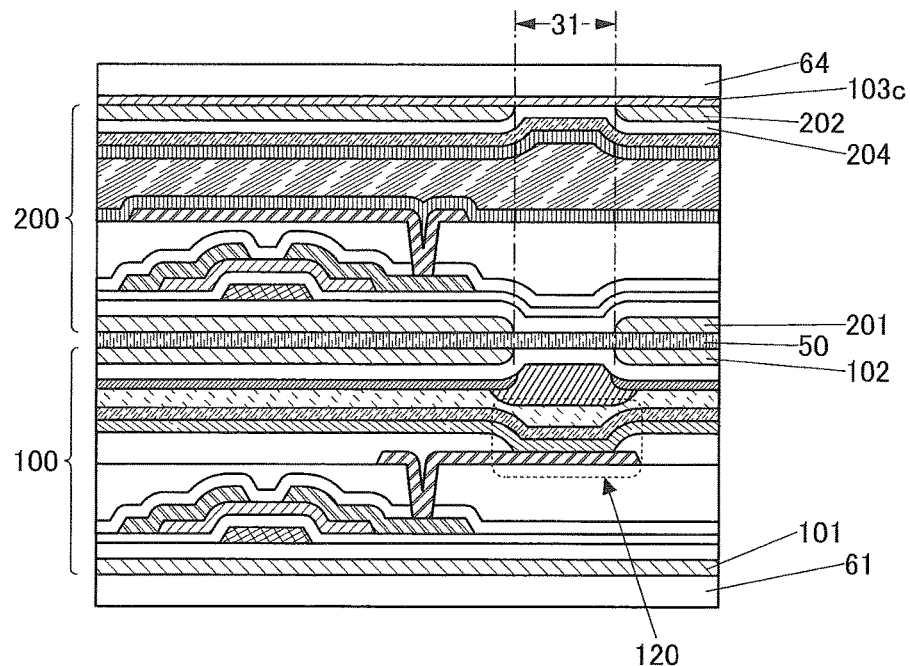
FIGS. 17A and 17B illustrate a method for manufacturing a display device of one embodiment.

Next, as illustrated in FIG. 17A, the resin layer 102 of the display panel 100 and the resin layer 201 of the display panel 200 are bonded to each other with the adhesive layer 50. It is important to bond the display panel 100 and the display panel 200 such that the opening of the resin layer 102, the opening of the resin layer 201, the opening of the resin layer 202, and the light-emitting element 120 overlap with one another.

[Separation of Support Substrate 61]

Next, the resin layer 101 is irradiated with the light 70 (not illustrated) through the support substrate 61 from the support substrate 61 side. By the irradiation with the light 70, the vicinity of the surface of the resin layer 102 on the support substrate 61 side or part of the inside of the resin layer 102 is improved and the adhesion between the support substrate 61 and the resin layer 102 is reduced. After that, as illustrated in FIG. 17B, the support substrate 61 and the resin layer 101 are separated.

Figure 17B:
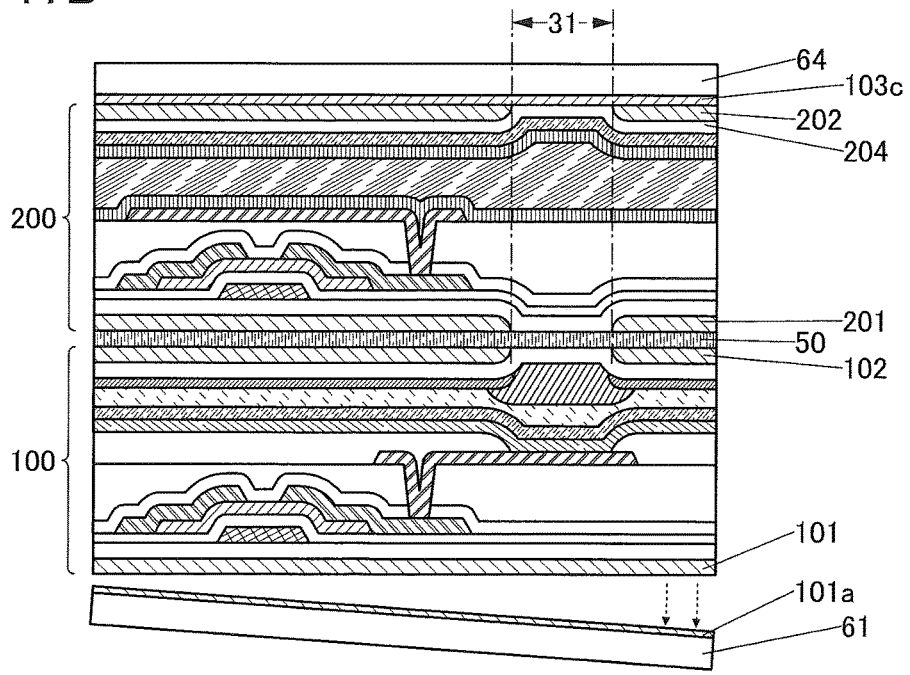

FIG. 17B illustrates an example in which a resin layer 101a which is part of the resin layer 101 remains on the support substrate 61 side. Depending on the condition of the irradiation with the light 70, separation (fracture) occurs inside the resin layer 101 and the resin layer 101a remains in this manner in some cases. Also in the case where part of the surface of the resin layer 101 is melted, part of the resin layer 101a sometimes remains on the support substrate 61 side in a similar manner. In the case where separation is performed at the interface between the support substrate 61 and the resin layer 101, the resin layer 101a sometimes does not remain on the support substrate 61 side.

The thickness of the resin layer 101a remaining on the support substrate 61 side can be less than or equal to 100 nm, specifically approximately greater than or equal to 40 nm and less than or equal to 70 nm. The support substrate 61 can be reused by removing the remaining resin layer 101a. For example, in the case where glass is used for the support substrate 61 and a polyimide resin is used for the resin layer 101, the resin layer 101a can be removed with fuming nitric acid or the like.

[Bonding of Substrate 11]

Figure 18A:
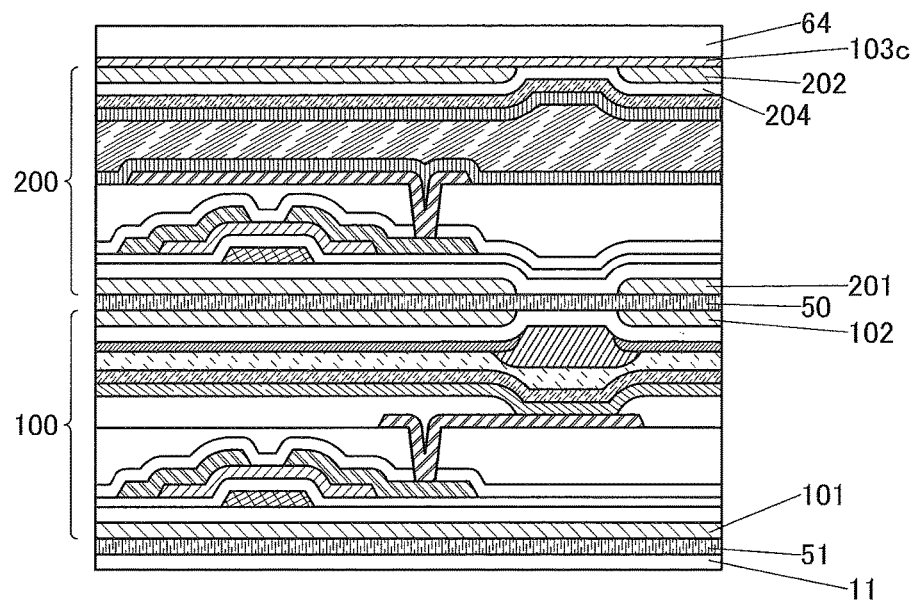
FIGS. 18A and 18B illustrate a method for manufacturing a display device of one embodiment.

Next, as illustrated in FIG. 18A, the resin layer 101 and the substrate 11 are bonded to each other with the adhesive layer 51.

[Separation of Support Substrate 64]

Figure 18B:
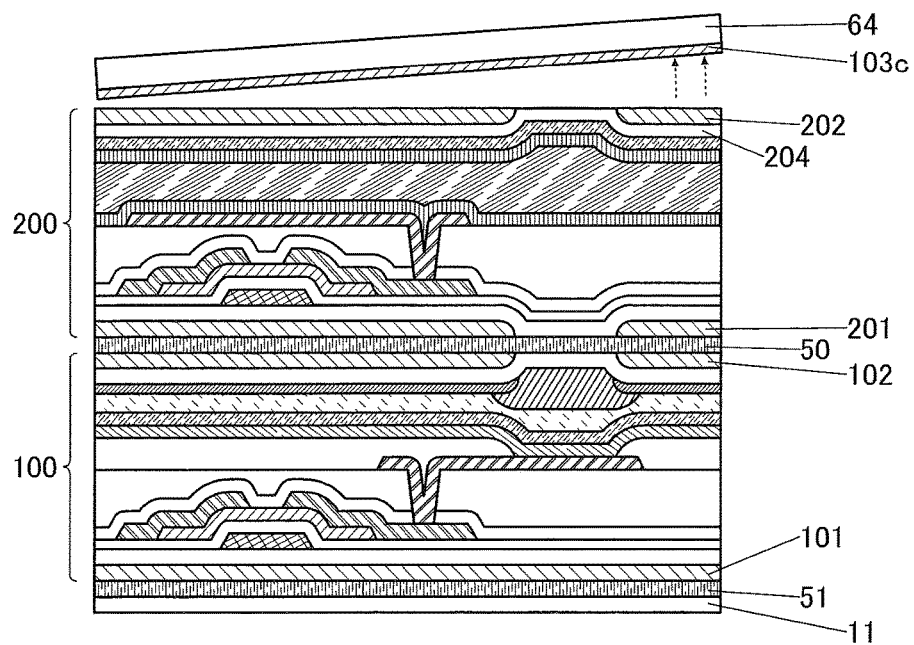

Next, the light-absorbing layer 103c is irradiated with the light 70 (not illustrated) through the support substrate 64 from the support substrate 64 side. After that, as illustrated in FIG. 18B, the support substrate 64 and the resin layer 202 are separated. FIG. 18B illustrates an example in which separation occurs at the interface between the light-absorbing layer 103c and the resin layer 202 and the interface between the light-absorbing layer 103c and the insulating layer 204.

[Bonding of Substrate 12]

Next, the resin layer 202 and the substrate 12 are bonded to each other with the adhesive layer 52.

Through the above steps, the display device 10 illustrated in FIG. 11 can be manufactured.

[Modification Examples of Manufacturing Method 2]

Methods of forming a resin layer having an opening without using a light-absorbing layer will be described below.

Note that although description is made here giving the resin layer 102 of the display panel 100 as an example, a similar method can be used also for the resin layer 201 and the resin layer 202 of the display panel 200.

[Modification Example 1]

Figure 19A:
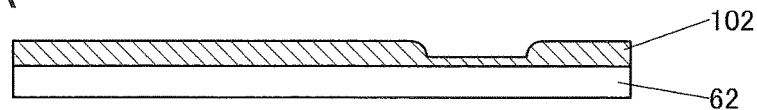
FIGS. 19A to 19E illustrate a method for manufacturing a display device of one embodiment.

First, as illustrated in FIG. 19A, the resin layer 102 having a depressed portion is formed.

First, a material to be the resin layer 102 is applied on the support substrate 62, and pre-baking treatment is performed. Subsequently, light exposure is performed using a photomask. At this time, the depressed portion can be formed in the resin layer 102 by setting the amount of light exposure smaller than the amount of light exposure for forming an opening in the resin layer 102. For example, as a method for reducing the amount of light exposure, light exposure may be performed for a short period of time, intensity of the exposure light may be reduced, a focus of the exposure light may be changed, or the resin layer 102 may be formed thick, as compared with the light exposure conditions for forming an opening in the resin layer 102.

In order to form both the opening and the depressed portion in the resin layer 102, an exposure technique using a half-tone mask or a gray-tone mask or a multiple exposure technique using two or more photomasks may be used.

After being subjected to the light exposure in this manner, the resin layer 102 having the depressed portion can be formed by being subjected to development treatment. After that, post-baking treatment is performed.

Figure 19B:
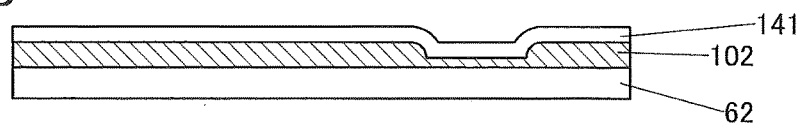

Next, as illustrated in FIG. 19B, the insulating layer 141 is formed to cover the top surface and the depressed portion of the resin layer 102.

Figure 19C:
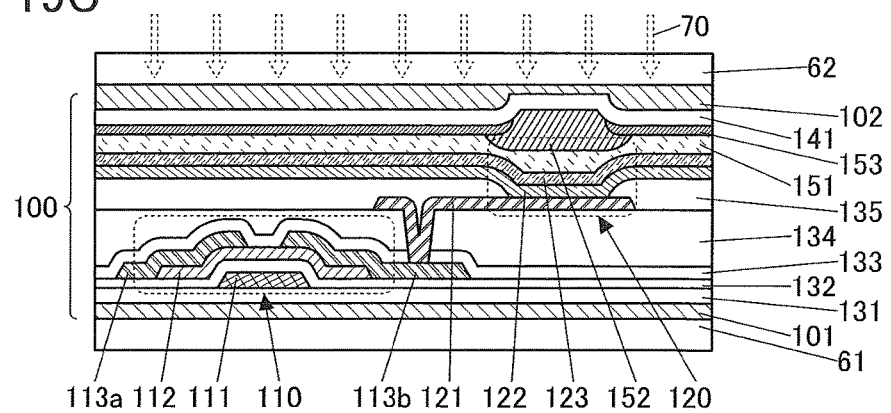

FIG. 19C is a cross-sectional view illustrating a step of performing irradiation with the light 70 after the support substrate 61 and the support substrate 62 are bonded to each other. Adhesion between the resin layer 102 and the support substrate 62 is reduced by the irradiation with the light 70.

Figure 19D:
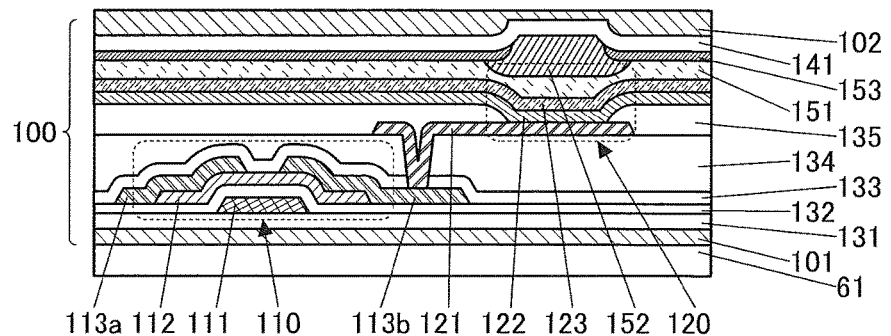

FIG. 19D is a schematic cross-sectional view in the state after peeling of the support substrate 62.

Figure 19E:
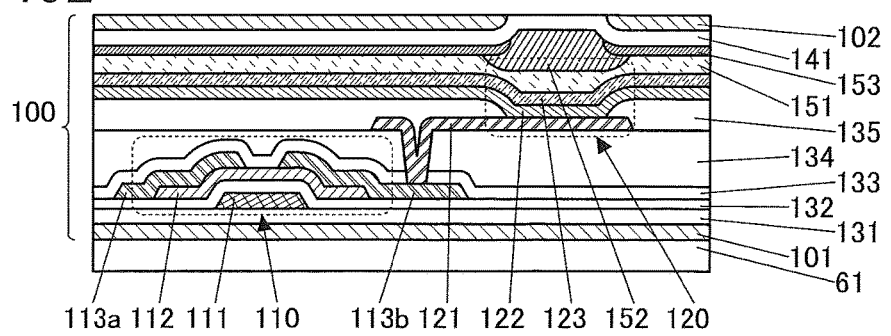

After that, as illustrated in FIG. 19E, the resin layer 102 having an opening can be formed in such a manner that part of the display side of the resin layer 102 is etched to expose the surface of the insulating layer 141. For example, plasma treatment (ashing treatment) under an atmosphere containing oxygen is preferably used for the etching, in which case controllability can be improved and etching can be performed uniformly.

Note that the resin layer 102 may be left as illustrated in FIG. 19D without being etched. Even with this structure, light absorption can be suppressed and light extraction efficiency can be increased because a portion of the resin layer 102 located in the path of light from the light-emitting element 120 is thinner than the other portion.

[Modification Example 2]

Figure 20A:
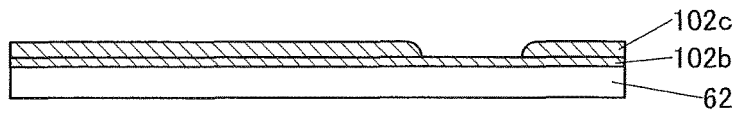
FIGS. 20A to 20D illustrate a method for manufacturing a display device of one embodiment.

First, as illustrated in FIG. 20A, a resin layer 102b and a resin layer 102c having an opening are stacked over the support substrate 62.

The resin layer 102b can be formed in a manner similar to that of the resin layer 101. The resin layer 102c can be formed in a manner similar to that of the resin layer 102, the resin layer 201, or the like.

Here, it is preferable to sufficiently perform heat treatment on the resin layer 102b formed first and perform polymerization. Accordingly, even in the case where the same material is used for the resin layer 102b and the resin layer 102c, dissolution of the resin layer 102b in a solvent contained in a material to be the resin layer 102c formed later can be suppressed when the material is applied.

Figure 20B:
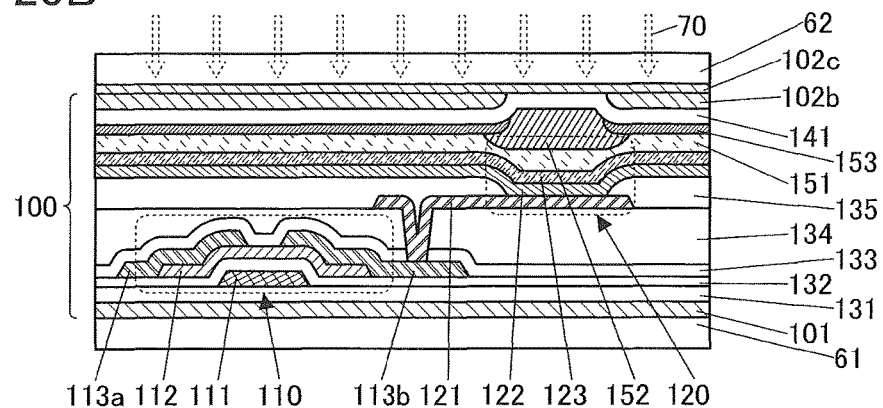

FIG. 20B is a cross-sectional view illustrating a step of performing irradiation with the light 70 after the support substrate 61 and the support substrate 62 are bonded to each other. Adhesion between the resin layer 102c and the support substrate 62 is reduced by the irradiation with the light 70.

Figure 20C:
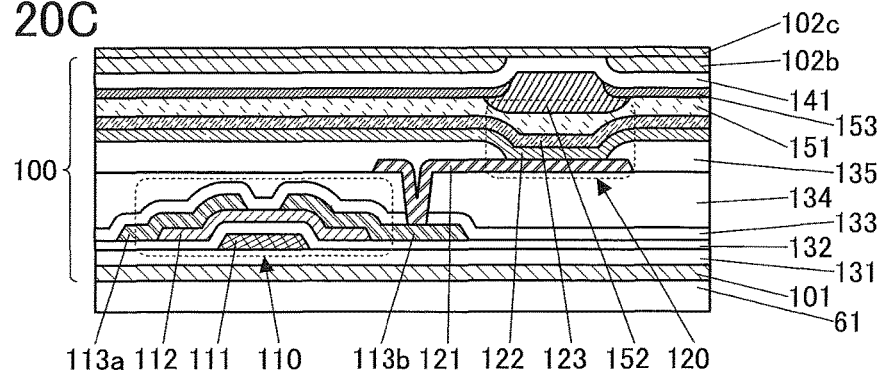

FIG. 20C is a schematic cross-sectional view in the state after peeling of the support substrate 62.

Figure 20D:
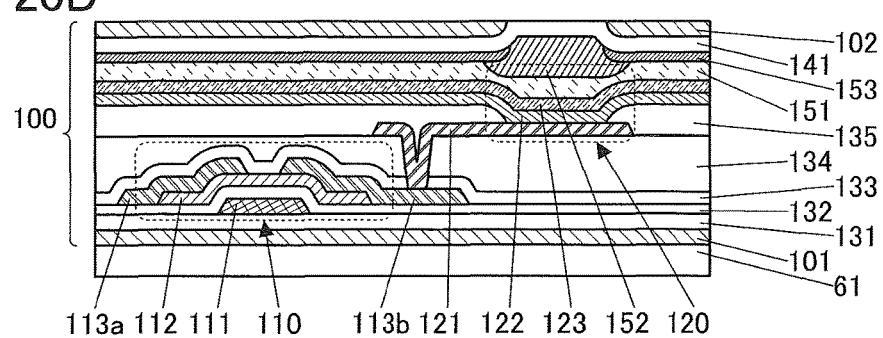

After that, as illustrated in FIG. 20D, the resin layer 102 having an opening can be formed in such a manner that the resin layer 102c is etched to expose the surface of the insulating layer 141. For example, plasma treatment (ashing treatment) under an atmosphere containing oxygen is preferably used for the etching, in which case controllability can be improved and etching can be performed uniformly.

Note that when the same material is used for the resin layer 102b and the resin layer 102c, productivity can be improved because the same material and the same manufacturing apparatus can be used. When different materials are used for these resin layers, flexibility of processing conditions can be increased because the etching selectivity ratio of the resin layer 102b with respect to the resin layer 102c or the etching selectivity ratio of the resin layer 102c to the resin layer 102b can be made high.

Note that the resin layer 102b may be left as illustrated in FIG. 20C without being etched. Even with this structure, light absorption can be suppressed and light extraction efficiency can be increased because a portion of the resin layer 102 located in the path of light from the light-emitting element 120 is thinner than the other portion.

The above is the description of the modification examples of the manufacturing method example 2.

[Modification Example of Structure Example 2]

Figure 21:
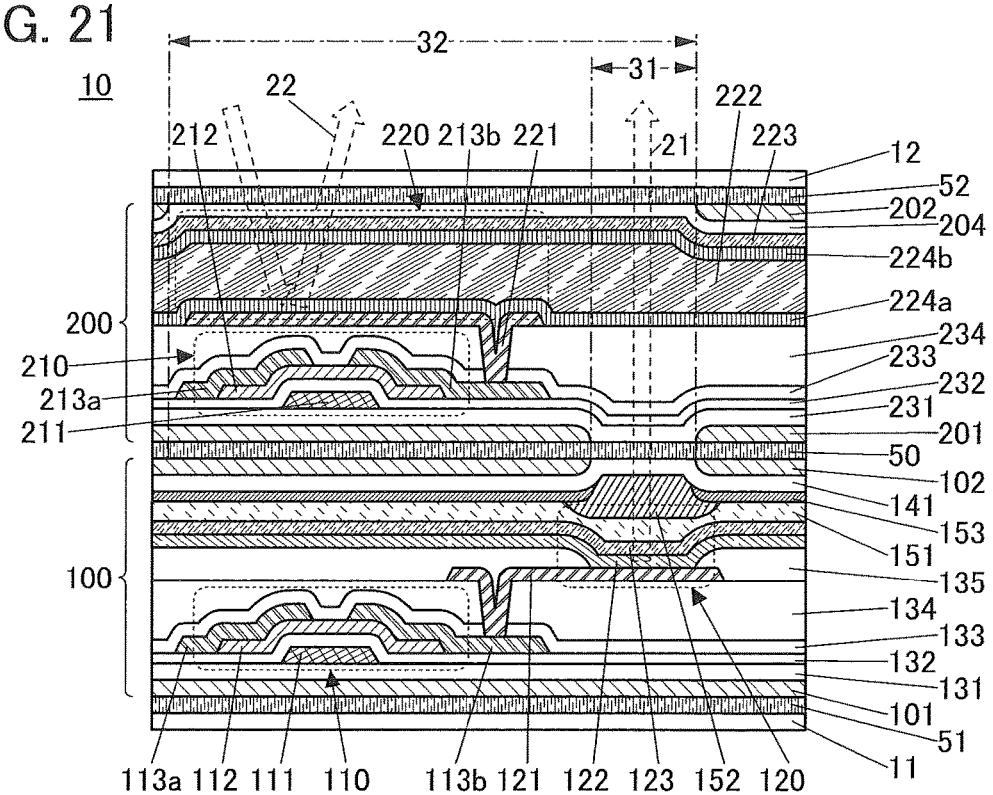
FIG. 21 illustrates a structure example of a display device of one embodiment.

A structure example that is partly different from the structure example illustrated in FIG. 11 will be described below. FIG. 21 illustrates a structure example of a display device described below.

In FIG. 11, the opening is provided in a portion of the resin layer that is located in the path of light from the light-emitting element 120; however, an opening may be provided also in a portion of the resin layer that is located in the path of light of the reflective liquid crystal element 220.

FIG. 21 illustrates an example in which a region 32 is included in addition to the region 31. The region 32 overlaps with the opening of the resin layer 202 and the liquid crystal element 220.

In the example illustrated in FIG. 21, the resin layer 202 is provided with one opening which includes an opening overlapping with the light-emitting element 120 and an opening overlapping with the liquid crystal element 220. Alternatively, the opening overlapping with the light-emitting element 120 and the opening overlapping with the liquid crystal element 220 may be separately provided.

The above is the description of a modification example of Structure example 2.

At least part of this embodiment can be implemented in appropriate combination with any of the other embodiments described in this specification.

Embodiment 2

In this embodiment, a specific example of a display device of one embodiment of the present invention will be described. A display device described below includes both a reflective liquid crystal element and a light-emitting element. The display device can perform display in a transmission mode and in a reflection mode.

[Structure Example]

Figure 22A:
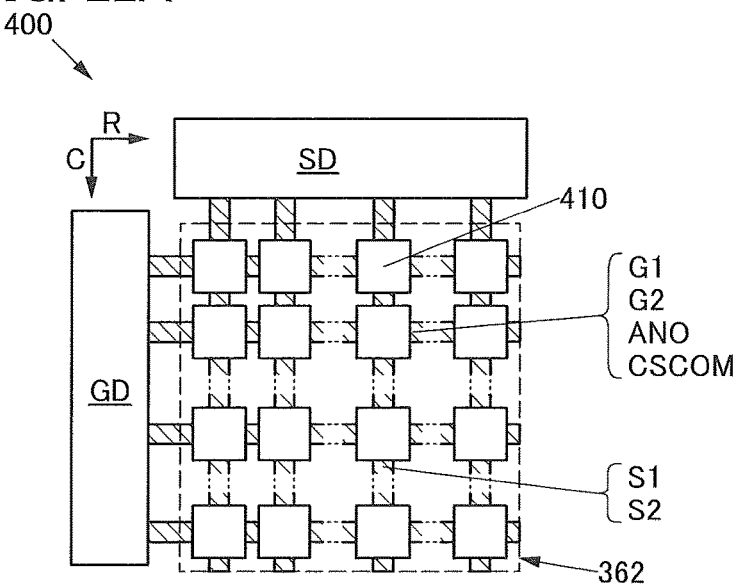
Figure 22A:
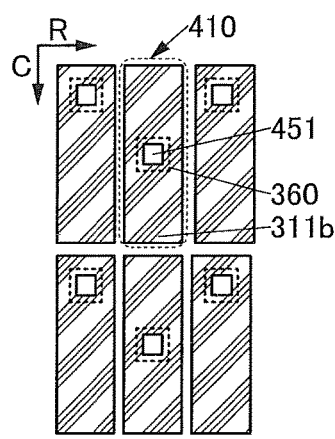
Figure 22A:
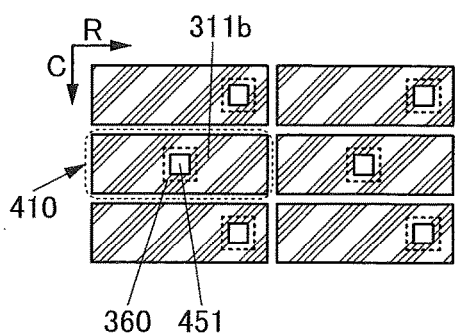

FIG. 22A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes the plurality of pixels 410 arranged in a direction C, and a plurality of wirings S1 and a plurality of wirings S2, which are electrically connected to the circuit SD.

Although the configuration including one circuit GD and one circuit SD is illustrated here for simplicity, the circuit GD and the circuit SD for driving the liquid crystal element and those for driving the light-emitting element may be provided separately.

The pixel 410 includes a reflective liquid crystal element and a light-emitting element. In the pixel 410, the liquid crystal element and the light-emitting element partly overlap with each other.

FIG. 22B1 illustrates a structure example of an electrode 311b included in the pixel 410. The electrode 311b serves as a reflective electrode of the liquid crystal element in the pixel 410. The electrode 311b includes an opening 451.

In FIG. 22B1, a light-emitting element 360 in a region overlapping with the electrode 311b is shown by a dashed line. The light-emitting element 360 overlaps with the opening 451 included in the electrode 311b. Thus, light from the light-emitting element 360 is emitted to the display surface side through the opening 451.

In FIG. 22B1, the pixels 410 adjacent in the direction R correspond to different emission colors. As illustrated in FIG. 22B1, the plurality of openings 451 are preferably provided in different positions in the electrodes 311b so as not to be aligned in one line in the plurality of pixels aligned in the direction R. This allows the two light-emitting elements 360 to be apart from each other, thereby preventing light emitted from the light-emitting element 360 from entering a coloring layer in the adjacent pixel 410 (such a phenomenon is also referred to as "crosstalk"). Furthermore, since the two adjacent light-emitting elements 360 can be arranged apart from each other, a high-resolution display device can be obtained even when EL layers of the light-emitting elements 360 are separately formed with a shadow mask or the like.

Alternatively, arrangement illustrated in FIG. 22B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the electrode 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel that emits light of the same color, in which case crosstalk can be suppressed.

[Circuit Configuration Example]

Figure 23:
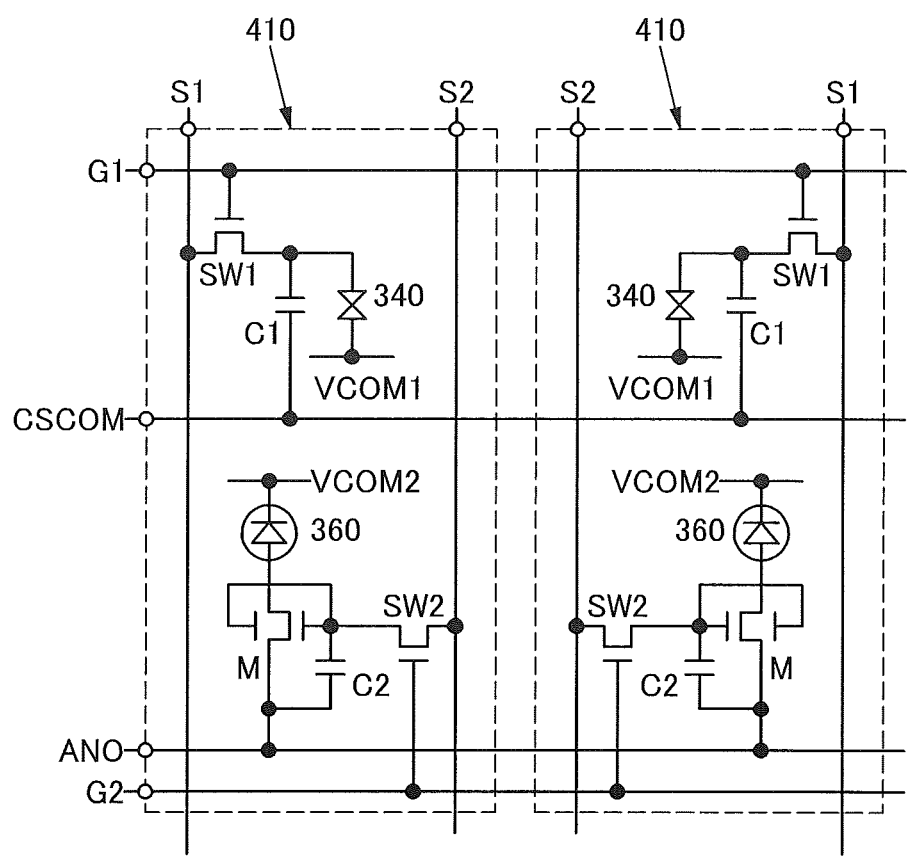
FIG. 23 is a circuit diagram of a display device of one embodiment.

FIG. 23 is a circuit diagram illustrating a configuration example of the pixel 410. FIG. 23 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 23 also illustrates a wiring VCOM1 electrically connected to the liquid crystal element 340 and a wiring VCOM2 electrically connected to the light-emitting element 360.

FIG. 23 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 23 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of a liquid crystal of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 23, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 24A:
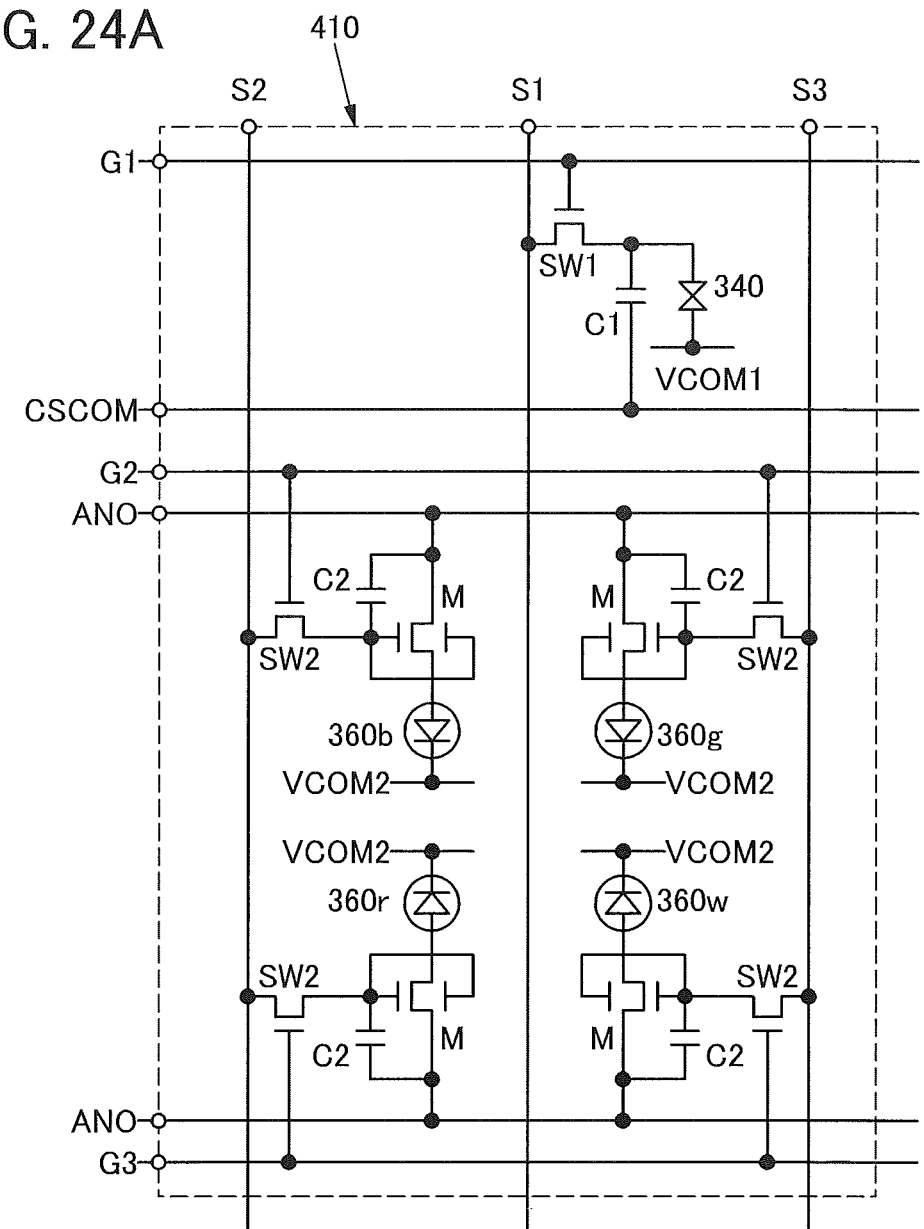
FIGS. 24A and 24B are a circuit diagram of a display device and a top view of a pixel of one embodiment.

Although FIG. 23 illustrates the example in which one pixel 410 includes one liquid crystal element 340 and one light-emitting element 360, one embodiment of the present invention is not limited to this example. FIG. 24A illustrates an example in which one pixel 410 includes one liquid crystal element 340 and four light-emitting elements 360 (light-emitting elements 360r, 360g, 360b, and 360w). The pixel 410 illustrated in FIG. 24A differs from that in FIG. 23 in being capable of performing full-color display by one pixel.

In addition to the example in FIG. 23, a wiring G3 and a wiring S3 are connected to the pixel 410 in FIG. 24A.

In the example illustrated in FIG. 24A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectance in the reflective mode. This also enables display with excellent color-rendering properties and low power consumption in the transmissive mode.

Figure 24B:
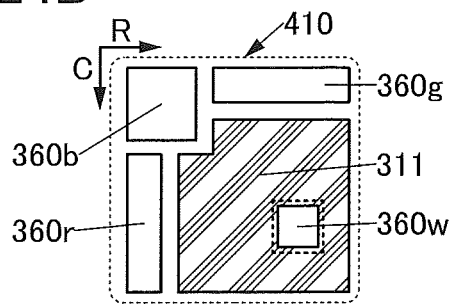

FIG. 24B illustrates a configuration example of the pixel 410. The pixel 410 includes the light-emitting element 360w which overlaps with the opening in the electrode 311 and the light-emitting elements 360r, 360g, and 360b which are located near the electrode 311. It is preferable that the light-emitting elements 360r, 360g, and 360b have substantially the same light-emitting area.

[Structure Example Of Display Device]

Figure 25:
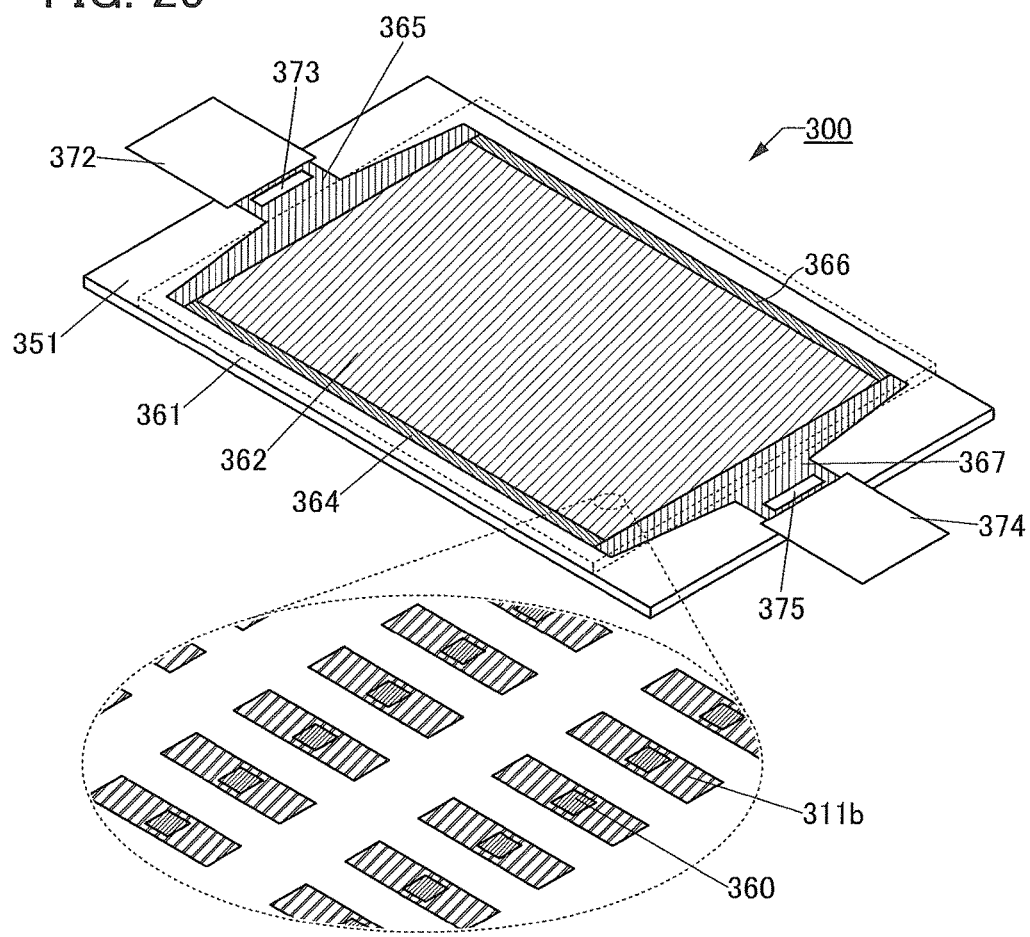
FIG. 25 illustrates a structure example of a display panel of one embodiment.

FIG. 25 is a schematic perspective view illustrating a display device 300 of one embodiment of the present invention. In the display device 300, a substrate 351 and a substrate 361 are bonded to each other. In FIG. 25, the substrate 361 is shown by a dashed line.

The display device 300 includes a display portion 362, a circuit portion 364, a wiring 365, a circuit portion 366, a wiring 367, and the like. The substrate 351 is provided with the circuit portion 364, the wiring 365, the circuit portion 366, the wiring 367, the electrode 311*b* functioning as a pixel electrode, and the like. In FIG. 25, an IC 373, an FPC 372, an IC 375, and an FPC 374 are mounted on the substrate 351. Thus, the structure illustrated in FIG. 25 can be referred to as a display module including the display device 300, the IC 373, the FPC 372, the IC 375, and the FPC 374.

For the circuit portion 364, a circuit functioning as a scan line driver circuit can be used, for example.

The wiring 365 has a function of supplying signals and electric power to the display portion and the circuit portion 364. The signals and electric power are input to the wiring 365 from the outside through the FPC 372 or from the IC 373.

FIG. 25 shows an example in which the IC 373 is provided on the substrate 351 by a chip on glass (COG) method or the like. As the IC 373, an IC functioning as a scan line driver circuit, a signal line driver circuit, or the like can be used. Note that it is possible that the IC 373 is not provided, for example, when the display device 300 includes circuits functioning as a scan line driver circuit and a signal line driver circuit and when the circuits functioning as a scan line driver circuit and a signal line driver circuit are provided outside and signals for driving the display device 300 are input through the FPC 372. Alternatively, the IC 373 may be mounted on the FPC 372 by a chip on film (COF) method or the like.

FIG. 25 is an enlarged view of part of the display portion 362. Electrodes 311*b* included in a plurality of display elements are arranged in a matrix in the display portion 362. The electrode 311*b* has a function of reflecting visible light and serves as a reflective electrode of the liquid crystal element 340 described later.

As illustrated in FIG. 25, the electrode 311*b* has an opening. The light-emitting element 360 is positioned closer to the substrate 351 than the electrode 311*b* is. Light is emitted from the light-emitting element 360 to the substrate 361 side through the opening in the electrode 311*b*.

[Cross-Sectional Structure Examples]

Figure 26:
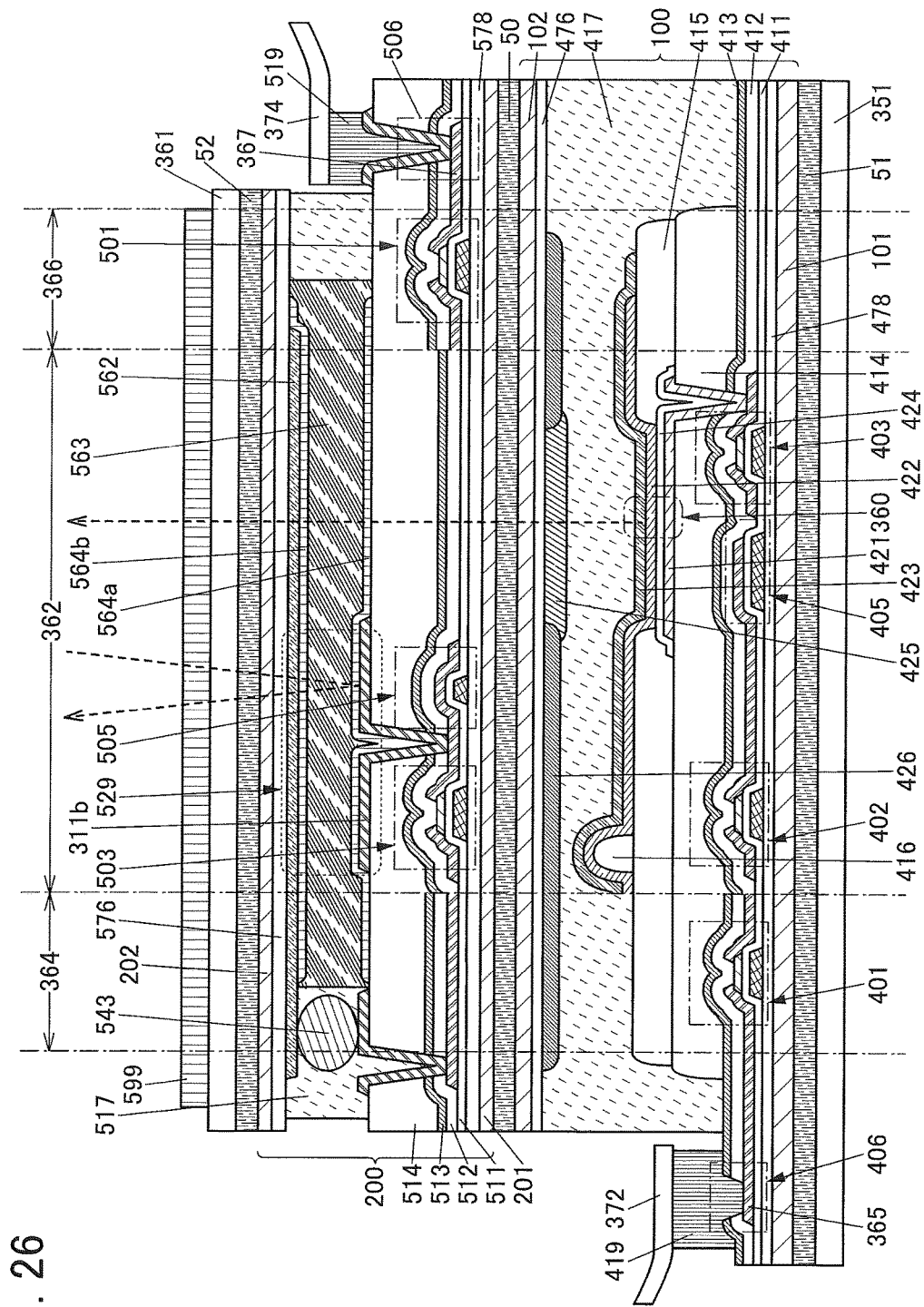
FIG. 26 illustrates a structure example of a display device of one embodiment.

FIG. 26 illustrates an example of cross sections of part of a region including the FPC 372, part of a region including the circuit portion 364, part of a region including the display portion 362, part of a region including the circuit portion 366, and part of a region including the FPC 374 of the display device illustrated in FIG. 25.

The display device illustrated in FIG. 26 includes a structure in which the display panels 100 and 200 are stacked. The display panel 100 includes the resin layers 101 and 102. The display panel 200 includes the resin layers 201 and 202. The resin layers 102 and 201 are bonded to each other with the adhesive layer 50. The resin layer 101 is bonded to the substrate 351 with the adhesive layer 51. The resin layer 202 is bonded to the substrate 361 with the adhesive layer 52.

[Display Panel 100]

The display panel 100 includes the resin layer 101, an insulating layer 478, a plurality of transistors, a capacitor 405, a wiring 365, an insulating layer 411, an insulating layer 412, an insulating layer 413, an insulating layer 414, an insulating layer 415, the light-emitting element 360, a spacer 416, an adhesive layer 417, a coloring layer 425, a light-blocking layer 426, an insulating layer 476, and the resin layer 102.

The circuit portion 364 includes a transistor 401. The display portion 362 includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 26 have bottom-gate structures. The transistor structures may be different between the circuit portion 364 and the display portion 362. The circuit portion 364 and the display portion 362 may each include a plurality of kinds of transistors.

The capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. There is no particular limitation on the number of the insulating layers covering the transistors and the like. The insulating layer 414 functions as a planarization layer. It is preferred that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In the case of using an organic material for the insulating layer 414, impurities such as moisture might enter the light-emitting element 360 or the like from the outside of the display device through the insulating layer 414 exposed at an end portion of the display device. Deterioration of the light-emitting element 360 due to the entry of impurities can lead to deterioration of the display device. For this reason, the insulating layer 414 is preferably not positioned at the end portion of the display device, as illustrated in FIG. 26. Since an insulating layer formed using an organic material is not positioned at the end portion of the display device in the structure of FIG. 26, entry of impurities into the light-emitting element 360 can be inhibited.

The light-emitting element 360 includes an electrode 421, an EL layer 422, and an electrode 423. The light-emitting element 360 may include an optical adjustment layer 424. The light-emitting element 360 has a top-emission structure with which light is emitted to the coloring layer 425 side.

The transistors, the capacitor, the wiring, and the like are positioned so as to overlap with a light-emitting region of the light-emitting element 360; accordingly, the aperture ratio of the display portion 362 can be increased.

One of the electrode 421 and the electrode 423 functions as an anode and the other functions as a cathode. When a voltage higher than the threshold voltage of the light-emitting element 360 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 360. Two adjacent electrodes 421 are electrically insulated from each other by the insulating layer 415.

The EL layer 422 contains a light-emitting substance.

The electrode 423 functioning as a common electrode is shared by a plurality of light-emitting elements 360. A fixed potential is supplied to the electrode 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 26 illustrates the case where a space is provided between the electrode 423 and the light-blocking layer 426, the electrode 423 and the light-blocking layer 426 may be in contact with each other. Although the spacer 416 is provided on the substrate 351 side in the structure illustrated in FIG. 26, the spacer 416 may be provided on the substrate 361 side (e.g., in a position closer to the substrate 361 than that of the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362, such as the circuit portion 364, in which case undesired leakage of guided light or the like can be inhibited.

The insulating layer 478 is formed on a surface of the resin layer 101. The insulating layer 476 is formed on a surface of the resin layer 102. The insulating layer 476 and the insulating layer 478 are preferably highly resistant to moisture. The light-emitting element 360, the transistors, and the like are preferably provided between a pair of insulating layers which are highly resistant to moisture, in which case impurities such as water can be prevented from entering these elements, leading an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

A connection portion 406 includes the wiring 365. The wiring 365 can be formed using the same material and the same process as those of the sources and the drains of the transistors. The connection portion 406 is electrically connected to an external input terminal through which a signal and a potential from the outside is transmitted to the circuit portion 364. Here, an example in which the FPC 372 is provided as the external input terminal is described. The FPC 372 is electrically connected to the connection portion 406 through a connection layer 419.

The connection layer 419 can be found using any of various kinds of anisotropic conductive films (ACF), anisotropic conductive pastes (ACP), and the like.

The above is the description of the display panel 100.

[Display Panel 200]

The display panel 200 is a reflective liquid crystal display device employing a vertical electric field mode.

The display panel 200 includes the resin layer 201, an insulating layer 578, a plurality of transistors, a capacitor 505, a wiring 367, an insulating layer 511, an insulating layer 512, an insulating layer 513, an insulating layer 514, a liquid crystal element 529, an alignment film 564a, an alignment film 564b, an adhesive layer 517, an insulating layer 576, and the resin layer 202.

The resin layers 201 and 202 are bonded to each other with the adhesive layer 517. Liquid crystal 563 is sealed in a region surrounded by the resin layer 201, the resin layer 202, and the adhesive layer 517. The polarizing plate 599 is positioned on an outer surface of the substrate 361.

The liquid crystal element 529 includes the electrode 311b, an electrode 562, and the liquid crystal 563. The electrode 311b functions as a pixel electrode. The electrode 562 functions as a common electrode. Alignment of the liquid crystal 563 can be controlled with an electric field generated between the electrode 311b and the electrode 562. The alignment film 564a is provided between the liquid crystal 563 and the electrode 311b. The alignment film 564b is provided between the liquid crystal 563 and the electrode 562.

The resin layer 202 is provided with the insulating layer 576, the electrode 562, the alignment film 564b, and the like.

The resin layer 201 is provided with the electrode 311b, the alignment film 564a, the transistor 501, the transistor 503, the capacitor 505, the connection portion 506, the wiring 367, and the like.

Insulating layers such as the insulating layer 511, the insulating layer 512, the insulating layer 513, and the insulating layer 514 are provided over the resin layer 201.

Note that a portion of the conductive layer functioning as the source or the drain of the transistor 503 which is not electrically connected to the electrode 311b may function as part of a signal line. The conductive layer functioning as the gate of the transistor 503 may function as part of a scan line.

FIG. 26 illustrates a structure without a coloring layer as an example of the display portion 362. Thus, the liquid crystal element 529 is an element that performs monochrome display.

FIG. 26 illustrates an example of the circuit portion 366 in which the transistor 501 is provided.

A material inhibiting diffusion of impurities such as water and hydrogen is preferably used for at least one of the insulating layers 512 and 513 which cover the transistors.

The electrode 311b is provided over the insulating layer 514. The electrode 311b is electrically connected to one of a source and a drain of the transistor 503 through an opening formed in the insulating layer 514, the insulating layer 513, the insulating layer 512, and the like. The electrode 311b is electrically connected to one electrode of the capacitor 505.

Since the display panel 200 is a reflective liquid crystal display device, a conductive material that reflects visible light is used for the electrode 311b and a conductive material that transmits visible light is used for the electrode 562.

For example, a material containing one or more of indium (In), zinc (Zn), and tin (Sn) is preferably used as the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Examples of the conductive material that reflects visible light include aluminum, silver, and an alloy including any of these metal materials. A metal material such as gold, platinum, tungsten, chromium, molybdenum, iron, cobalt, copper, or palladium, or an alloy including any of these metal materials can also be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (also referred to as Ag—Pd—Cu or APC), or an alloy of silver and magnesium may be used.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 529 are controlled depending on the kind of the polarizing plate 599 so that desirable contrast is obtained.

The electrode 562 is electrically connected to a conductive layer on the resin layer 201 side through a connector 543 in a portion close to an end portion of the resin layer 202. Thus, a potential or a signal can be supplied from the FPC 374, an IC, or the like placed on the resin layer 201 side to the electrode 562.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 26, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

The connection portion 506 is provided in a region near an end portion of the resin layer 201. The connection portion 506 is electrically connected to the FPC 374 through the connection layer 519. In the example of the structure illustrated in FIG. 26, the connection portion 506 is formed by stacking part of the wiring 367 and a conductive layer that is obtained by processing the same conductive film as the electrode 311b.

The above is the description of the display panel 200.

[Components]

The above components will be described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 μm and less than or equal to 400 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

As the semiconductor material used for the transistor, an oxide semiconductor can be used. Typically, an oxide semiconductor containing indium can be used.

In particular, a semiconductor material having a wider band gap and a lower carrier density than silicon is preferably used because off-state current of the transistor can be reduced.

In a transistor with an oxide semiconductor whose band gap is larger than the band gap of silicon, charges stored in a capacitor that is connected in series to the transistor can be held for a long time, owing to the low off-state current of the transistor. When such a transistor is used for a pixel, operation of a driver circuit can be stopped while a gray scale of each pixel is maintained As a result, a display device with extremely low power consumption is obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

As examples of the stabilizer, in addition to the above metals that can be used as M, lanthanoid such as praseodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor included in the semiconductor layer is 2 eV or more, preferably 2.5 eV or more, and more preferably 3 eV or more. The use of such an oxide semiconductor having a wide energy gap leads to a reduction in off-state current of a transistor.

In the case where the oxide semiconductor contained in the semiconductor layer is an In-M-Zn-based oxide, it is preferable that the atomic ratio of metal elements of a sputtering target used to deposit a film of the In-M-Zn oxide satisfy In≥M and Zn≥M. The atomic ratio of metal elements in such a sputtering target is preferably, for example, In:M: Zn=1:1:1, In:M:Zn=1:1:1.2, In:M:Zn=3:1:2, In:M:Zn=4:2: 3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

[Conductive Layer]

As materials for the gates, the source, and the drain of a transistor, and the conductive layers serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive layer. For example, a layered film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

As an insulating material that can be used for the insulating layers, polyimide, acrylic, epoxy, a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], still more preferably lower than or equal to $1\times10^{-8}$ [g/(m$^2$·day)].

[Display Element]

As a display element included in the first pixel located on the display surface side, an element which performs display by reflecting external light can be used. Such an element does not include a light source and thus power consumption in display can be significantly reduced. As the display element included in the first pixel, a reflective liquid crystal element can typically be used. Alternatively, as the first display element, an element using a microcapsule method, an electrophoretic method, an electrowetting method, an Electronic Liquid Powder (registered trademark) method, or the like can be used, other than a micro electro mechanical systems (MEMS) shutter element or an optical interference type MEMS element.

As a display element included in the second pixel located on the side opposite to the display surface side, an element which includes a light source and performs display using light from the light source can be used. Since the luminance and the chromaticity of light emitted from such a pixel are not affected by external light, an image with high color reproducibility (a wide color gamut) and a high contrast, i.e., a clear image can be displayed. As the display element included in the second pixel, a self-luminous light-emitting element such as an organic light-emitting diode (OLED), a light-emitting diode (LED), and a quantum-dot light-emitting diode (QLED) can be used. Alternatively, a combination of a backlight as a light source and a transmissive liquid crystal element which controls the amount of transmitted light emitted from a backlight may be used as the display element included in the second pixel.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, a guest-host mode, or the like can be used.

The liquid crystal element controls transmission or non-transmission of light utilizing an optical modulation action of liquid crystal. Note that the optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

In one embodiment of the present invention, in particular, a reflective liquid crystal element can be used.

In the case where a reflective liquid crystal element is used, a polarizing plate is provided on a display surface. In addition, a light diffusion plate is preferably provided on the display surface to improve visibility.

[Light-Emitting Element]

As the light-emitting element, a self-luminous element can be used, and an element whose luminance is controlled by current or voltage is included in the category of the light-emitting element. For example, an LED, a QLED, an organic EL element, an inorganic EL element, or the like can be used.

In one embodiment of the present invention, in particular, the light-emitting element preferably has a top emission structure. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer).

For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used for the conductive layers. For example, a stack of indium tin oxide and an alloy of silver and magnesium is preferably used, in which case conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

[Adhesive Layer]

As the adhesive layer, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display panel.

In addition, a filler with a high refractive index or a light-scattering member may be mixed into the resin, in which case light extraction efficiency can be improved. For example, titanium oxide, barium oxide, zeolite, or zirconium can be used.

[Connection Layer]

As a connection layer, an anisotropic conductive film (ACF), an anisotropic conductive paste (ACP), or the like can be used.

[Coloring Layer]

Examples of materials that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferred that the coloring layer and the light-blocking layer be formed using the same material because the same manufacturing apparatus can be used and the process can be simplified.

The above is the description of each of the components.

[Modification Example]

Structure examples which partly differ from the display device described in the above cross-sectional structure example will be described below. Note that the description of the portions already described above is omitted and only different portions are described.

[Modification Example 1 of Cross-Sectional Structure Example]

Figure 27:
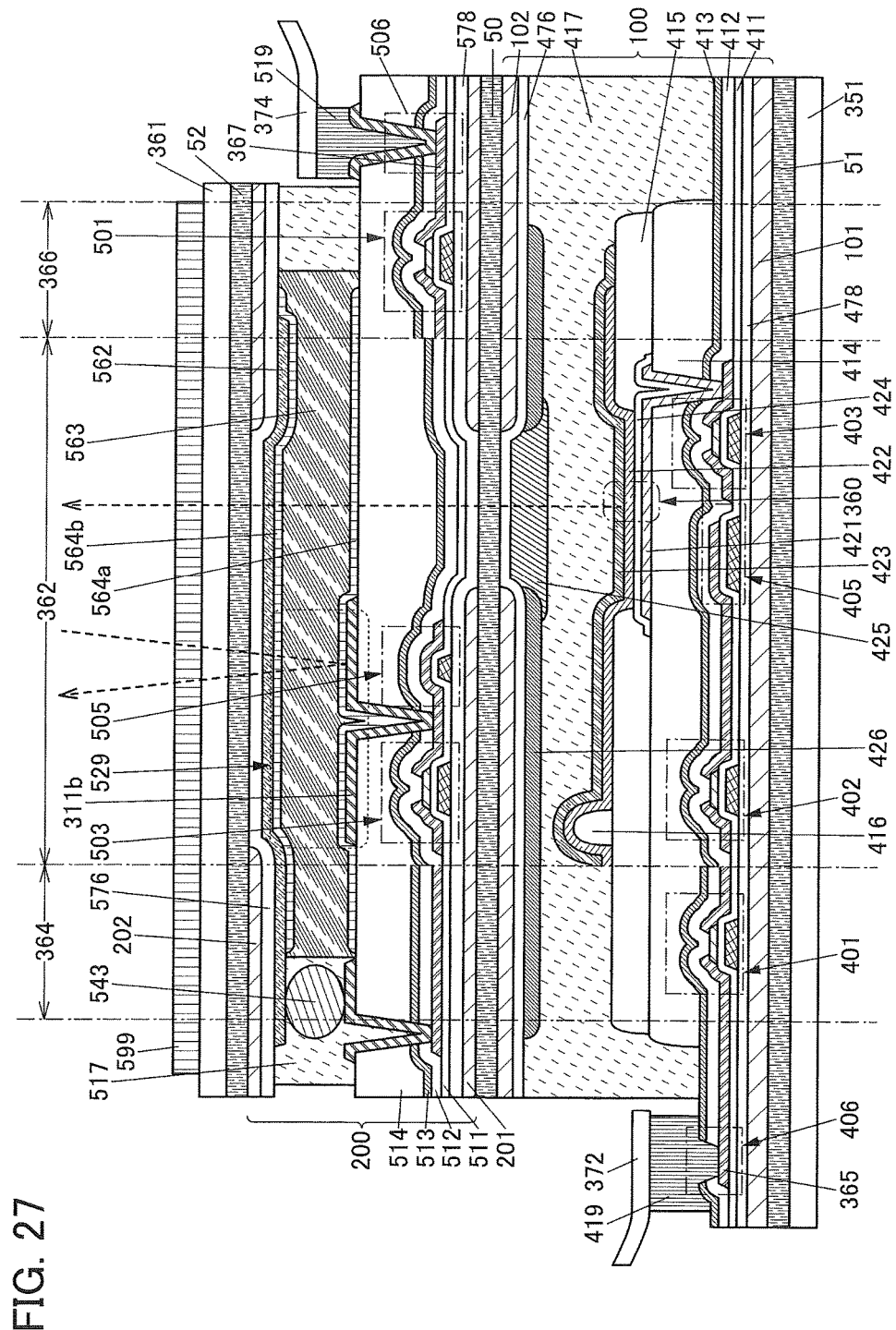
FIG. 27 illustrates a structure example of a display device of one embodiment.

The structure in FIG. 27 is mainly different from that in FIG. 26 in the structures of the resin layer 102, the resin layer 201, and the resin layer 202.

The resin layer 102 has an opening in a region overlapping with the light-emitting element 360. The resin layer 201 has an opening in a region overlapping with the light-emitting element 360. The resin layer 202 has an opening in a region overlapping with the liquid crystal element 529 and with the light-emitting element 360. Thus, the light extraction efficiency of the light-emitting element 360 and the reflectance of the liquid crystal element 529 can be increased.

<Modification Example 2 of Cross-Sectional Structure Example>

Figure 28:
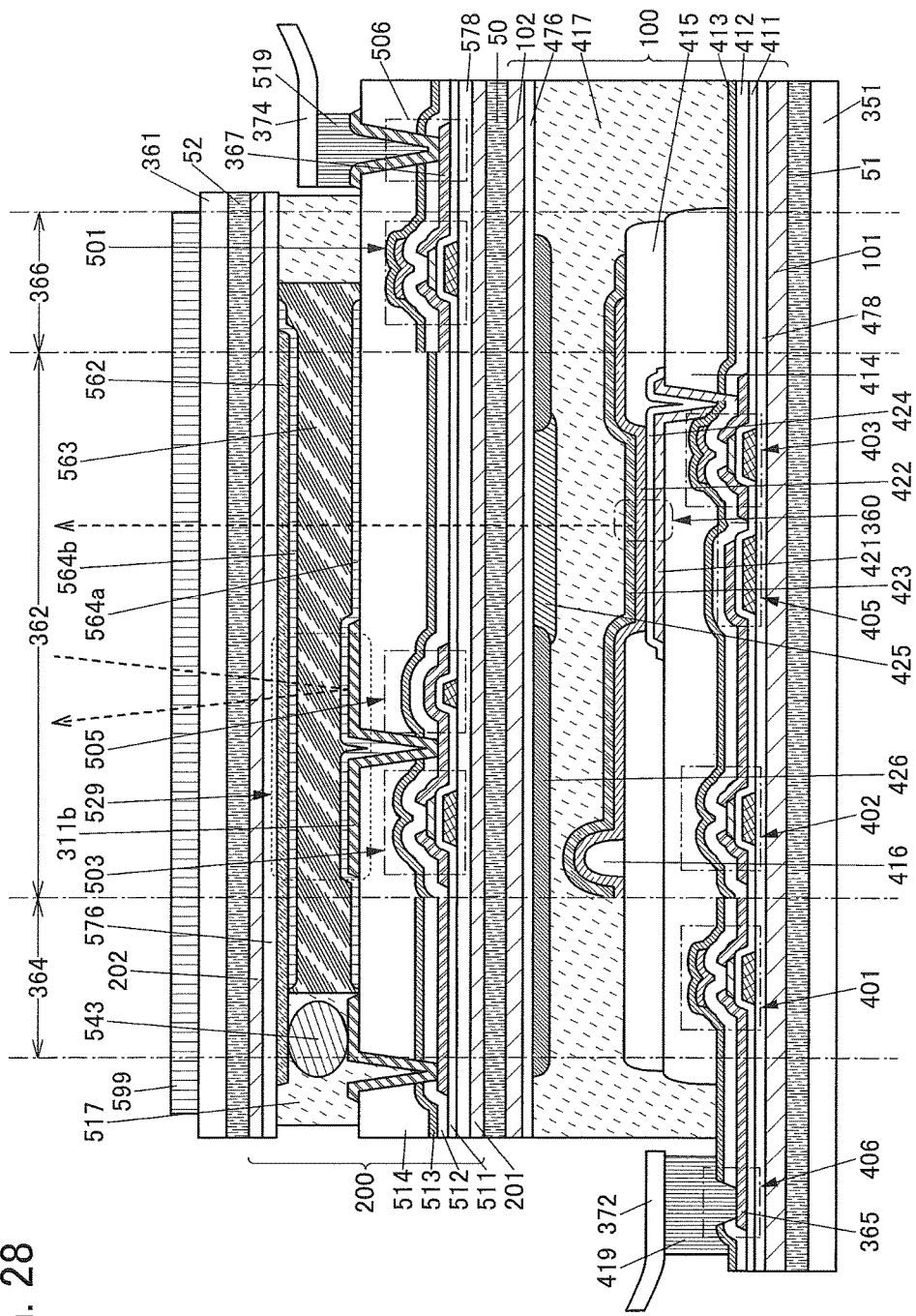
FIG. 28 illustrates a structure example of a display device of one embodiment.

The structure in FIG. 28 is different from that in FIG. 26 in the structure of the transistors. The transistors 401, 403, and 501 illustrated in FIG. 28 each include a second gate electrode. In this manner, a transistor including a pair of gates is preferably used as each of the transistors provided in the circuit portion 364 and the circuit portion 366 and the transistor that controls current flowing to the light-emitting element 360.

<Modification Example 3 of Cross-Sectional Structure Example>

Figure 29:
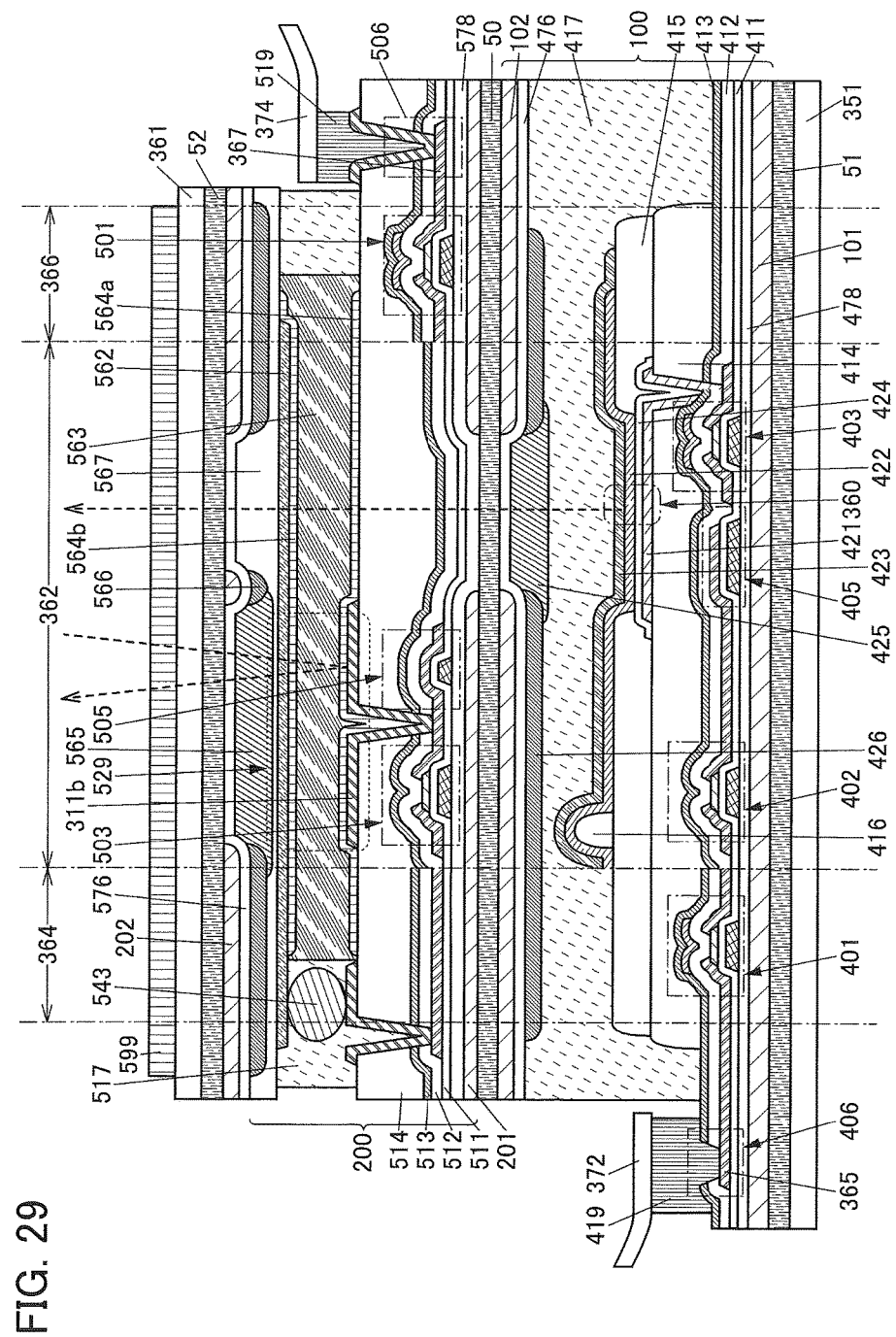
FIG. 29 illustrates a structure example of a display device of one embodiment.

The structure illustrated in FIG. 29 is different from that illustrated in FIG. 27 in the structures of transistors and the resin layer 202 and in that a coloring layer 565, a light-blocking layer 566, and an insulating layer 567 are provided.

The transistors 401, 403, and 501 illustrated in FIG. 29 each include a second gate electrode. In this manner, a transistor including a pair of gates is preferably used as each of the transistors provided in the circuit portion 364 and the circuit portion 366 and the transistor that controls current flowing to the light-emitting element 360.

In the resin layer 202, an opening overlapping with the liquid crystal element 529 and an opening overlapping with the light-emitting element 360 are separately formed, whereby the reflectance of the liquid crystal element 529 can be increased.

The light-blocking layer 566 and the coloring layer 565 are provided on a surface of the insulating layer 576 on the liquid crystal element 529 side. The coloring layer 565 is provided so as to overlap with the liquid crystal element 529. Thus, the display panel 200 can perform color display. The light-blocking layer 566 has an opening overlapping with the liquid crystal element 529 and an opening overlapping with the light-emitting element 360. This allows fabrication of a display device that suppresses mixing of colors between adjacent pixels and thus has high color reproducibility.

[Modification Example 4 of Cross-Sectional Structure Example]

Figure 30:
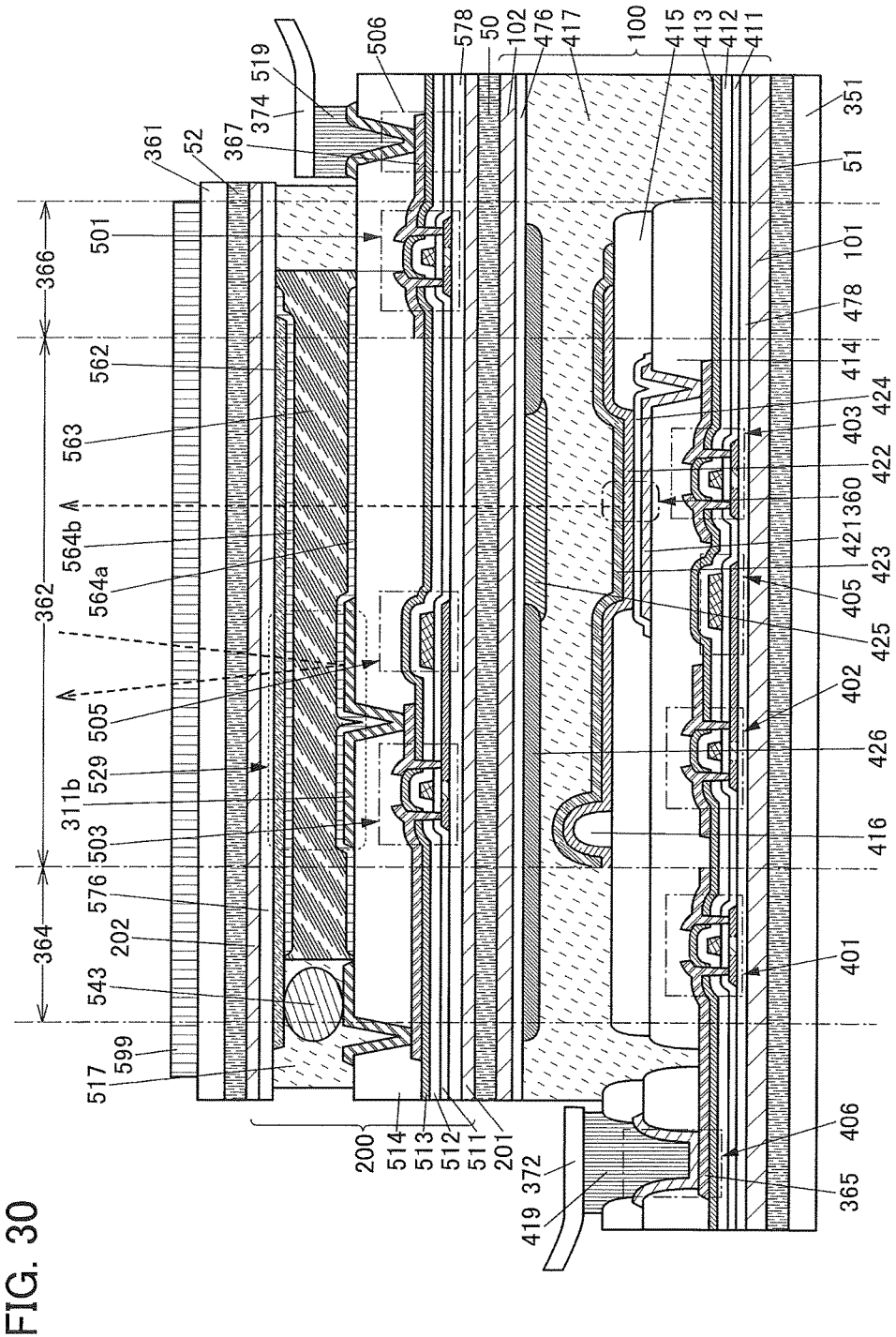
FIG. 30 illustrates a structure example of a display device of one embodiment.

FIG. 30 illustrates an example in which a top-gate transistor is used as each transistor in FIG. 26. The use of a top-gate transistor can reduce parasitic capacitance, leading to an increase in the frame frequency of display. Furthermore, a top-gate transistor can favorably be used for a large display panel with a size of 8 inches or more.

[Modification Example 5 of Cross-Sectional Structure Example]

Figure 31:
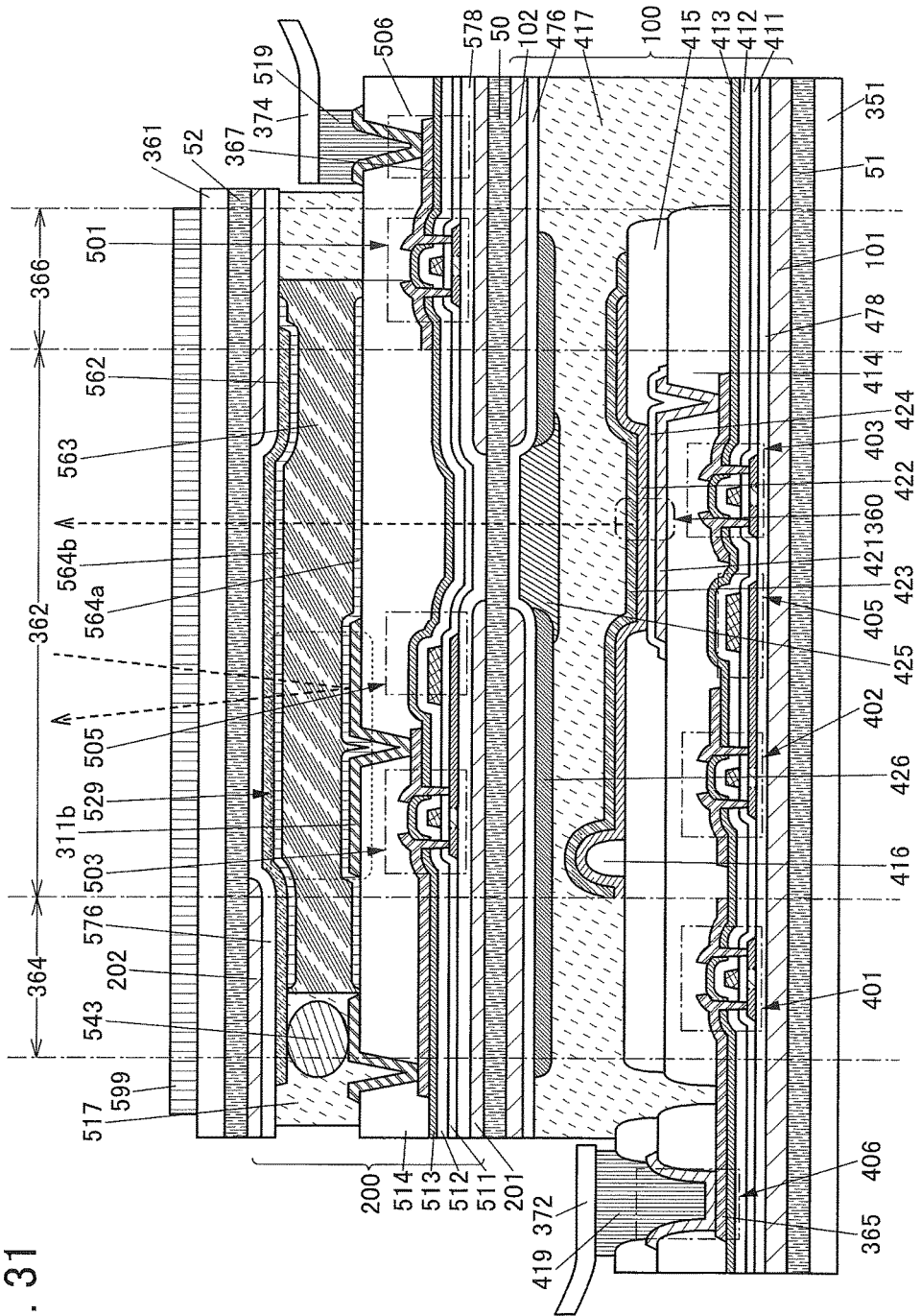
FIG. 31 illustrates a structure example of a display device of one embodiment.

FIG. 31 illustrates an example in which a top-gate transistor is used as each transistor in FIG. 27.

[Modification Example 6 of Cross-Sectional Structure Example]

Figure 32:
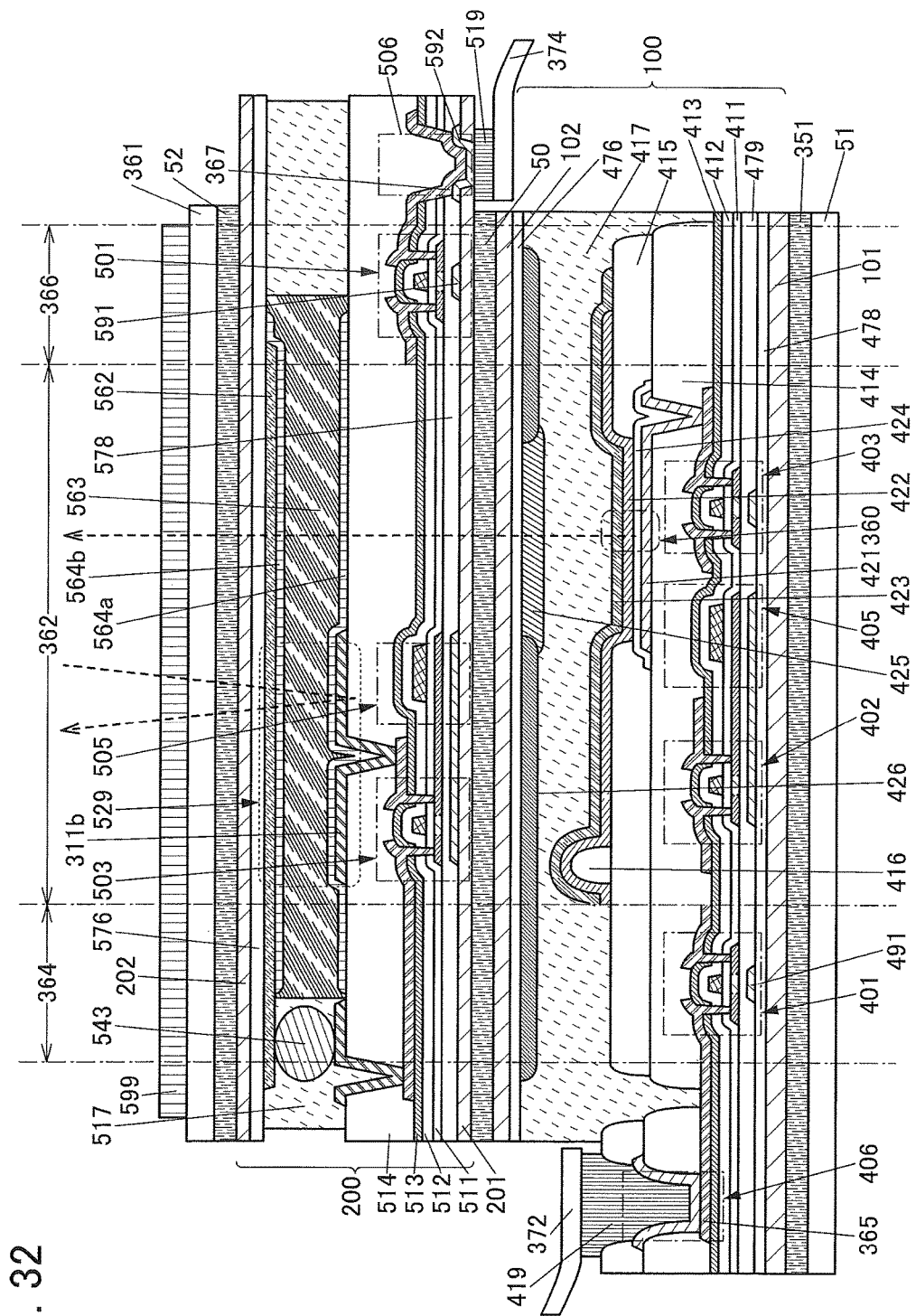
FIG. 32 illustrates a structure example of a display device of one embodiment.

FIG. 32 illustrates an example in which a top-gate transistor including a second gate electrode is used as each transistor in FIG. 26.

Each of the transistors on the display panel 100 side includes a conductive layer 491 over the resin layer 101. Each of the transistors on the display panel 200 side includes a conductive layer 591 which is in contact with the resin layer 201. The insulating layer 479 is provided so as to cover the conductive layer 491. The insulating layer 578 is provided so as to cover the conductive layer 591.

In the connection portion 506 of the display panel 200, part of the resin layer 201 is opened, and a conductive layer 592 is provided so as to fill the opening. The conductive layer 592 is provided such that the back surface (a surface on the display panel 100 side) thereof is exposed. The conductive layer 592 is electrically connected to the wiring 367. The FPC 374 is electrically connected to the exposed surface of the conductive layer 592 through the connection layer 519. The conductive layer 592 can be formed by processing the conductive film with which the conductive layer 591 is formed. The conductive layer 592 functions as an electrode that can also be called a back electrode.

Such a structure can be obtained by using a photosensitive organic resin for the resin layer 201. For example, in forming the resin layer 201 over a support substrate, an opening is formed in the resin layer 201 and the conductive layer 592 is formed so as to fill the opening. When the resin layer 201 and the support substrate are separated from each other, the conductive layer 592 and the support substrate are also separated from each other, whereby the conductive layer 592 illustrated in FIG. 32 can be formed. For example, due to the laser light irradiation, the rear surface of the conductive layer 592 is changed and the adhesion between the conductive layer 592 and the support substrate is decreased, whereby the conductive layer 592 is separated from the support substrate.

Such a structure allows the FPC 374 connected to the display panel 200 located on the display surface side to be positioned on the side opposite to the display surface. Thus, a space for bending the FPC 374 in incorporating a display device in an electronic device can be eliminated, which enables the electronic device to be smaller.

[Modification Example 7 of Cross-Sectional Structure Example]

Figure 33:
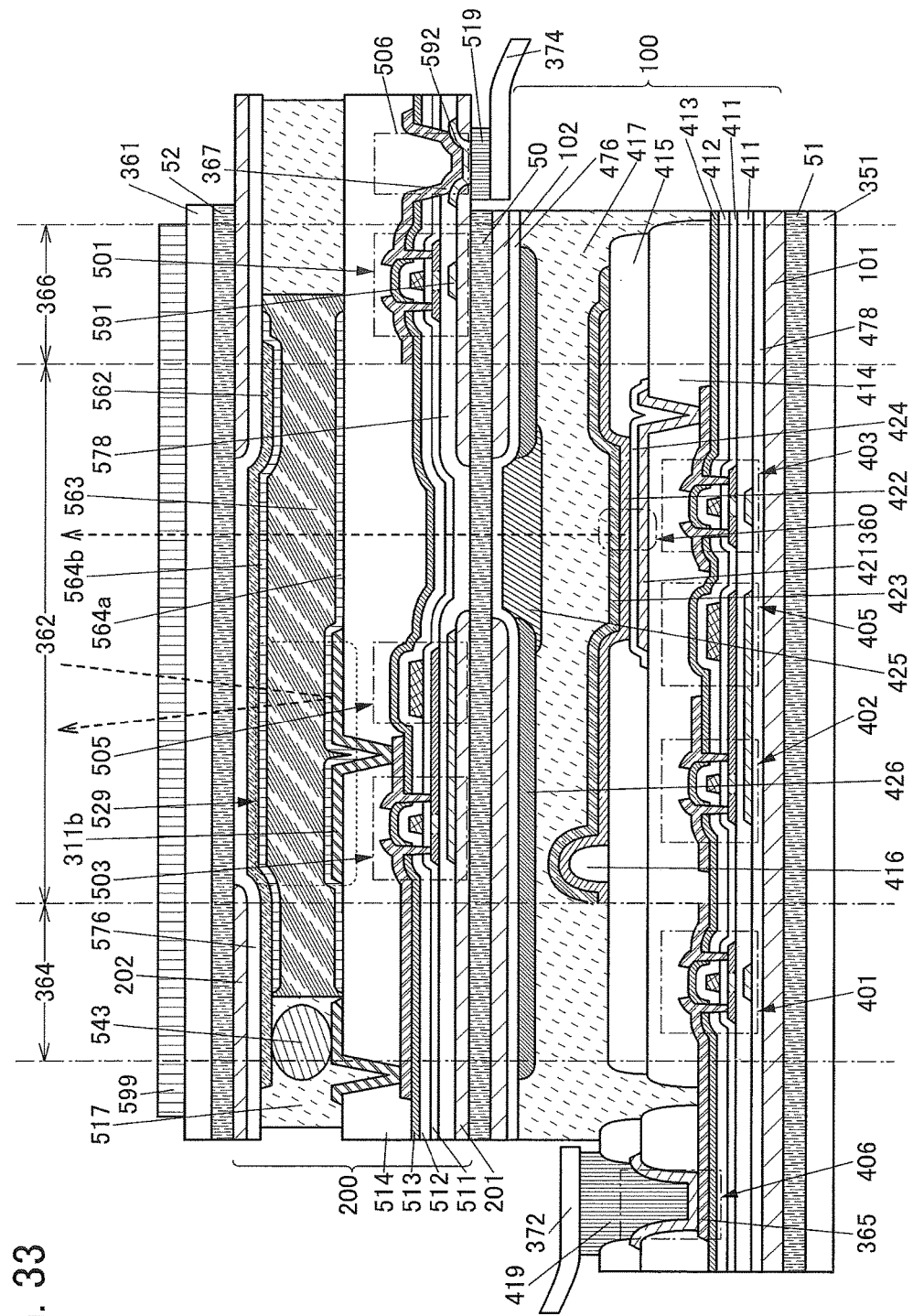
FIG. 33 illustrates a structure example of a display device of one embodiment.

FIG. 33 illustrates an example in which a top-gate transistor including a second gate electrode is used as each transistor in FIG. 27.

In the connection portion 506 of the display panel 200, the conductive layer 592 can function as an electrode which can also be referred to as a rear electrode. For example, as described in Embodiment 1, the following method can be used: a method of using a light-absorbing layer or a method of forming a rein layer having a depressed portion or a resin layer having a two-layer structure and then etching part of the resin layer to expose the rear surface of the conductive layer 592.

The above is the description of the modification example.

At least part of this embodiment can be implemented in combination with any of the other embodiments and the other examples described in this specification as appropriate.

Embodiment 3

In this embodiment, a display module which can be manufactured using one embodiment of the present invention is described.

Figure 34:
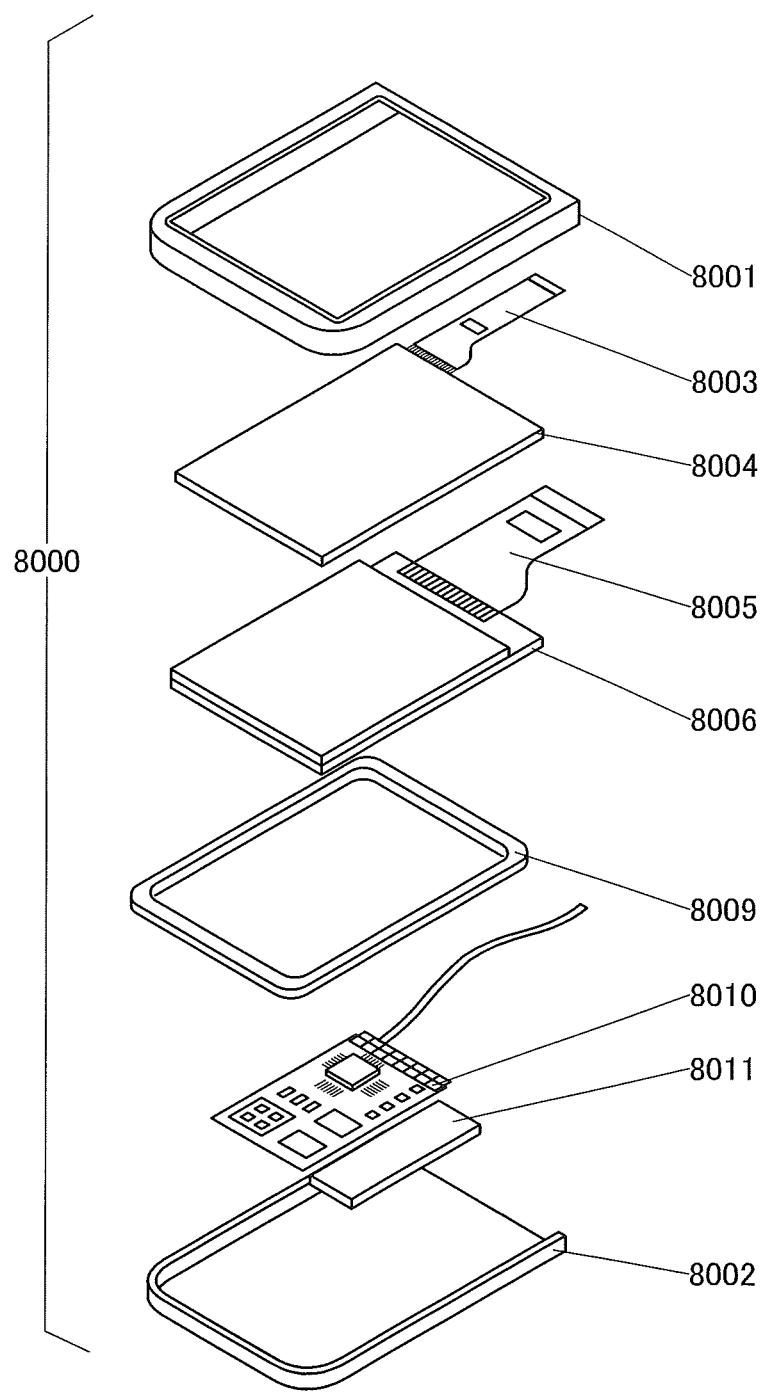
FIG. 34 shows a structure example of a display module of one embodiment.

In a display module 8000 in FIG. 34, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for, for example, the display panel 8006.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 protects the touch panel 8004 and functions as an electromagnetic shield for blocking electromagnetic waves generated by the operation of the printed board 8010. The frame 8009 can also function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

At least part of this embodiment can be implemented in combination with any of the other embodiments and the other examples described in this specification as appropriate.

Embodiment 4

In this embodiment, electronic devices to which the display device of one embodiment of the present invention can be applied are described.

The display device of one embodiment of the present invention can achieve high visibility regardless of the intensity of external light. Therefore, the display device of one embodiment of the present invention can be favorably used in portable electronic devices, wearable electronic devices (wearable devices), e-book readers, and the like.

Figure 35A:
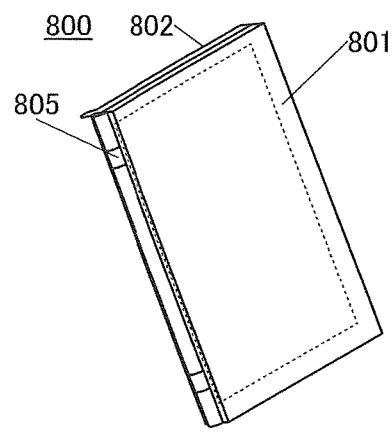
FIGS. 35A to 35D illustrate examples of electronic devices of embodiments.
Figure 35B:
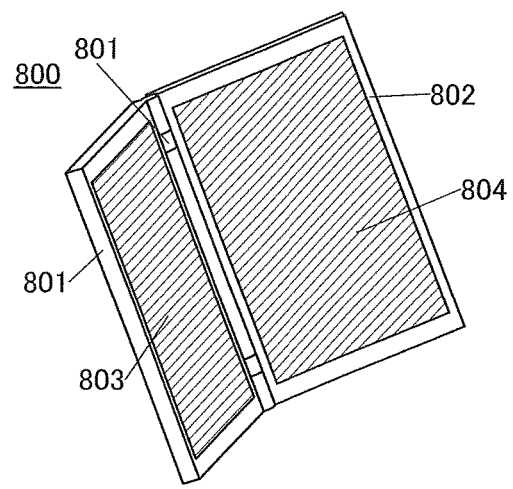

FIGS. 35A and 35B illustrate an example of a portable information terminal 800. The portable information terminal 800 includes a housing 801, a housing 802, a display portion 803, a display portion 804, and a hinge 805, for example.

The housing 801 and the housing 802 are connected with the hinge 805. The portable information terminal 800 folded as in FIG. 35A can be changed into the state illustrated in FIG. 35B, in which the housing 801 and the housing 802 are opened.

For example, the portable information terminal 800 can also be used as an e-book reader, in which the display portion 803 and the display portion 804 each can display text data. In addition, the display portion 803 and the display portion 804 each can display a still image or a moving image.

In this manner, the portable information terminal 800 has high versatility because it can be folded when carried.

Note that the housing 801 and the housing 802 may include a power switch, an operation button, an external connection port, a speaker, a microphone, and/or the like.

Figure 35C:
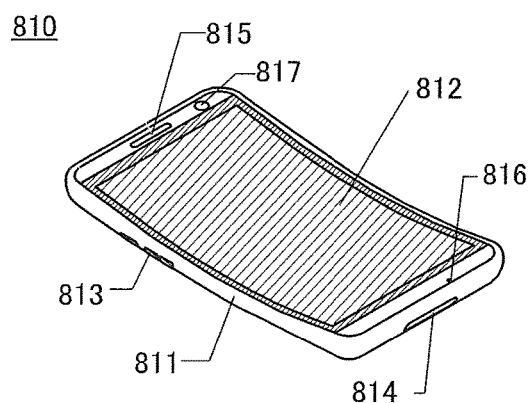

FIG. 35C illustrates an example of a portable information terminal. A portable information terminal 810 illustrated in FIG. 35C includes a housing 811, a display portion 812, operation buttons 813, an external connection port 814, a speaker 815, a microphone 816, a camera 817, and the like.

The display portion 812 is provided with the display device of one embodiment of the present invention.

The portable information terminal 810 includes a touch sensor in the display portion 812. Operations such as making a call and inputting a letter can be performed by touch on the display portion 812 with a finger, a stylus, or the like.

With the operation buttons 813, power on/off can be switched and types of images displayed on the display portion 812 can be switched. For example, images can be switched from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). The direction of display on the screen can also be changed by touch on the display portion 812, operation with the operation buttons 813, sound input using the microphone 816, or the like.

The portable information terminal 810 has one or more of a telephone function, a notebook function, an information browsing function, and the like. Specifically, the portable information terminal 810 can be used as a smartphone. The portable information terminal 810 is capable of executing a variety of applications such as mobile phone calls, e-mailing, viewing and editing texts, music reproduction, video replay, Internet communication, and games.

Figure 35D:
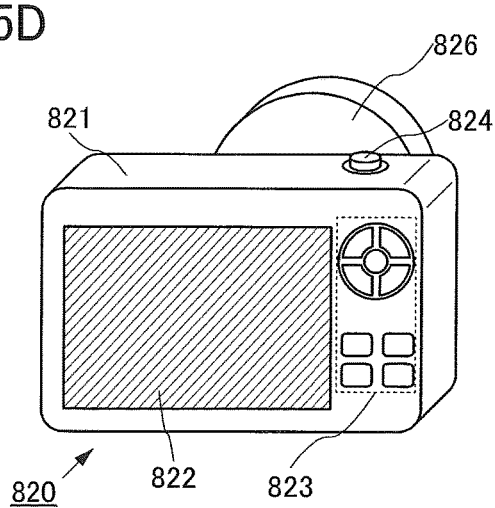

FIG. 35D illustrates an example of a camera. A camera 820 includes a housing 821, a display portion 822, operation buttons 823, a shutter button 824, and the like. The camera 820 is provided with an attachable lens 826.

The display portion 822 is provided with the display device of one embodiment of the present invention.

Although the lens 826 of the camera 820 here is detachable from the housing 821 for replacement, the lens 826 may be integrated with the housing 821.

Still images or moving images can be taken with the camera 820 by pushing the shutter button 824. In addition, images can be taken by a touch on the display portion 822 that serves as a touch panel.

Note that a stroboscope, a viewfinder, or the like can be additionally provided in the camera 820. Alternatively, these can be incorporated in the housing 821.

At least part of this embodiment can be implemented in combination with any of the other embodiments and the other examples described in this specification as appropriate.

[Example]

In this example, a sample in which a resin layer and a transistor were formed over a support substrate was fabricated, and the electrical characteristics results of the transistors before and after peeling will be described.

The structure of the transistor formed over the resin layer will be described below. Note that the structure of the transistor is the same as that of the transistor 110c in FIG. 9C.

As the support substrate, an approximately 0.7-mm-thick glass substrate was used. For the resin layer, an approximately 1.55-μm-thick polyimide resin was used. As the insulating layer over the resin layer, an approximately 200-nm-thick silicon oxynitride film was used. As a conductive layer functioning as a back gate electrode, an approximately 100-nm-thick titanium film was used. As an insulating layer over the conductive layer, a stack including an approximately 400-nm-thick silicon nitride film and an approximately 50-nm-thick silicon oxynitride film were used. As the semiconductor layer, an approximately 40-nm-thick In—Ga—Zn oxide film formed using an oxide target with an atomic ratio where In:Ga:Zn=4:2:3 was used. As the insulating layer functioning as a gate insulating layer, an approximately 150-nm-thick silicon oxynitride film was used. As a conductive layer functioning as a gate electrode, an approximately 100-nm-thick In—Ga—Zn oxide film formed using an oxide target with an atomic ratio where In:Ga:Zn=4:2:3 was used. As an insulating layer over the conductive layer, a stack of an approximately 100-nm-thick silicon nitride film and an approximately 300-nm-thick silicon oxynitride film was used. As conductive layers functioning as a source electrode and a drain electrode, a stack of an approximately 10-nm-thick titanium film and an approximately 100-nm-thick copper film was used. For an insulating layer over the conductive layers, an approximately 1.5-μm-thick acrylic resin was used.

The $I_d$-$V_g$ characteristics (drain current-gate voltage characteristics) of the transistor were measured. The measurement conditions were different as follows before and after peeling of the support substrate. Before the peeling, the $I_d$-$V_g$ characteristics were measured in such a manner that the drain voltage was set to 0.1 V or 20 V and the back gate voltage and the gate voltage were swept from −8 V to 8 V in increments of 0.25 V. After the peeling, the $I_d$-$V_g$ characteristics were measured in such a manner that the drain voltage was set to 0.1 V or 10 V and the back gate voltage and the gate voltage were swept from −8 V to 8 V in increments of 0.25 V.

Figure 36A:
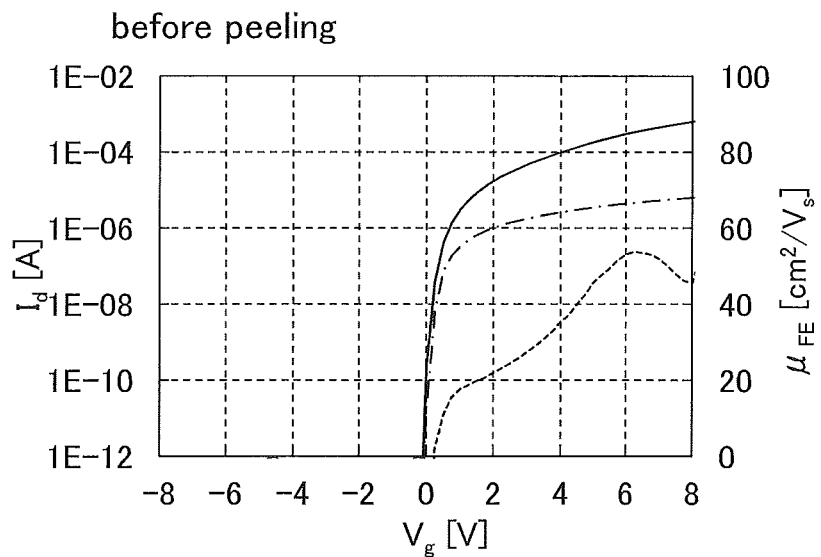
FIGS. 36A and 36B each show $I_d$-$V_g$ characteristics results of transistors of Example.
Figure 36B:
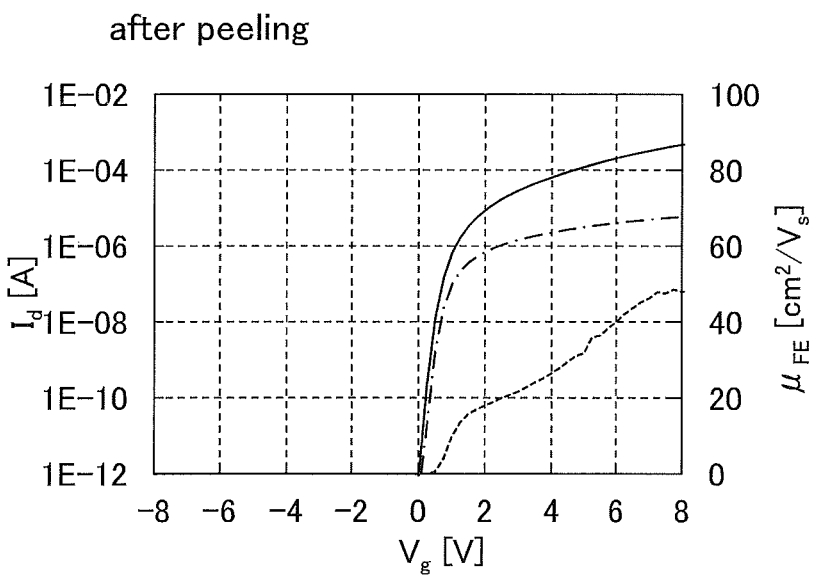

Measurement results of $I_d$-$V_g$ characteristics are shown in FIGS. 36A and 36B. FIGS. 36A and 36B show the measurement results of transistors before and after peeling each having a channel length L of 2 μm and a channel width W of 50 μm. In FIGS. 36A and 36B, the horizontal axis represents gate voltage $V_g$[V], the left vertical axis represents drain current $I_d$[A], and the right vertical axis represents field-effect mobility $\mu_{FE}$[cm$^2$/V$_s$]. In addition, in FIGS. 36A and 36B, a solid line indicates $I_d$-$V_g$ characteristics at a drain voltage of 10 V or 20 V, a dashed-dotted line indicates $I_d$-$V_g$ characteristics at a drain voltage of 0.1 V, and a dashed line indicates field-effect mobility $\mu_{FE}$ at a drain voltage of 10 V or 20 V. The transistors measured before and after peeling are different transistors formed over the same resin layer.

As shown in FIGS. 36A and 36B, it is found that there is little difference between the electrical characteristics of the transistors formed over the resin layer before and after peeling of the support substrate from the resin layer.

As shown in FIGS. 36A and 36B, even the extremely miniaturized transistor having a channel length of 2 μm shows favorable transistor characteristics by being formed by using an oxide semiconductor. Thus, a flexible and extremely high-resolution display device can be obtained. Furthermore, the area of the driver circuit in the display device can be decreased, whereby a flexible display device with a narrow frame can be provided.

At least part of this example can be implemented in combination with any of the embodiments described in this specification as appropriate.

This application is based on Japanese Patent Application serial No. 2016-077616 filed with Japan Patent Office on Apr. 7, 2016, and Japanese Patent Application serial No. 2016-079807 filed with Japan Patent Office on Apr. 12, 2016, the entire contents of which are hereby incorporated by reference.

What is claimed is:

1. A display device comprising:
   a first display panel comprising:
      a first resin layer;
      a second resin layer;
      a reflective liquid crystal element; and
      a first transistor;
   a second display panel comprising:
      a third resin layer;
      a fourth resin layer;
      a light-emitting element; and
      a second transistor; and
   a first adhesive layer,
   wherein the reflective liquid crystal element and the first transistor are positioned between the first resin layer and the second resin layer,
   wherein the light-emitting element and the second transistor are positioned between the third resin layer and the fourth resin layer,
   wherein the reflective liquid crystal element is configured to reflect light toward the second resin layer side,
   wherein the light-emitting element is configured to emit light toward the third resin layer side,
   wherein the first resin layer and the third resin layer are bonded to each other with the first adhesive layer,
   wherein a channel is formed in an oxide semiconductor in each of the first transistor and the second transistor, and
   wherein a thickness of each of the first resin layer and the third resin layer is 0.1 μm or more and 3 μm or less.

2. The display device according to claim 1,
   wherein the first resin layer comprises a first opening overlapping with the light-emitting element,
   wherein the second resin layer comprises a second opening overlapping with the light-emitting element,
   wherein the third resin layer comprises a third opening overlapping with the light-emitting element, and
   wherein the light-emitting element is configured to emit light through the first opening, the second opening, and the third opening.

3. The display device according to claim 2,
   wherein the second opening of the second resin layer comprises a portion overlapping with the reflective liquid crystal element, and
   wherein the reflective liquid crystal element is configured to reflect light through the second opening.

4. The display device according to claim 1, wherein a thickness of each of the second resin layer and the fourth resin layer is 0.1 μm or more and 3 μm or less.

5. The display device according to claim 1, further comprising:
   a first substrate;
   a second substrate;
   a second adhesive layer; and
   a third adhesive layer,
   wherein the first substrate is bonded to the fourth resin layer with the second adhesive layer, and
   wherein the second substrate is bonded to the second resin layer with the third adhesive layer.

6. The display device according to claim 5, wherein the first substrate and the second substrate comprise a resin.

7. The display device according to claim 1,
   wherein the first transistor comprises a first source electrode, a first drain electrode, and a first semiconductor layer,
   wherein the second transistor comprises a second source electrode, a second drain electrode, and a second semiconductor layer,
   wherein the first source electrode and the first drain electrode are in contact with a top surface and a side end portion of the first semiconductor layer, and
   wherein the second source electrode and the second drain electrode are in contact with a top surface and a side end portion of the second semiconductor layer.

8. The display device according to claim 1, further comprising:
   a first insulating layer overlapping with part of a top surface and a side end portion of a first semiconductor layer; and
   a second insulating layer overlapping with part of a top surface and a side end portion of a second semiconductor layer,
   wherein the first transistor comprises a first source electrode, a first drain electrode, and the first semiconductor layer,
   wherein the second transistor comprises a second source electrode, a second drain electrode, and the second semiconductor layer, wherein the first source electrode and the first drain electrode are over the first insulating layer and are electrically connected to the first semiconductor layer through openings provided in the first insulating layer, and wherein the second source electrode and the second drain electrode are over the second insulating layer and are electrically connected to the second semiconductor layer through openings provided in the second insulating layer.

9. The display device according to claim 1, further comprising a second insulating layer overlapping with part of a top surface and a side end portion of a second semiconductor layer, wherein the first transistor comprises a first source electrode, a first drain electrode, and a first semiconductor layer, wherein the second transistor comprises a second source electrode, a second drain electrode, and the second semiconductor layer, wherein the first source electrode and the first drain electrode are in contact with a top surface and a side end portion of the first semiconductor layer, and wherein the second source electrode and the second drain electrode are over the second insulating layer and are electrically connected to the second semiconductor layer through openings provided in the second insulating layer.

10. The display device according to claim 1, further comprising a first insulating layer overlapping with part of a top surface and a side end portion of a first semiconductor layer, wherein the first transistor comprises a first source electrode, a first drain electrode, and the first semiconductor layer, wherein the second transistor comprises a second source electrode, a second drain electrode, and a second semiconductor layer, wherein the first source electrode and the first drain electrode are over the first insulating layer and are electrically connected to the first semiconductor layer through openings provided in the first insulating layer, and wherein the second source electrode and the second drain electrode are in contact with a top surface and a side end portion of the second semiconductor layer.

11. The display device according to claim 1, wherein the first transistor comprises a first semiconductor layer, a first gate electrode, and a second gate electrode, wherein the first gate electrode and the second gate electrode face each other with the first semiconductor layer therebetween, wherein the second transistor comprises a second semiconductor layer, a third gate electrode, and a fourth gate electrode, and wherein the third gate electrode and the fourth gate electrode face each other with the second semiconductor layer therebetween.

12. A display device comprising:
a light-emitting element;
a first transistor electrically connected to the light-emitting element;
a first resin layer over the light-emitting element and the first transistor;
a first adhesive layer over and in contact with the first resin layer;
a second resin layer over and in contact with the first adhesive layer;
a liquid crystal element over the second resin layer; and
a second transistor over the second resin layer, the second transistor electrically connected to the liquid crystal element.

13. The display device according to claim 12, wherein a channel is formed in an oxide semiconductor in each of the first transistor and the second transistor.

14. The display device according to claim 12, wherein a thickness of each of the first resin layer and the second resin layer is 0.1 µm or more and 3 µm or less.

15. The display device according to claim 12, wherein the first resin layer comprises a first opening overlapping with the light-emitting element, and wherein the second resin layer comprises a second opening overlapping with the light-emitting element.

16. The display device according to claim 15, wherein the second opening of the second resin layer comprises a portion overlapping with the liquid crystal element.

17. The display device according to claim 12, further comprising:
a third resin layer; and
a fourth resin layer, wherein the light-emitting element and the first transistor are positioned between the third resin layer and the first resin layer, wherein the liquid crystal element and the second transistor are positioned between the second resin layer and the fourth resin layer, and wherein a thickness of each of the third resin layer and the fourth resin layer is 0.1 µm or more and 3 µm or less.

18. The display device according to claim 12, further comprising:
a first substrate;
a second adhesive layer over and in contact with the first substrate;
a third resin layer over and in contact with the second adhesive layer;
a fourth resin layer;
a third adhesive layer over and in contact with the fourth resin layer; and
a second substrate over and in contact with the third adhesive layer, wherein the light-emitting element and the first transistor are positioned between the third resin layer and the first resin layer, and wherein the liquid crystal element and the second transistor are positioned between the second resin layer and the fourth resin layer.

19. The display device according to claim 18, wherein the first substrate and the second substrate comprise a resin.

20. The display device according to claim 12, wherein the first transistor comprises a first source electrode, a first drain electrode, and a first semiconductor layer, wherein the second transistor comprises a second source electrode, a second drain electrode, and a second semiconductor layer, wherein the first source electrode and the first drain electrode are in contact with a top surface and a side end portion of the first semiconductor layer, and wherein the second source electrode and the second drain electrode are in contact with a top surface and a side end portion of the second semiconductor layer.

21. The display device according to claim 12, further comprising:

a first insulating layer overlapping with part of a top surface and a side end portion of a first semiconductor layer; and a second insulating layer overlapping with part of a top surface and a side end portion of a second semiconductor layer, wherein the first transistor comprises a first source electrode, a first drain electrode, and the first semiconductor layer, wherein the second transistor comprises a second source electrode, a second drain electrode, and the second semiconductor layer, wherein the first source electrode and the first drain electrode are over the first insulating layer and are electrically connected to the first semiconductor layer through openings provided in the first insulating layer, and wherein the second source electrode and the second drain electrode are over the second insulating layer and are electrically connected to the second semiconductor layer through openings provided in the second insulating layer.

22. The display device according to claim 12, further comprising a second insulating layer overlapping with part of a top surface and a side end portion of a second semiconductor layer, wherein the first transistor comprises a first source electrode, a first drain electrode, and a first semiconductor layer, wherein the second transistor comprises a second source electrode, a second drain electrode, and the second semiconductor layer, wherein the first source electrode and the first drain electrode are in contact with a top surface and a side end portion of the first semiconductor layer, and wherein the second source electrode and the second drain electrode are over the second insulating layer and are electrically connected to the second semiconductor layer through openings provided in the second insulating layer.

23. The display device according to claim 12, further comprising a first insulating layer overlapping with part of a top surface and a side end portion of a first semiconductor layer, wherein the first transistor comprises a first source electrode, a first drain electrode, and the first semiconductor layer, wherein the second transistor comprises a second source electrode, a second drain electrode, and a second semiconductor layer, wherein the first source electrode and the first drain electrode are over the first insulating layer and are electrically connected to the first semiconductor layer through openings provided in the first insulating layer, and wherein the second source electrode and the second drain electrode are in contact with a top surface and a side end portion of the second semiconductor layer.

24. The display device according to claim 12, wherein the first transistor comprises a first semiconductor layer, a first gate electrode, and a second gate electrode, wherein the first gate electrode and the second gate electrode face each other with the first semiconductor layer therebetween, wherein the second transistor comprises a second semiconductor layer, a third gate electrode, and a fourth gate electrode, and wherein the third gate electrode and the fourth gate electrode face each other with the second semiconductor layer therebetween.

* * * * *